US011691210B2

(12) United States Patent
Ebisawa

(10) Patent No.: US 11,691,210 B2
(45) Date of Patent: Jul. 4, 2023

(54) METHOD OF DETERMINING STATE OF IRON TIP

(71) Applicant: AND Co., Ltd., Kyoto (JP)

(72) Inventor: Mitsuo Ebisawa, Kizugawa (JP)

(73) Assignee: AND CO., LTD., Kyoto (JP)

( * ) Notice: Subject to any disclaimer, the term of this patent is extended or adjusted under 35 U.S.C. 154(b) by 903 days.

(21) Appl. No.: 16/345,163

(22) PCT Filed: Oct. 24, 2017

(86) PCT No.: PCT/JP2017/038263
§ 371 (c)(1),
(2) Date: Apr. 25, 2019

(87) PCT Pub. No.: WO2018/079515
PCT Pub. Date: May 3, 2018

(65) Prior Publication Data
US 2019/0262925 A1   Aug. 29, 2019

(30) Foreign Application Priority Data

Oct. 28, 2016 (JP) ................................ 2016-211582
Nov. 27, 2016 (JP) ................................ 2016-229622
Nov. 29, 2016 (JP) ................................ 2016-230996

(51) Int. Cl.
*B23K 3/08* (2006.01)
*B23K 1/00* (2006.01)
(Continued)

(52) U.S. Cl.
CPC .............. *B23K 3/08* (2013.01); *B23K 1/0016* (2013.01); *B23K 3/025* (2013.01); *B23K 3/03* (2013.01);
(Continued)

(58) Field of Classification Search
CPC .......... B23K 3/06–0615; B23K 3/0623; B23K 3/063; H05K 3/3447
See application file for complete search history.

(56) References Cited

U.S. PATENT DOCUMENTS 6,152,348 A * 11/2000 Finn .................... B23K 3/0607
228/52
6,550,669 B1 * 4/2003 Walz .................... B23K 1/018
228/19
(Continued)

FOREIGN PATENT DOCUMENTS

JP    10062408 A  *  3/1998
JP    H10-062408 A     3/1998
(Continued)

OTHER PUBLICATIONS

International Search Report dated Dec. 19, 2017 for International Application No. PCT/JP2017/038263 and English translation.

*Primary Examiner* — Erin B Saad
*Assistant Examiner* — Carlos J Gamino
(74) *Attorney, Agent, or Firm* — Lucas & Mercanti, LLP

(57) ABSTRACT

By a method of determining the state of an iron tip according to the present invention, in a soldering device including: an iron tip that includes a solder hole into which a solder piece is supplied and that heats and melts the solder piece in the solder hole; a gas supply source that supplies a gas; and a gas supply portion that makes the gas supply source communicate with the solder hole and that supplies the gas from the gas supply source into the solder hole, the total flow rate of the gas flowing through the gas supply portion or a supply pressure is constant, a physical quantity of the gas flowing within the gas supply portion is measured and the measured physical quantity is compared with a previously provided reference value or table such that the state of the iron tip is (Continued)

determined. In this way, it is possible to constantly accurately determine the state of the iron tip.

12 Claims, 39 Drawing Sheets

(51) Int. Cl.
    *B23K 3/02*     (2006.01)
    *H05K 3/34*     (2006.01)
    *B23K 3/03*     (2006.01)
    *B23K 3/06*     (2006.01)
    *B23K 3/047*     (2006.01)
    *B23K 101/42*     (2006.01)

(52) U.S. Cl.
    CPC ............ *B23K 3/047* (2013.01); *B23K 3/0615* (2013.01); *H05K 3/34* (2013.01); *H05K 3/341* (2013.01); *B23K 2101/42* (2018.08)

(56) References Cited

U.S. PATENT DOCUMENTS

| | | | |
|---|---|---|---|
| 2003/0127498 A1* | 7/2003 | Abe | B23K 3/047 |
| | | | 228/42 |
| 2009/0001054 A1* | 1/2009 | Mizuno | B23K 1/0056 |
| | | | 219/79 |

FOREIGN PATENT DOCUMENTS

| | | | | |
|---|---|---|---|---|
| JP | 2004095989 A | | 3/2004 | |
| JP | 2014146630 A | * | 8/2014 | ............... B23K 3/02 |
| WO | WO-2008023461 A1 | * | 2/2008 | ........... B23K 3/0615 |
| WO | WO-2016153017 A1 | * | 9/2016 | ............. B23K 1/002 |
| WO | WO-2018025787 A1 | * | 2/2018 | ........... B23K 1/0016 |
| WO | WO-2018142733 A1 | * | 8/2018 | ............... B23K 3/02 |

* cited by examiner

METHOD OF DETERMINING STATE OF IRON TIP

CROSS REFERENCE TO RELATED APPLICATION

This Application is a 371 of PCT/JP2017/038263 filed on Oct. 24, 2017 which, in turn, claimed the priority of Japanese Patent Application Nos. 2016-211582 filed on Oct. 28, 2016, 2016-229622 filed on Nov. 27, 2016, 2016-230996 filed on Nov. 29, 2016, all of applications are incorporated herein by reference.

TECHNICAL FIELD

The present invention relates to a method of determining the state of an iron tip which is included in a soldering device for soldering components.

BACKGROUND ART

In recent years, a large number of electronic devices have incorporated electronic circuits in which electronic components are mounted. In the electronic circuit, the terminals and wires of the electronic components are inserted into through holes formed in a wiring board, the tip end parts thereof are soldered to a wiring pattern (land) formed around the through holes and thus the electronic components and the wires are mounted and fixed on the wiring board (see patent document 1 and the like).

For example, in the invention of patent document air is blown to a solder joint part, the pressure of the air is measured and thus based on the measurement value thereof, the state of junction of the solder joint part is checked. In the invention of patent document 2, whether or not soldering is completed is determined by whether air is passed through through holes after the soldering.

RELATED ART DOCUMENT

Patent Document

Patent Document 1: Japanese Unexamined Patent Application Publication No. 10-62408
Patent Document 2: Japanese Unexamined Patent Application Publication No. 2004-95989

DISCLOSURE OF THE INVENTION

Problems to be Solved by the Invention

However, in the inventions of patent documents 1 and 2, it is possible to detect a failure in soldering but it is impossible to detect the state of a solder during soldering processing.

Hence, an object of the present invention is to provide a method of determining the state of an iron tip which can constantly accurately determine the state of the iron tip.

Means for Solving the Problem

In order to achieve the above object, the present invention provides a method of determining the state of an iron tip in a soldering device including: an iron tip that includes a solder hole into which a solder piece is supplied and that heats and melts the solder piece in the solder hole; a gas supply source that supplies a gas; and a gas supply portion that makes the gas supply source communicate with the solder hole and that supplies the gas from the gas supply source into the solder hole, and in the method, a total flow rate of the gas flowing through the gas supply portion is constant, a physical quantity of the gas flowing within the gas supply portion is measured and the measured physical quantity is compared with a previously provided reference value or table such that the state of the iron tip is determined.

In the configuration as described above, the flow rate of the gas is metered, and thus the state of each stop of soldering is determined.

In the configuration described above, the table can include at least any one of the physical quantity itself and a table indicating a chronological change in the physical quantity.

In the configuration described above, the gas supply portion may include a branch pipe which releases the gas to the outside, and as the physical quantity, the flow rate or the pressure of the gas flowing through the branch pipe or a supply pipe to the solder hole may be metered. In the configuration as described above, it is possible to easily detect a variation in the flow path resistance of the solder hole in the iron tip. The cause of the variation in the flow path resistance is identified, and thus it is possible to determine the state of the iron tip.

In the configuration described above, based on a change in the flow rate or the pressure, the state of the iron tip may be determined.

In the configuration described above, based on the fact that the flow rate or the pressure reaches a predetermined value, it may be determined that at least one of the contact with an object on which soldering is performed with the iron tip, the input of the solder piece into the solder hole and the melting of the solder piece in the solder hole is performed.

In the configuration described above, in the solder hole, the melting region is provided in which the solder piece is molten, in the iron tip, a gas release portion which makes the solder hole communicate with the outside is provided on the downstream side with respect to the melting region of the solder hole and after it is detected that a direction of increase or decrease in the flow rate is reversed before and after the flow rate reaches a predetermined value, it may be determined that the molten solder piece flows out from the solder hole. Depending on whether or not the gas leaks from the gas release portion, the branch flow rate can be varied, and thus it is possible to enhance the accuracy of the determination of the state of the iron tip.

In the configuration described above, the iron tip includes a release hole which makes the solder hole or a supply flow path to the solder hole communicate with the outside, as the physical quantity, the pressure, of the gas flowing through the gas supply portion is measured and based on a change in the pressure of the gas flowing through the gas supply portion, the state of the iron tip may be determined.

In the configuration described above, based on an increase in the pressure of the gas flowing through the gas supply portion, it may be determined that at least one of the contact with the object on which the soldering is performed with the iron tip, the input of the solder piece into the solder hole and the melting of the solder piece in the solder hole is performed.

In the configuration described above, in the solder hole, the melting region is provided in which the solder piece is molten, in the iron tip, the gas release portion which makes the solder hole communicate with the outside is provided on the downstream side with respect to the melting region of the solder hole and when it is detected that the pressure of the gas flowing through the gas supply portion is increased and is thereafter reduced, it may be determined that the molten solder piece flows out from the solder hole.

In the configuration described above, each time the soldering is performed a predetermined number of times, the physical quantity in the iron tip is stored, and the state of the iron tip may be determined by comparison with the current physical quantity.

In the configuration described above, the flow rate in a state where the solder hole is open to the atmosphere is compared with the metered flow rate, and thus at least one of the temperature of the iron tip and the type of gas passing through the solder hole may be determined.

In the configuration described above, the state determination portion may determine, based on the physical quantity after the solder piece is input into the solder hole, at least one of the shape and the size of the solder piece.

Advantages of the Invention

According to the present invention, based on the flow rate of a gas supplied to an iron tip when soldering is performed, the state of the iron tip is determined, and thus it is possible to immediately determine the state of the iron tip in a soldering step, and it is also possible to constantly accurately determine the state of the interior of a solder hole which cannot be observed from the outside.

DESCRIPTION OF EMBODIMENTS

Embodiments of the present invention will be described below with reference to drawings.

First Embodiment

Figure 1:
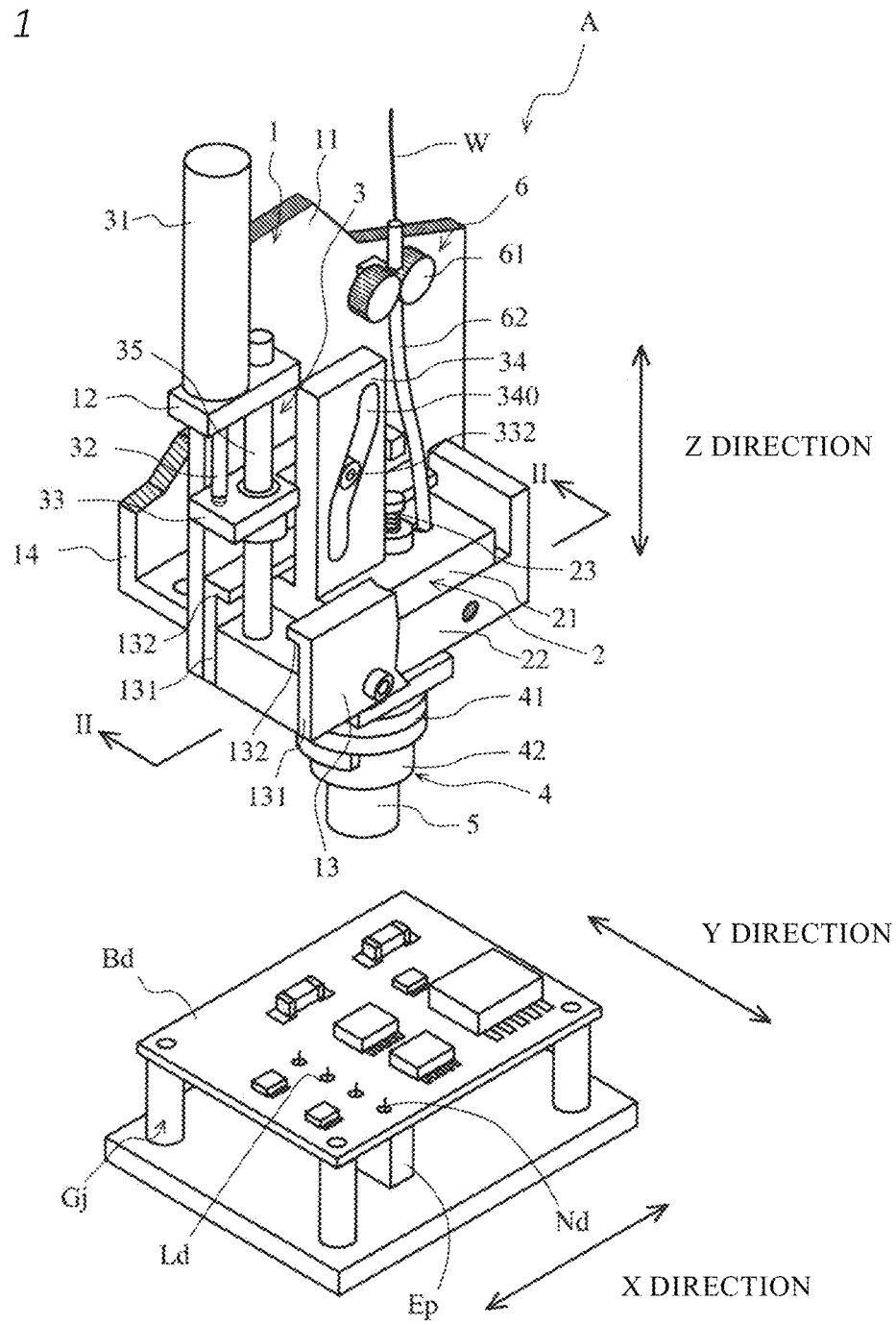
FIG. 1 A perspective view of an example of a soldering device according to the present invention.
Figure 2:
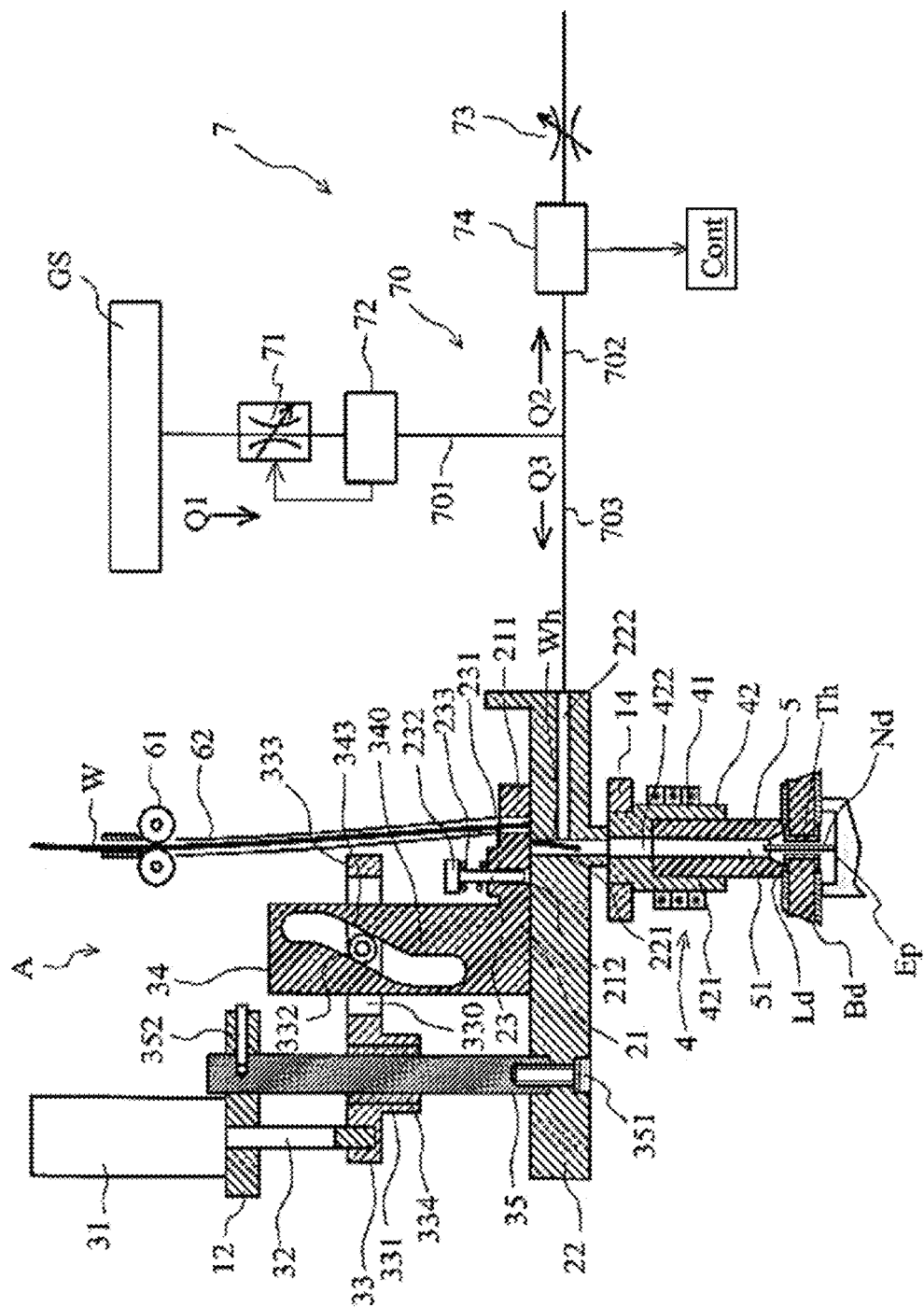
FIG. 2 A cross-sectional view taken along line II-II in the soldering device shown in FIG. 1.
Figure 3:
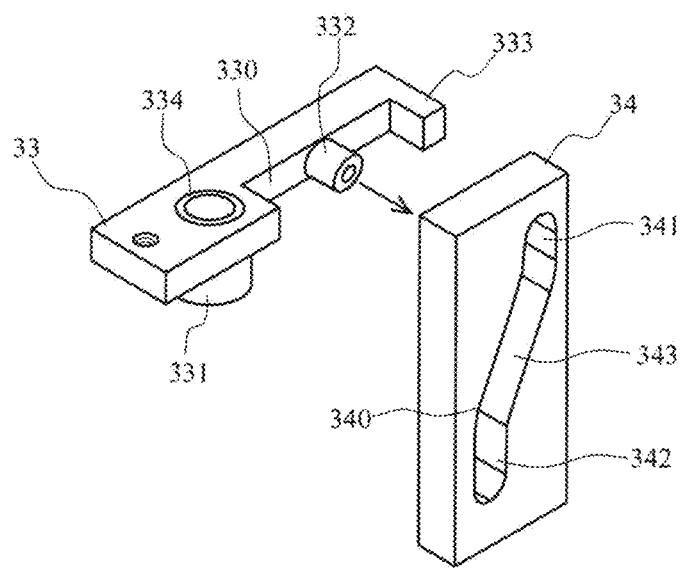
FIG. 3 An exploded perspective view of part of a drive mechanism provided in the soldering device shown in FIG. 1.

FIG. 1 is a perspective view of an example of a soldering device according to the present invention. FIG. 2 is a cross-sectional view taken along line II-II in the soldering device shown in FIG. 1. FIG. 3 is an exploded perspective view of part of a drive mechanism provided in the soldering device shown in FIG. 1. In FIG. 1, parts of a housing and a support portion 1 are cut, and thus the interior of the soldering device is displayed.

As shown in FIG. 1, the soldering device A is a device which supplies a wire solder W from above, and which utilizes an iron tip 5 provided in a lower portion so as to solder a wiring board Bd and an electronic component lip arranged below the iron tip 5. As shown in FIGS. 1 and 2, the soldering device A includes the support portion 1, a cutter unit 2, a drive mechanism 3, a heater unit 4, the iron tip 5, a solder feed mechanism 6 and a gas supply portion 7 (shown in FIG. 2).

The support portion 1 includes a wall member 11 which is provided so as to stand and which is formed in the shape of a flat plate. In the following description, for convenience, it is assumed that as shown in FIG. 1, a horizontal direction along the wall member 11 is an X direction, that a horizontal direction perpendicular to the wall member 11 is a Y direction and that a vertical direction along the wall member 11 is a Z direction. For example, as shown in FIG. 1, the wall member 11 includes a Z-X flat surface.

The soldering device A supplies the molten solder to the wiring board Bd attached to a jig fixture Gj and a terminal Nd of the electronic component Ep arranged in the wiring board Bd, and thereby connects and fixes them. When the soldering is performed, the jig fixture Gj is moved in the X direction and the Y direction so as to locate the land Ld of the wiring board Bd. The soldering device A can also be moved in the Z direction, and after the location, the soldering device A is moved in the Z direction, and thus it is possible to bring the tip end of the iron tip 5 into contact with the land Ld.

The support portion 1 includes the wall member 11, a holding portion 12, a sliding guide 13 and a heater unit fixing portion 14. The wall member 11 is a wall member which is provided so as to stand in the vertical direction and which is formed in the shape of a flat plate. The wall member 11 functions as a support member for the soldering device A. The holding portion 12 is fixed to a position which is displaced upward from a lower end portion of the wall member 11 in the Z direction. The holding portion 12 holds the air cylinder 31 of the drive mechanism 3 which will be described later. The heater unit fixing portion 14 is a member which fixes the heater unit 4 and which is provided in an end portion (lower end portion) of the wall member 11 in the Z direction.

The sliding guide 13 is fixed in the vicinity of the lower end portion of the wall member 11 in the Z direction. The sliding guide 13 is fixed to the wall member 11 together with the cutter lower blade 22 of the cutter unit 2 which will be described later, and guides the cutter upper blade 21 of the cutter unit 2 which will be described later such that the cutter upper blade 21 can slide in the X direction.

The sliding guide 13 is a member which forms a pair opposite each other in the Y direction. The sliding guide 13 includes a pair of wall portions 131 and a pair of stopper portions 132. The wall portions 131 are members which are extended in the X direction and which are formed in the shape of a flat plate. One of the wall portions 131 is arranged in contact with the wall member 11, and the surface on the side opposite to the wall member 11 is in contact with the cutter lower end 22. The other wall portion 131 is in contact with the side surface of the cutter lower blade 22, in other words, the pair of wall portions 131 sandwich the cutter lower blade 22 from both sides in the Y direction. The pair of wall portions 131 and the cutter lower blade 22 are fastened together to the wall member 11 with a fastening tool such as a screw so as to be fixed.

The stopper portions 132 are individually provided in the pair of wall portions 131. The pair of wall portions 131 are extended in the Z direction with respect to the upper surface of the cutter lower blade 22 in the Z direction, and the stopper portions 132 are extended in opposite directions from the upper end portions of the pair of wall portions 131 in the Z direction. In other words, the sliding guide 13 includes the pair of stopper portions 132. The tip ends of the pair of stopper portions 132 in the Y direction are not in contact with each other, and in other words, the sliding guide 13 includes an opening in an upper portion. At least part of the cutter upper blade 21 is arranged between the upper surface of the cutter lower blade 22 and the stopper portions 132. In this way, the cutter upper blade 21 is guided in the X direction and is prevented from being removed in the Z direction.

The cutter unit 2 is a cutting tool which cuts the wire solder W fed by the solder feed mechanism 6 into a solder piece Wh having a predetermined length. The cutter unit 2 includes the cutter upper blade 21, the cutter lower blade 22 and a pusher pin 23.

As described above, the cutter lower blade 22 is fixed to the wall member 11 together with the sliding guide 13. As shown in FIG. 2, the cutter lower blade 22 includes a lower blade hole 221 and a gas inflow hole 222. The lower blade hole 221 is a through hole which penetrates the cutter lower blade 22 in the Z direction, and the wire solder W which penetrates the upper blade hole 211 of the cutter upper blade 21 that will be described later is inserted into the lower blade hole 221. The side edge portion of the upper end of the lower blade hole 221 is formed in the shape of a cutting blade. The upper blade hole 21 and the lower blade hole 221 are used, and thus the wire solder W is cut into the solder piece Wh having the predetermined length. The cut solder piece Wh is dropped downward within the lower blade hole 221 by its weight or by being pushed with the pusher pin 23. The lower blade hole 221 communicates, through the solder supply hole 422 of the heater unit 4 which will be described later, with the solder hole 51 of the iron tip 5 which will be described later. The solder piece Wh dropped within the lower blade hole 221 reaches the solder supply hole 422 and is then dropped into the solder hole 51.

The gas inflow hole 222 is a hole which makes an outside surface of the cutter lower blade 22 communicate with the lower blade hole 221. The gas supply portion 7 for supplying a gas is connected to the outside of the gas inflow hole 222. In other words, the gas supplied from the gas supply portion 7 flows into the gas inflow hole 222. Then, the gas reaches the solder hole 51 through the lower blade hole 221 and the solder supply hole 422. The gas refers to a gas which is used for reducing the oxidation of the solder when the solder is heated so as to be molten. In other words, the gas is used for reducing contact between the molten solder and oxygen. Examples of the gas can include nitrogen gas, argon gas, helium gas and carbon dioxide. In the following description, the soldering device A of the present embodiment is assumed to supply nitrogen gas.

As described above, the cutter upper blade 21 is arranged on the upper surface of the cutter lower blade 22 in the Z direction. The cutter upper blade 21 is guided by the sliding guide 13 such that the direction of sliding at the time of sliding is the X direction, and is prevented from being removed in the Z direction. In other words, the cutter upper blade 21 slides in the X direction on the upper surface of the cutter lower blade 22 in the Z direction. The cutter upper blade 21 is made to slide by the drive mechanism 3.

The cutter upper blade 21 includes the upper blade hole 211 and a pin hole 212. The upper blade hole 211 is a through hole which penetrates the cutter upper blade 21 in the Z direction, and the wire solder W fed from the solder feed mechanism 6 is inserted into the upper blade hole 211. The side edge portion of the lower end of the upper blade hole 211 is formed in the shape of a cutting blade. The pin hole 212 is a through hole which penetrates the cutter upper blade 21 in the Z direction. The rod portion 231 of the pusher pin 23 which will be described later is slidably inserted into the pin hole 212.

The pusher pin 23 includes the rod portion 231, a head portion 232 and a spring 233. The rod portion 231 is a cylindrical member and is slidably inserted into the pin hole 212. The pusher pin 23 is moved downward in the Z direction, and thus the tip end of the rod portion 23 is protruded from the pin hole 212. The head portion 232 is coupled to the top end of the rod portion 231 in an axial direction. The head portion 232 is formed in the shape of a disc which has an outside diameter larger than the inside diameter of the pin hole 212. The head portion 232 is Rot inserted into the pin hole 212. In other words, the head portion 232 functions as a so-called stopper which restricts the movement of the rod portion 231 into the pin hole 212.

The spring 233 is a compression coil spring which surrounds the outside of the rod portion 231 in a radial direction. A lower end portion of the spring 233 in the 7 direction makes contact with the upper surface of the cutter upper blade 21, and the upper end portion thereof in the Z direction makes contact with the lower surface of the head portion 232. Specifically, the spring 233 receives a reaction force from the upper surface of the cutter upper blade 21 so as to push the head portion 232 upward in the Z direction. In this way, the rod portion 231 coupled to the head portion 232 is raised upward in the Z direction, and thus the lower end of the rod portion 231 is maintained so as not to protrude from the lower end of the pin hole 212, Δt a lower end portion of the rod portion 231 in the Z direction, a stopper (unillustrated) for reducing the removal from the pin hole 212 is provided.

The pusher pin 23 pushes downward the solder piece Wh which is cut with the cutter upper blade 21 and the cutter lower blade 22 so as to be left in the lower blade hole 221. Then, the pusher pin 23 is constantly pushed upward, that is, to the side opposite to the cutter lower blade 22 by the elastic force of the spring 233. Specifically, when the head portion 232 is pushed, the rod portion 231 is protruded downward from a lower end portion of the pin hole 212 in the Z direction. The head portion 232 is pushed by the cam member 33 of the drive mechanism 3 which will be described later.

In the cutter upper blade 21, the upper blade hole 211 and the pin hole 212 are provided side by side in the X direction. The cutter upper blade 21 slides in the X direction so as to move to a position in which the upper blade hole 211 and the lower blade hole 221 are vertically overlaid on each other or a position in which the pin hole 212 and the lower blade hole 221 are vertically overlaid on each other. The cutter upper blade 21 may slide such that when the cutter upper blade 21 slides to one sliding end portion, the upper blade hole 211 and the lower blade hole 221 are overlaid on each other whereas when the cutter upper blade 21 slides to the other sliding end portion, the pin hole 212 and the lower blade hole 221 are overlaid on each other.

When the wire solder W is fed from the solder feed mechanism 6 in a state where the upper blade hole 211 and the lower blade hole 221 are overlaid on each other in the Z direction, the wire solder W passing through the upper blade hole 211 is inserted into the lower blade hole 221. As described above, the side edge portion of the lower end of the upper blade hole 211 is formed in the shape of a cutting blade, and the side edge portion of the upper end of the lower blade hole 221 is also formed in the shape of a cutting blade. The lower surface of the cutter upper blade 21 is in contact with the upper surface of the cutter lower blade 22. Hence, in a state where the wire solder W is inserted in the lower blade hole 221, the cutter upper blade 21 slides in the X direction, and thus the wire solder W is cut with the cutting blades of the upper blade hole 211 and the lower blade hole 221.

The cutter upper blade 21 is made to slide in the X direction by the cam member 33. Hence, the cutter upper blade 21 and the pusher pin 23 are in synchronization with the cam member 33. The cam member 33 pushes the head portion 232 when the pin hole. 212 and the lower blade hole 221 are overlaid on each other in the Z direction. Hence, when the cutter upper blade 21 slides in the X direction, the tip end of the rod portion 231 of the pusher pin 23 is stored in the pin hole 212. Thus, when the cutter upper blade 21 slides in the X direction, contact between the tip end of the rod portion 231 and the upper surface of the cutter lower blade 22 is reduced, with the result that the deformation, damage and the like of the tip end of the rod portion 231 and (or) the cutter lower blade 22 are reduced.

The cutter upper blade 21 slides in the X direction, and thus the lower blade hole 211 and the pin hole 212 are overlaid on each other in the Z direction. In a state where the pin hole 212 and the lower blade hole 211 are overlaid on each other, the head portion 232 is pushed by the earn member 33. In this way, the pusher pin 23 is moved downward in the Z direction. When the pusher pin 23 is protruded downward from the pin hole 212 in the Z direction, part of the pusher pin 23 is inserted into the lower blade hole 211. When the solder piece to be described later which is obtained by cutting the wire solder is left in the entrance of the lower blade hole 211, the tip end of the pusher pin 23 pushes the solder piece, and thus the solder piece is dropped.

As shown in FIGS. 1 and 2, the drive mechanism 3 includes the air cylinder 31, a piston rod 32, the cam member 33, a slider portion 34 and a guide shaft 35. The air cylinder 31 is held by the holding portion 12. The air cylinder 31 is formed in the shape of a cylinder with a bottom. Within the air cylinder 31, the piston rod 32 is stored, and the piston rod 32 is driven to slide (expanded and contracted) by the pressure of air supplied from the outside. The air cylinder 31 and the piston rod 32 form the actuator of the drive mechanism 3. The piston rod 32 is arranged within the air cylinder 31 and part thereof is constantly protruded from one end portion (here, a lower end portion in the Z direction) in the axial direction of the air cylinder 31. The air cylinder 31 is held by the holding portion 12 such that the surface of the piston rod 32 which is protruded is directed toward the cutter unit 2, that is, directed downward in the Z direction.

The piston rod 32 penetrates a through hole (unillustrated) provided in the holding portion 12. The piston rod 32 is provided parallel to the guide shaft 35, and reciprocates linearly along the guide shaft 35. A tip end portion of the piston rod 32 is fixed to the cam member 33, and the earn member 33 is made to slide in the Z direction by the expansion and contraction of the piston rod 32. The sliding of the cam member 33 is guided by the guide shaft 35.

As shown in FIG. 2, a lower end portion of the guide shaft 35 is fitted into a concave hole provided in the cutter lower blade 22, and the guide shaft 35 is screwed and fixed to the cutter lower blade 22 with a screw 351, An upper portion of the guide shaft 35 penetrates a hole provided in the holding portion 12, and the movement thereof is restricted by a pin 352. In other words, the guide shaft 35 is fixed with the screw 351 to the cutter lower blade 22 and is fixed with the pin 352 to the holding portion 12.

Although in the present embodiment, the guide shaft 35 is fixed with the screw 351 and the pin 352, there is no limitation to this configuration, and for example, the guide shaft 35 may be fixed by a fixing method such as press-fitting or welding. Although in the present embodiment, the cylindrical member is used as the guide shaft 35, there is no limitation to this configuration, and a member whose cross section is, for example, polygonal or oval may be utilized.

As shown in FIGS. 2 and 3, the cam member 33 is a rectangular member, and includes: a concave portion 330 which is obtained by cutting out part of a long side into a rectangular shape; and a cylindrical support portion 331 which is coupled to the cam member 33 and which includes a through hole penetrated by the guide shaft 35. In the concave portion 330, the slider portion 34 is arranged slidably (in the X direction and the Z direction). The support portion 331 is shaped so as to extend parallel to the guide shaft 35, and is provided so as to reduce the rattling of the cam member 33. In other words, when the cam member 33 has a certain degree of thickness, and thus it is unlikely that rattling occurs, the cylindrical portion may be omitted such that only the through hole forms the support portion 331.

The cam member 33 includes: a cylindrical pin 332 which is provided in an intermediate part of the concave portion 330 and whose center axis is perpendicular to the guide shaft 35; a pin pushing portion 333 which is adjacent to the concave portion 330 and which pushes the pusher pin 23; and a bearing 334 which is arranged within the support portion 331. The pin 332 is inserted into a cam groove 340 which is provided in the slider portion 34 and which will be described later. The bearing 334 is a member which is externally fitted to the guide shaft 35 and which makes the cam member 33 smoothly slide such that the cam member 33 is prevented from rattling.

As shown in FIGS. 2 and 3, the slider portion 34 is a member which is formed in the shape of a rectangular plate, and is formed integrally with the cutter upper blade 21. The slider portion 34 includes the cam groove 340 which penetrates the plate in the direction of thickness of the plate and which is extended in a longitudinal direction. The cam groove 340 includes a first groove portion 341 on the upper side which is extended parallel to the guide shaft 35 and a second groove portion 342 on the lower side which is also extended parallel to the guide shaft 35. The first groove portion 341 and the second groove portion. 342 are provided so as to be displaced from each other in the X direction, and the cam groove 340 includes a connection groove portion 343 which connects the first groove portion 341 and the second groove portion 342 together.

The pin 332 of the cam member 33 is inserted in the cam groove 340, the cam member 33 is moved along the guide shaft 35 and thus the pin 332 slides on the inner surface of the cam groove 340. When the pin 332 is located in the connection groove portion 343 of the cam groove 340, the pin 332 pushes the inner surface of the connection groove portion 343. In this way, the slider portion 34 and the cutter upper blade 21 formed integrally with the slider portion 34 are moved (slide with respect to the cutter lower blade 22) in a direction (X direction) intersecting the direction of sliding of the cam member 33 (Z direction).

Although in the description of the present embodiment, the configuration is adopted in which the cam member 33 includes the pin 332 and in which the slider portion 34 includes the cam groove 340, a configuration may be actually adopted in which the cam member includes the cam groove and in which the slider portion includes the pin.

Although in the present embodiment, an air pressure is used in the actuator of the drive mechanism 3, there is no limitation to this configuration, and an actuator (hydraulic pressure) which uses another fluid (for example, an operating oil) other than air may be adopted. There is also no limitation to the actuator which uses the fluid, and an actuator such as a motor or a solenoid which uses electric power may be adopted. Although in the present embodiment, one actuator, the cam and the cam groove are used to perform the sliding of the cutter upper blade 21 and the pushing down of the pusher pin 23, there is no limitation to this configuration. A plurality of (two) actuators may be included so as to perform the sliding of the cutter upper blade 21 and the pushing down of the pusher pin 23.

As shown in FIGS. 1 and 2, the solder feed mechanism 6 supplies the wire solder W. The solder feed mechanism 6 includes a pair of feed rollers 61 and a guide tube 62. The pair of feed rollers 61 are rotatably attached to the wall member 11. The pair of feed rollers 61 are rotated while sandwiching the side surfaces of the wire solder W sty as to feed the wire solder downward. The pair of feed rollers 61 are biased toward each other, and the wire solder W is sandwiched by the biasing force thereof. By the rotation angle (number of revolutions) of the feed rollers 61, the length of the wire solder W which is fed out is measured (determined).

The guide tube 62 is a tubular member which can be elastically deformed, and the upper end thereof is arranged close to a portion of the feed rollers 61 from which the wire solder W is fed out. The lower end of the guide tube. 62 is provided so as to communicate with the upper blade hole 211 of the cutter upper blade 21. The lower end of the guide tube 62 is moved so as to follow the sliding of the cutter upper blade 21, and the guide tube 62 has such a length and shape as not to be excessively pulled or stuck in the range of the sliding of the cutter upper blade 21.

The heater unit 4 is a heating device for heating and melting the solder piece Wh, and is fixed, as shown in FIG. 2, to the heater unit fixing portion 14 provided in a lower end portion of the wall member 22. The heater unit 4 includes a heater 41 and a heater block 42. The heater 41 is energized so as to generate heat. The heater 41 here includes an electrical heating wire which is wound around the outer circumferential surface of the cylindrical heater block 42.

The heater block 42 has a cylindrical shape, and includes; a concave portion 421 which is used for attaching the iron tip 5 to an end portion in the axial direction and whose cross section is circular; and a solder supply hole 422 which penetrates from the center portion of a bottom portion of the concave portion 421 to the opposite side. The heater block 42 is provided in contact with the cutter lower blade 22 such that the solder supply hole 422 and the lower blade hole 221 communicate with each other. The heater block 42 is provided as described above, and thus the solder piece Wh is moved from the lower blade hole 221 to the solder supply hole 422.

The iron tip 5 is a member which is formed in the shape of a cylinder, and includes a solder hole 51 in a center part which is extended in the axial direction. The iron tip 5 is inserted into the concave portion 421 of the heater block 42 and is prevented from being removed with an unillustrated member. The solder hole 51 of the iron tip 5 communicates with the solder supply hole 421 of the heater block 42, and the solder piece Wh is fed from the solder supply hole 421.

The heat from the heater 41 is transmitted to the iron tip 5, and the solder piece Wh is molten by the heat. Hence, the iron tip 5 is formed of a material having a high thermal conductivity, for example, a ceramic such as a silicon carbide or an aluminum nitride or a metal such as tungsten. Although in the soldering device A, the iron tip 5 is formed in the shape of a cylinder, there is no limitation to this configuration, and the iron tip 5 may be used that is formed in the shape of a tube whose cross section is polygonal or oval. The iron tip 5 may be prepared that has a different shape according to the wiring board Bd. and (or) the shape of the terminal Nd of the electronic component Ep on which soldering is performed.

The gas supply portion 7 supplies, to the soldering device A, the gas supplied from a gas supply source GS which is provided outside the soldering device A. As the gas, the inert gas described previously is used, and thus it is possible to prevent the oxidation of the solder. As shown in FIG. 2, the gas supply portion 7 includes a pipe 70, a first adjustment portion 71, a first metering portion 72, a second adjustment portion 73 and a first measurement portion 74. Although in FIG. 2, the pipe 70 is shown as a diagram for convenience, the pipe 70 is actually a tubular member (for example, a resin pipe) from which nitrogen gas serving as the gas is prevented from leaking.

The pipe 70 is connected to the gas supply source GS so as to make the nitrogen gas from the gas supply source GS flow into the gas inflow hole 222. The pipe 70 includes a main pipe 701, a branch pipe 702 and an inflow pipe 703. The main pipe 701 is a pipe into which the nitrogen gas flows from the gas supply source GS. At a branch portion on the downstream side of the main pipe 701, the main pipe 701 branches into the inflow pipe 703 and the branch pipe 702. The inflow pipe 703 makes the branch portion of the main pipe 701 communicate with the gas inflow hole 222. Specifically, the nitrogen gas flowing through the main pipe 701 is passed through the inflow pipe 703 so as to flow into the gas inflow hole 222.

On the other hand, the branch pipe 702 is a pipe through which part of the gas flowing through the main pipe 701 is made to flow to the outside. In the soldering device A, the gas inflow hole 222 communicates with the lower blade hole 221, the solder supply hole 422 and the solder hole 51, and the solder hole 51 is open to the outside. For example, when the soldering device A is operated, the solder hole 51 may be blocked by the molten solder. In this case, the gas supplied from the gas supply source GS is prevented from flowing out, and this can cause the pipe to be damaged. Hence, in the pipe 70, the branch pipe 702 is provided, and thus the nitrogen gas which is prevented from flowing out is discharged to the outside. The branch pipe 702 also functions to reduce an increase in the pressure of the nitrogen gas within the pipe 70.

The first adjustment portion 71 is provided in the main pipe 701. The first adjustment portion 71 includes a flow rate control valve so as to adjust the flow rate of the nitrogen gas flowing through the main pipe 701. The first adjustment portion 71 is provided on the side of the gas supply source GS with respect to the branch point at which the branch pipe 702 branches from the main pipe 701. Specifically, the first adjustment portion 71 adjusts the flow rate of the entire nitrogen gas supplied from the gas supply source GS to the gas supply portion 7.

The first metering portion 72 is arranged between the first adjustment portion 71 of the main pipe 701 and the branch point so as to meter the flow rate of the nitrogen gas flowing through the main pipe 701. In other words, the first metering portion 72 meters the flow rate of the nitrogen gas discharged from the first adjustment portion 71. Then, the first metering portion 72 transmits a control signal for controlling the first adjustment portion 71 to the first adjustment portion 71 such that the metered flow rate of the nitrogen gas is a predetermined flow rate. In other words, the gas supply portion 7 uses the first adjustment portion 71 and the first metering portion 72 so as to perform feedback control, and performs control such that the flow rate of the nitrogen gas supplied from the gas supply source GS is constant. Based on the result of the metering of the first metering portion 72, an operator may manually operate the first adjustment portion 71 so as to adjust the flow rate of the nitrogen gas. When the metered flow rate differs from a predetermined reference value or falls outside a preset range due to any abnormality, a control portion Cont may provide a warning indicating that an abnormality occurs and (or) stop the operation of the soldering device.

The second adjustment portion 73 is arranged in the branch pipe 702. The second adjustment portion 73 includes a throttle valve which throttles the flow rate of the nitrogen gas flowing the branch pipe 702. The second adjustment portion 73 is adjusted, and thus the flow rate of the nitrogen gas flowing through the branch pipe 702 is adjusted. The gas adjusted in the first adjustment portion 71 is separated at the branch point so as to flow to the gas inflow hole 222 and the branch pipe 702. In other words, when it is assumed that the flow rate of the nitrogen gas which is adjusted in the first adjustment portion 71 to flow through the main pipe 701 is Q1, that the flow rate of the nitrogen gas which is adjusted in the second adjustment portion 73 to flow through the branch pipe 702 is Q2 and that the flow rate of the nitrogen gas which flows through the inflow pipe 703 is Q3, a relationship of Q1=Q2+Q3 holds true.

Since the gas supply portion 7 is intended to supply the nitrogen gas in order to reduce the oxidation of the solder at the time of soldering, a large amount of nitrogen gas preferably flows through the inflow pipe 703 as compared with the branch pipe 702. Hence, in the second adjustment portion 73, the branch pipe 702 is throttled at the throttle valve, and thus the flow rate Q2 is minimized. Although the throttle valve is used in the second adjustment portion 73, and thus the throttled amount can be adjusted, for example, an orifice whose flow path resistance is fixed may be used. The second adjustment portion 73 uses the valve which has a predetermined throttled amount, and thus as the pressure on the inflow side is varied, the flow rate is varied.

The first measurement portion 74 is arranged between the branch portion and the second adjustment portion 73 so as to meter the flow rate (that is, the flow rate Q2) of the gas branched at the branch portion. The first measurement portion 74 is connected to the control portion Cont, and thus the flow rate Q2 is transmitted to the control portion Cont. The control portion Cont determines, based on the flow rate Q2, the state of the iron tip. In other words, the control portion Cont functions as a state determination portion which determines the state of the iron tip. Based on the state of the iron tip which is determined, the control portion Cont may control the soldering device A. Examples of the control of the soldering device A include the approach and separation of the soldering device A with respect to the board Bd, the cutting of the wire solder W and the heating of the iron tip 5.

A method of determining the state of the iron tip based on the flow rate in the branch pipe 702 will then be described. In the gas supply portion 7, all the nitrogen gas flowing into the gas inflow hole 222 is assumed to flow into the solder hole 51 of the iron tip 5. For example, the gas inflow hole 222 communicates with the lower blade hole 221, and the lower blade hole 221 penetrates the cutter lower blade 22 vertically in the Z direction. In a state where the nitrogen gas is supplied, the lower blade hole 221 is assumed to be hermetically sealed such that the nitrogen gas is prevented from being removed from the upper end thereof in the Z direction.

The flow rate of the nitrogen gas flowing through the main pipe 701 is adjusted by the adjustment of the gas from the gas supply source CS with the first adjustment portion 71. The flow rate of the nitrogen gas flowing through the main pipe 701 is also the total flow rate of the nitrogen gas supplied to the gas supply portion 7. In other wards, the total flow rate of the nitrogen gas flowing to the gas supply portion 7 is Q1.

The flow rate control valve provided in the first adjustment portion 71 continuously passes the nitrogen gas at a set flow rate regardless of the pressure within the pipe. In other words, the gas supply portion 7 performs flow rate control such that the total flow rate Q1 is constant, in the second adjustment portion 73, the throttle valve is adopted. In the second adjustment portion 73, a flow path area in the branch pipe 702 is only throttled, and as the pressure of the pipe on the upstream side is increased, the flow rate is varied. In other words, the branch flow rate Q2 is varied by the pressure.

In the soldering device A, for example, when the solder piece Wh is supplied into the solder hole 51, part of a cross section perpendicular to the axis of the solder hole 51 is occupied by the solder piece Wh. Hence, the flow path area of the part of the solder hole 51 through which the nitrogen gas flows is decreased, and thus it is difficult for the nitrogen gas to flow therethrough. In other words, the flow path resistance is increased. As the flow path resistance of the solder hole 51 is increased, the supply flow rate Q3 is reduced. In other words, the state of the iron tip is changed, and thus the supply flow rate Q3 is varied. The control portion Cont determines, based on the supply flow rate Q3 or the change in the supply flow rate Q3, the state of the iron tip. For example, the control portion Cont previously stores information in which the change in the supply flow rate Q3 is associated with the cause of the change. The control portion Cont determines, based on the change in the supply flow rate Q3 which is calculated, the cause thereof, that is, the condition of the iron tip.

Since the control is performed such that the total flow rate Q1 is constant, the supply flow rate Q3 and the branch flow rate Q2 are changed relative to each other. In actuality, the control portion Cont determines, based on the branch flow rate Q2, the state of the iron tip. For example, as the supply flow rate Q3 is reduced, the branch flow rate Q2 is increased because the total flow rate Q1 in the main pipe 701 is substantially constant.

The branch flow rate Q2 in each state of the iron tip will be described below with reference to drawings. FIGS. 4 to 9 are diagrams showing the operation of the soldering device or the state of the iron tip. FIG. 10 is a diagram showing changes in the branch flow rate when a soldering operation is performed once in the soldering device. In the description of the present embodiment, it is assumed that the board Bd is a through-hole board and that the terminal Nd inserted into a through hole Th is soldered.

In the description of the present embodiment, six states of (a) reference state, (b) iron tip contact state, (c) solder piece input state, (d) solder piece molten state, (e) solder piece flow-out state and (f) iron tip separated state are mentioned. In the soldering device A, when the soldering is performed once, the individual states of (a) to (f) are sequentially changed.

(a) Reference State

Figure 4:
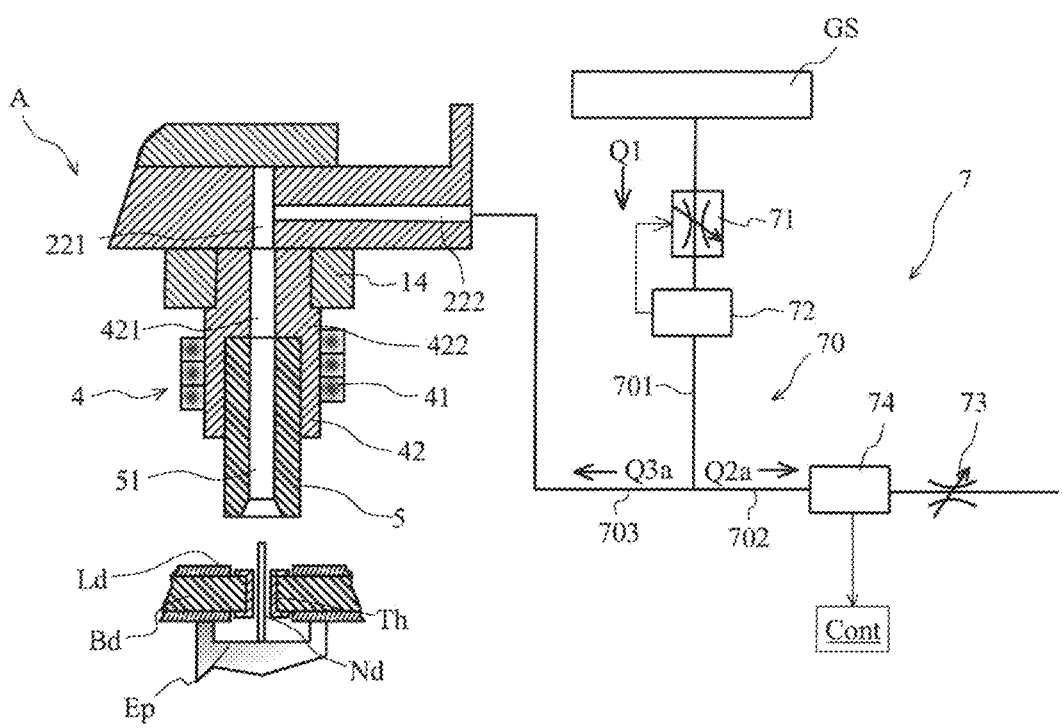
FIG. 4 A diagram showing the surrounding of an iron tip in the soldering device in a reference state and a gas supply portion.

FIG. 4 is a diagram showing the surrounding of the iron tip in the soldering device in the reference state and the gas supply portion. As shown in FIG. 4, in the soldering device A, in a stage preceding the soldering (for example, where the iron tip 5 is preheated or the board Bd on which the soldering is performed is changed), the iron tip 5 is separated from the board Bd. In the present embodiment, the state where the iron tip 5 is separated from the board Bd is assumed to be the reference state. In other words, an opening in the lower end of the solder hole 51 in the Z direction is open to the atmosphere. In the present embodiment, when the soldering device A is in the reference state, the heater unit 4 is driven so as to heat the iron tip 5. When in the reference state, the supply of the nitrogen gas from the gas supply source OS is started, the nitrogen gas is supplied to the gas supply portion 7. As described previously, in the gas supply portion 7, the nitrogen gas is adjusted in the first adjustment portion 71 so as to have the total flow rate Q1.

As shown in FIG. 4, in the reference state of the soldering device A, the lower end portion of the solder hole 51 in the iron tip 5 is open to the outside. The flow path resistance of the solder hole 51 is low. On the other hand, since the flow path is throttled in the second adjustment portion 73, the flow path resistance of the branch pipe 702 is high. Hence, a large proportion of the flow rate Q1 (the total flow rate Q1) of the nitrogen gas flowing through the main pipe 701 flows into the supply pipe 703 at a supply flow rate Q3a. The control portion Cont acquires the flow rate from the first measurement portion 74, and in the reference state, a branch flow rate Q2a flows through the branch pipe 702. The branch flow rate Q2a is lower than the supply flow rate Q3a.

(b) Iron Tip Contact State

Figure 5:
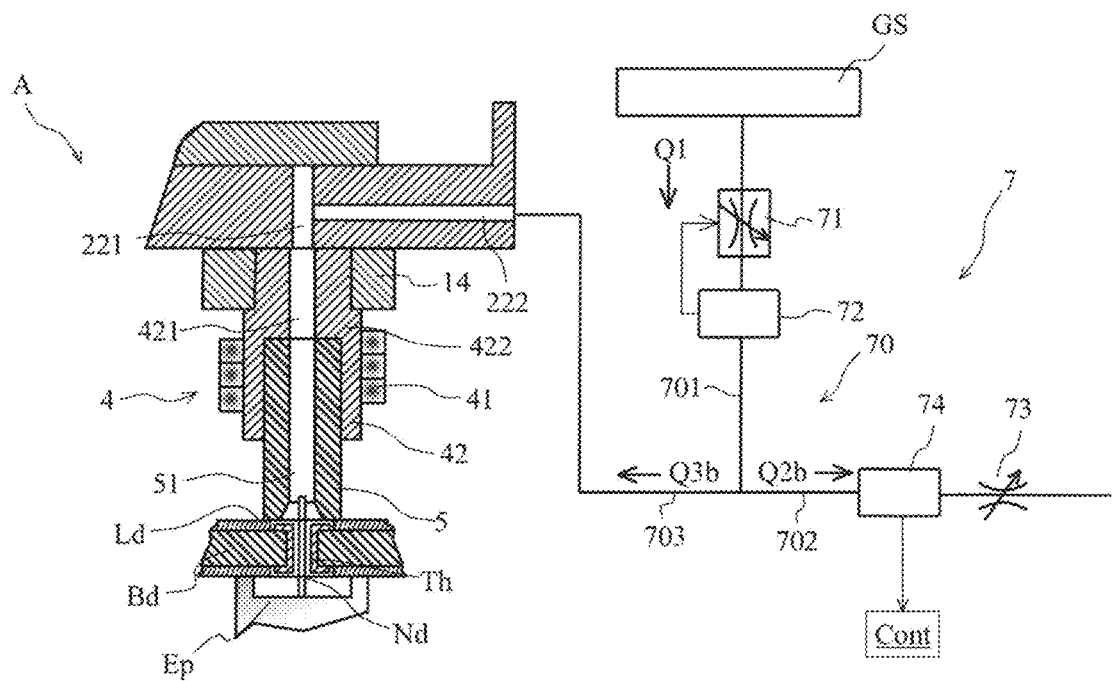
FIG. 5 A diagram showing the surrounding of the iron tip in the soldering device in an iron tip contact state and the gas supply portion.

FIG. 5 is a diagram showing the surrounding of the iron tip in the soldering device in the iron tip contact state and the gas supply portion. In the soldering device. A, since the soldering is performed after the reference state, the iron tip 5 is brought into contact with the land Ld of the board Bd. In the soldering device A, the iron tip 5 is brought into contact with the land Ld, and thus the temperature of the land Ld is raised to a temperature suitable for the soldering (preheating).

Then, the iron tip 5 is brought into contact with the land IA, and thus the solder hole 51 of the iron tip 5 is blocked by the land Ld. Since the terminal Nd which penetrates the through hole Th is soldered to the board Bd, as shown in FIG. 5, an upper end portion of the terminal Nd of the electronic component in the Z direction is inserted into the solder hole 51. The nitrogen gas passing through the solder hole 51 flows to the outside from the through hole Th into which the terminal Nd is inserted.

The part of the through hole Th where the terminal Nd is inserted through which the nitrogen vas is removed is the flow path of the nitrogen gas, and the flow path area thereof is smaller than a cross-sectional area which is cut with a plane perpendicular to the axis of the solder hole 51, in the iron tip contact state, on the tip end side of the solder hole 51, flow path resistance is formed, and in other words, the flow path resistance of the supply pipe 703 is higher than that in the reference state, in this way, a supply flow rate Q3b is lower than that in the reference state. Consequently, a large amount of nitrogen gas flows into the branch pipe 702 as compared with the reference state. Here, a branch flow rate Q2b flows through the branch pipe 702. The branch flow rate Q2b is higher than the branch flow rate Q2a.

(c) Solder Piece Input State

Figure 6:
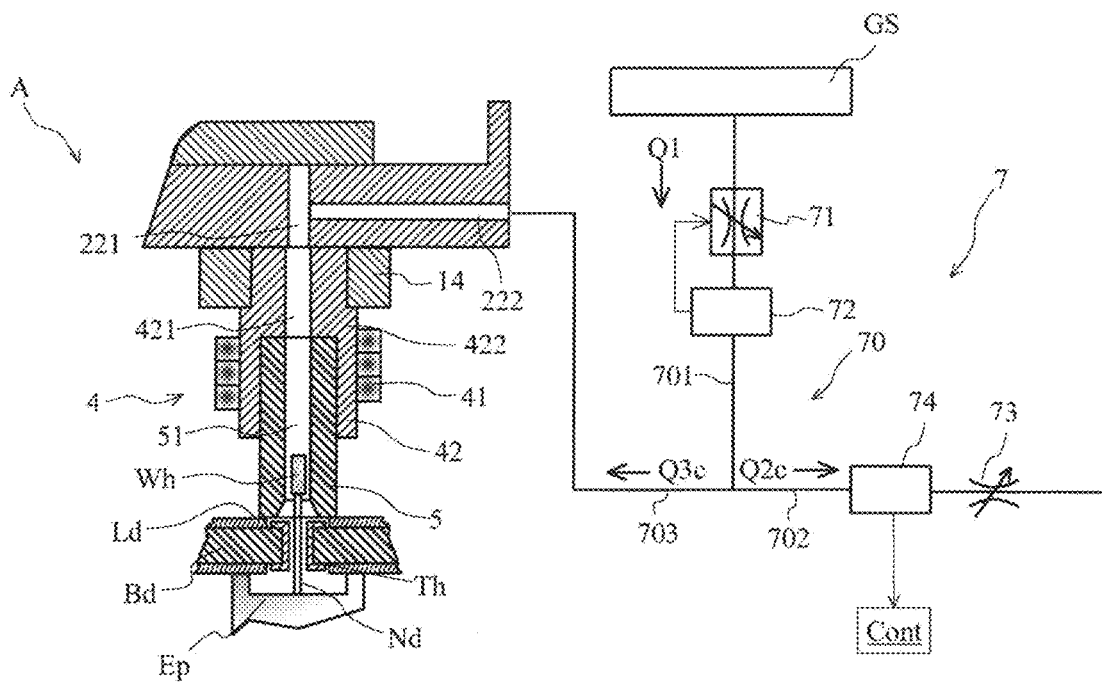
FIG. 6 A diagram showing the surrounding of the iron tip in the soldering device in a solder piece input state and the gas supply portion.

FIG. 6 is a diagram showing the surrounding of the iron tip in the soldering device in the solder piece input state and the vas supply portion. In the soldering device A, the iron tip 5 is brought into contact with the land Ld, the preheating is performed, the temperature of the land Ld is raised to an appropriate temperature and thereafter the solder piece Wh is input into the solder hole 51. The control of the preheating of the land Ld may be performed by directly detecting the temperature of the land Ld with a temperature sensor and using the temperature or may be performed by the contact time of the iron tip 5 and the land Ld.

Then, with timing at which the preheating is completed, the solder piece Wh is input into the solder hole 51. The solder piece Wh is formed by cutting the wire solder W with the cutter upper blade 21 and the cutter lower blade 22. The solder piece Wh is pushed by its weight or the pusher pin 23 so as to be dropped, is passed through the lower blade hole 221 and the solder supply hole 422 and is input into the solder hole 51. The solder piece Wh is brought into contact with the terminal Nd which is inserted in the solder hole 51 so as to be stopped within the solder hole 51. As described above, the solder piece Wh is stopped partway through the solder hole 5 and thus the flow path area of the solder hole 51 through which the nitrogen gas is passed is decreased. In this way, in the solder piece input state, as compared with the iron tip contact state, the flow path resistance of the supply pipe 703 is increased. A supply flow rate Q3c in the solder piece input state is lower than that in the iron tip contact state.

Consequently, a large amount of nitrogen gas flows into the branch pipe 702 as compared with the iron tip contact state. Here, a branch flow rate Q2c flows through the branch pipe 702. The branch flow rate 2c is higher than the branch flow rate Q2b.

(d) Solder Piece Molten State

Figure 7:
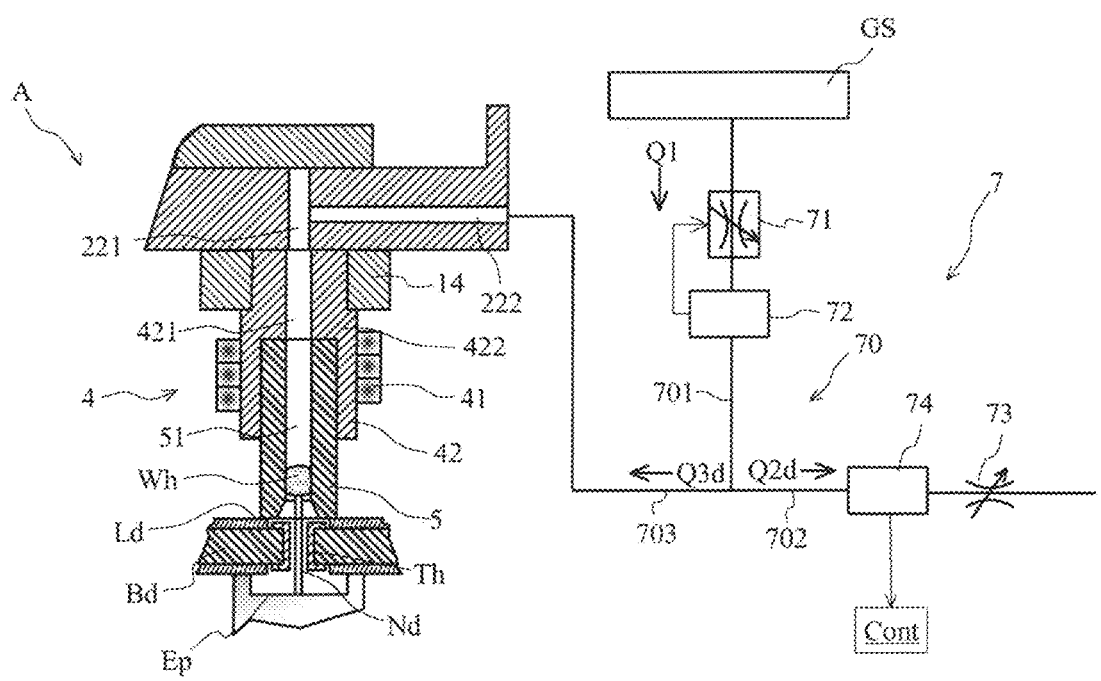
FIG. 7 A diagram showing the surrounding of the iron tip in the soldering device in a solder piece molten state and the gas supply portion.

FIG. 7 is a diagram showing the surrounding of the iron tip in the soldering device in the solder piece molten state and the gas supply portion. In the soldering device A, the iron tip 5 is heated with the heater unit 4, and the solder piece Wh input into the solder hole 5 is heated with the iron tip 5 so as to be molten. The molten solder piece Wh is a liquid which has a high viscosity. Then, the solder hole 51 is blocked by the molten solder piece. In this way, the nitrogen gas is prevented from leaking from the solder hole 51 to the outside or is unlikely to leak therefrom.

In other words, the solder piece Wh is molten, and thus the flow rate of the nitrogen gas in the supply pipe 703, that is, a supply flow rate Q3d is low as compared with the solder piece input state. Consequently, a large amount of nitrogen gas flows into the branch pipe 702 as compared with the solder piece input state. Here, the nitrogen gas at a branch flow rate Q2d flows through the branch pipe 702. The branch flow rate Q2d is higher than the branch flow rate Q2c.

(e) Solder Piece Flow-Out State

Figure 8:
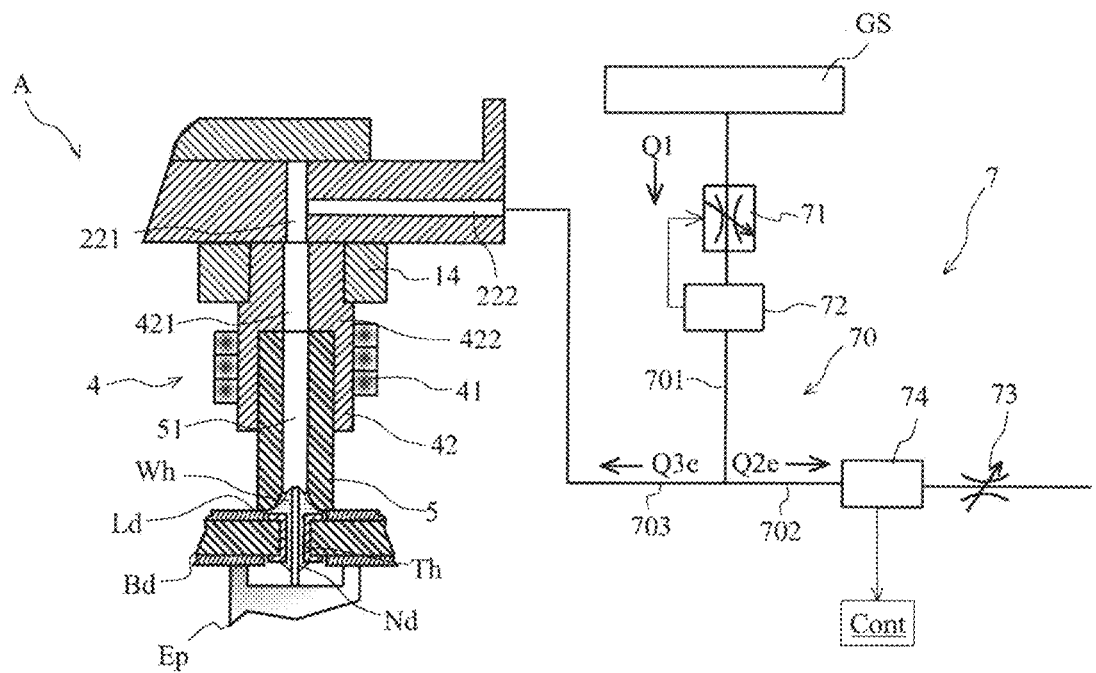
FIG. 8 A diagram showing the surrounding of the iron tip in the soldering device in a solder piece flow-out state and the gas supply portion.

FIG. 8 is a diagram showing the surrounding of the iron tip in the soldering device in the solder piece flow-out state and the gas supply portion. When the molten solder piece Wh flows out, the molten solder piece Wh blocks the through hole Th. The iron tip 5 is in contact with the land Ld. In this way, the nitrogen gas flowing into the solder hole 51 is prevented from leaking from the solder hole 51 to the outside or is unlikely to leak therefrom. In other words, in the solder piece flow-out state, the flow rate of the nitrogen gas in the supply pipe 703, that is, a supply flow rate. Q3e is about as low as that in the solder piece molten state. Consequently, an equal amount of nitrogen gas to the solder piece molten state or a substantially equal amount thereto flows into the branch pipe 702. Here, a branch flow rate Q2e flows through the branch flow rate Q2e. The branch flow rate Q2e is equal to the branch flow rate Q2d or is substantially equal thereto. Since the iron tip 5 is constantly heated with the heater unit 4, all the molten solder piece flows to the outside of the iron tip 5, that is, the land Ld and the terminal Nd of the electronic component Ep.

(f) Iron Tip Separated State

Figure 9:
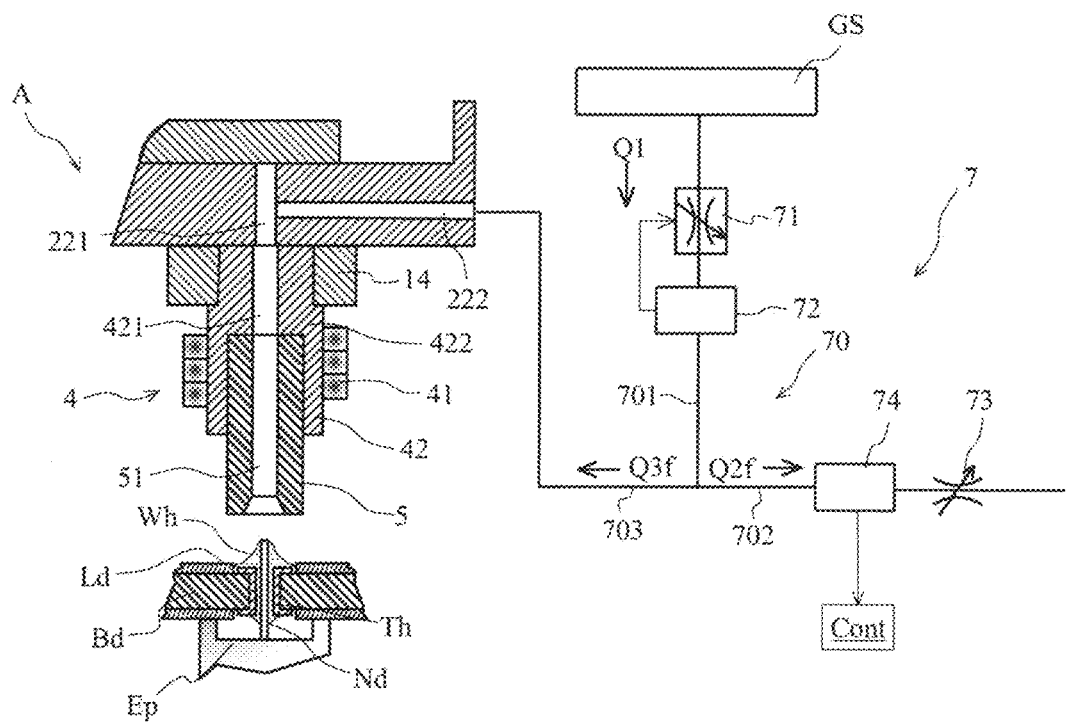
FIG. 9 A diagram showing the surrounding of the iron tip in the soldering device in an iron tip separated state and the gas supply portion.
Figure 10:
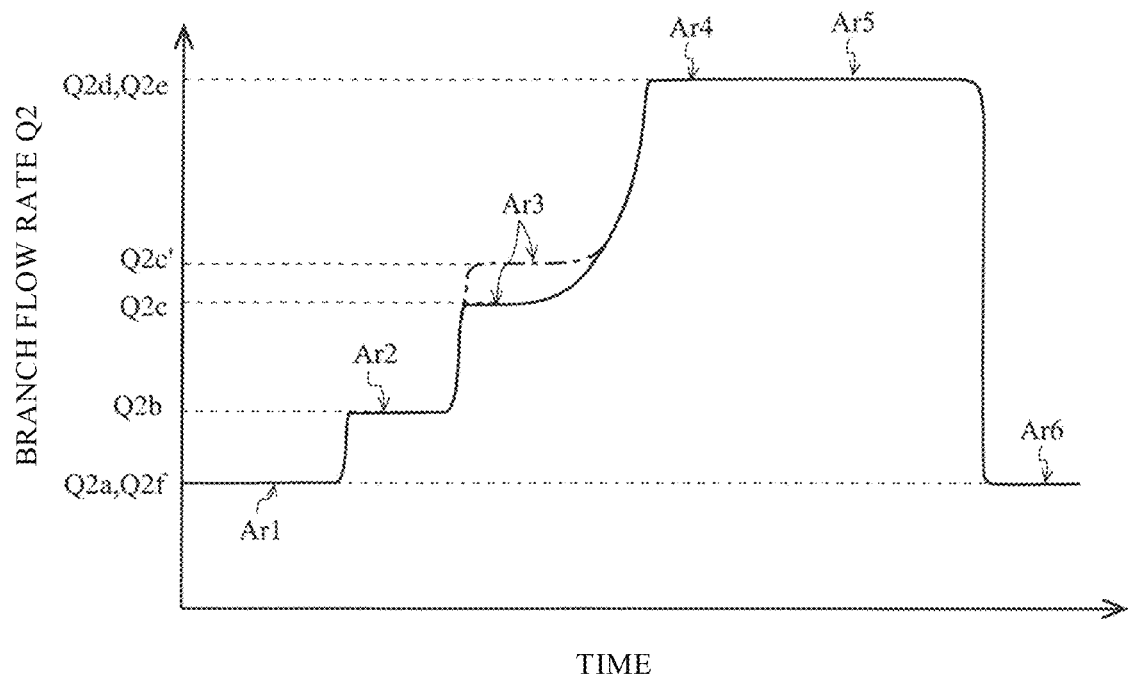
FIG. 10 A diagram showing changes in a branch flow rate when soldering is performed once in the soldering device.

FIG. 9 is a diagram showing the surrounding of the iron tip in the soldering device in the iron tip separated state and the gas supply portion. In the soldering device A, when the soldering of the land Ld and the terminal Nd of the electronic component Ep is completed, the iron tip 5 is separated from the land Ld. In the solder piece flow-out state, the entire amount of molten solder piece Wh or a substantially entire amount thereof flows to the outside of the solder hole 51. Hence, the solder hole 51 is returned to the state before the soldering, that is, the same state as the reference state. If it is assumed that when the iron tip is separated from the land Ld, a branch flow rate Q2f flows through the branch pipe 702, the branch flow rate Q2f is lower than the branch flow rate Q2e, and is equal to the branch flow rate Q2a or substantially equal thereto.

As described above, the branch flow rates Q2a to Q2d (Q2e) are different values depending on the individual states. The control portion Cont previously stores values serving as the references of the branch flow rates Q2a to Q2d (Q2e) as a database, compares them with the data of the branch flow rate Q2 acquired from the first measurement portion 74 and thereby can determine the current state of the iron tip.

Since the branch flow rate Q2d in (d) the solder piece molten state is substantially equal to the branch flow rate Q2e in (e) the solder piece flow-out state, it may be difficult to determine the state from the branch flow rate Q2. Hence, the control portion Cont may detect the state of the iron tip with consideration given to a time change in the branch flow rate Q2. For example, when a predetermined time elapses after the first measurement portion 74 detects the branch flow rate Q2d, the control portion Cont may determine that the iron tip 5 is changed from (d) the solder piece molten state to (e) the solder piece flow-out state.

In the soldering device A, the state of the iron tip is sequentially changed from (a) the reference state, to (b) the iron tip contact state, to (c) the solder piece input state, to (d) the solder piece molten state, to (e) the solder piece flow-out state and then to (f) the iron tip separated state. Then, the branch flow rates Q2 in the individual states are as indicated in a graph shown in FIG. 10. FIG. 10 shows changes in the branch flow rate Q2 when the soldering device A performs the soldering once. In FIG. 10, the vertical axis represents the branch flow rate Q2, and the horizontal axis represents time. The flow rate values Q2a, Q2b Q2c, Q2d, Q2e and Q2f shown in FIG. 10 are reference values.

As shown in FIG. 10, in a first region Ar1, the iron tip is in (a) the reference state. In the first region Ar1, the branch flow rate Q2a is provided. In FIG. 10, in a second region Ar2, the iron tip is in (b) the iron tip contact state. When the iron tip is changed from (a) the reference state to (b) the iron tip contact state, the branch flow rate Q2a is changed to the branch flow rate Q2b. Since the branch flow rate Q2 is changed by contact of the iron tip 5 with the land IA, the branch flow rate Q2a is rapidly changed to the branch flow rate Q2b. In other words, in FIG. 10, the change from the first region Ar1 to the second region Ar2 is abrupt.

In FIG. 10, in a third region Ar3, the iron tip is in (c) the solder piece input state. When the solder piece Wh is input into the solder hole 51, the branch flow rate Q2b is changed to the branch flow rate Q2c. Since the flow path area is rapidly changed by the input of the solder piece Wh into the solder hole 51, the branch flow rate Q2b is rapidly changed to the branch flow rate. In other words, in FIG. 10, the change from the second region Ar2 to the third region Ar3 is abrupt.

In FIG. 10, in a fourth region Ar4, the iron tip is in (d) the solder piece molten state. When the solder piece Wh is molten in the solder hole 51, the branch flow rate Q2c is changed to the branch flow rate Q2d. The flow path area is changed by the melting of the solder piece Wh in the solder hole 51. In the melting of the solder piece, flux is first molten, and thereafter the solder is molten. The flux is slowly molten, and the solder is rapidly molten. In the change from the branch flow rate Q2c to the branch flow rate Q2d, the branch flow rate Q2c is changed slowly at first, and is rapidly changed after a constant change. In other words, in FIG. 10, the third region Ar3 is changed slowly at first, and is thereafter changed rapidly.

As described previously, the branch flow rate Q2d in (d) the solder piece molten state is equal to the branch flow rate Q2e in (e) the solder piece flow-out state or is substantially equal thereto. Hence, the branch flow rate Q2d is not changed for a certain period of time.

As described above, the branch flow rate which is the flow rate of the nitrogen gas in the branch pipe 702 of the iron tip is characterized not only in the value thereof but also in the ratio of change in the branch flow rate Q2 (rapid change or slow change) when the state is changed.

A determination as to whether the step of soldering is normally performed is made as follows. First, the range of the reference value of the branch flow rate in each of the soldered states is previously set. Then the determination is made by comparison between the range of the reference value in each of the soldered states and the metered branch flow rate. For example, the determination in (c) the solder piece input state will be described. An upper limit value Qx1 and a lower limit value Qy1 for the reference value are first set in the time zone of Ar3 where the iron tip is in (c) the solder piece input state. The upper limit value Qx1 and the lower limit value Qy1 are respectively a value indicated by Qx1=Q2+x1 and a value indicated by Qy1=Q2c−y1 (x1 and y1 are positive numbers). When the branch flow rate Q2 metered in the time zone of Ar3 in the step of soldering falls outside the range from the upper limit value Qx1 to the lower limit value Qy1, the control portion Cont may determine that an abnormality occurs in the step of soldering and thereby provide a warning or stop the operation. Here, one of x1 and y1 may be zero.

By use of x2 and y2 which are values smaller than x1 and y1 described above, a second upper limit value Qx2=Q2c+x2 and a second lower limit value y2=Q2c−y2 are set, and when the branch flow rate Q2 metered in the time zone of Ar3 falls outside a range from the second upper limit value Qx2 to the second lower limit value Qy2, the control portion Cont can notify a caution to the operator. Here, one of x2 and y2 may be zero. Although in the above description, the determination in one stage in which the first upper and lower limit values are used so as to provide a wanting or to stop the operation or the determination in two stages in which the second upper and lower limit values are further used so as to provide a caution and in which the reference value is used so as to provide a warning or to stop the operation are mentioned, these are examples, and by use of a larger number of reference values, a caution or a warning may be provided in two or more stages. In the state other than (c) the solder piece input state, the range of the reference value is likewise set, the range of the reference value and the measured branch flow rate are compared and thus whether the step of soldering is normally performed is determined.

Regardless of the time and the flow rate, when the solder is molten or flows out, the branch flow rate Q2 is increased to the maximum value. The control portion Cont can also determine that the solder is molten when the control portion Cont detects a value near the peak value (here, the branch flow rate Q2d) of the branch flow rate.

Furthermore, in addition to the change of the state of the iron tip as described above, it is also possible to determine whether any abnormality such as the adherence of a foreign substance to the iron tip or the mixing of a foreign substance therewith occurs. For example, a description will be given using, as an example, a case where in the stage (Ar3) in which the solder piece is input into the solder hole 51, the state of dirt of the solder hole 51 is determined. In the initial state where the solder hole 51 is not dirty, the branch flow rate Q2 in the branch pipe 702 is Q2c. On the other hand, in a state where an adherence substance such as dross is adhered to the inner circumferential wall of the solder hole 51, a flow path area within the solder hole 51 through which the nitrogen gas is passed is decreased, and the flow path area is further decreased by the input of the solder piece Wh, with the result that the branch flow rate Q2 in the branch pipe 702 is increased to a flow rate Q2c' which is higher than the flow rate Q2c in the initial state (an alternate long and short dash line in FIG. 10). The control portion Cont previously stores the flow rate Q2c in the initial state, compares the measured flow rate Q2 in the branch flow rate pipe of the branch pipe 702 with the flow rate Q2c and thereby can determine the state of dirt of the solder hole 51. When the soldering device determines that any abnormality occurs, the control portion Cont may provide a warning indicating that the abnormality occurs and (or) stop the operation.

In order to perform the abnormality determination as described above, the control portion Cont previously stores a table as shown in FIG. 10 which indicates a time change in the branch flow rate when the soldering is performed once, chronologically arranges pieces of data of the branch flow rate from the first measurement portion 74, compares behaviors and values and thereby determines the state of the iron tip. The determination method as described above is used, and thus it is possible to more accurately determine the state of the iron tip.

The control portion Cont may acquire the total flow rate (referred to as the metered total flow rate) of the nitrogen gas flowing through the main pipe 701 which is metered with the second metering portion 72. Then, when the metered total flow rate differs from the predetermined total flow rate, and the difference therebetween falls within a certain range, the control portion Cont corrects the total flow rate Q1 to the metered total flow rate and corrects, based on the metered total flow rate, the branch flow rates (here, Q2a, Q2b, Q2c, Q2d and the like) when the individual states are determined, with the result that the correction values thereof may be used to determine the individual states. Furthermore, when the difference between the metered total flow rate and the previously expected total flow rate exceeds the certain range, the control portion Cont may stop the determination of the state and provide a warning indicating that an abnormality occurs and (or) stop the operation.

(First Variation)

In the embodiment described above, the description is given with the assumption that the thickness and the length of the solder piece Wh are constant. However, a variation in the feed of the wire solder W may be produced. For example, when the area on which the soldering is performed is large, the shape and the size of the solder piece Wh may be intentionally changed. In such a case, the control portion Cont may determine the shape, the size and the like of the input solder piece Wh based on the magnitude and the behavior of a variation when the branch flow rate Q2 is varied from the branch flow rate Q2b in (b) the iron tip contact state. When it is likely that solder pieces having different sizes and shapes are input, the control portion Cont preferably includes, as a database, a table which indicates, for each of the solder pieces Wh having different sizes and shapes, the reference value of the branch flow rate in each of the states and (or) a time change thereof.

(Second Variation)

Figure 11:
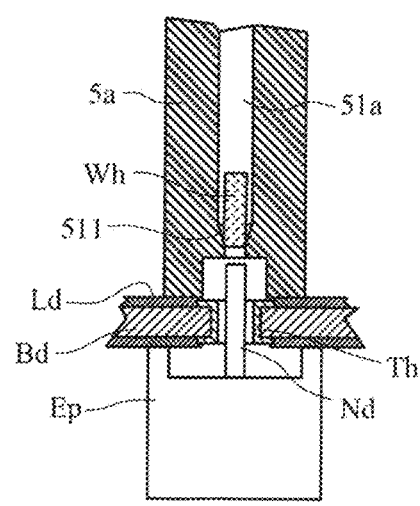
FIG. 11 A cross-sectional view showing an example of an iron tip which is used in a variation of the soldering device according to the present embodiment.

A variation of the soldering device according to the present embodiment will be described with reference to drawings. FIG. 11 is a cross-sectional view showing an example of an iron tip which is used in the variation of the soldering device according to the present embodiment. As shown in FIG. 11, in the iron tip 5a which is used in the soldering device of the third variation, a solder piece stop portion 511 which stops the solder piece Wh before the solder piece Wh makes contact with the terminal Nd is provided within a solder hole 51a.

As shown in FIG. 11, the solder piece stop portion 511 has a tapered shape whose inside diameter is reduced as it is extended downward in the Z direction. When the solder piece reaches the solder piece stop portion 511, the gap of the solder hole 51a is decreased by the solder piece 511. In this way, the flow path resistance of the supply pipe 703 in (c) the solder piece input state is increased. Thus, in the third variation, the branch flow rate in (c) the solder piece input state is increased. Then, since a difference between the branch flow rates in (b) the iron tip contact state and (c) the solder piece input state is increased, the control portion Cont easily distinguishes between (b) the iron tip contact state and (c) the solder piece input state. Before the solder piece Wh reaches the solder piece stop portion 511, the solder piece Wh may be stopped within the solder hole 51a. In this case, the flow path resistance of the solder piece is decreased as compared with the case where the solder piece Wh reaches the solder piece stop portion 511. By utilization thereof, the control portion Cont can determine whether the solder piece Wh reaches the solder piece stop portion 511, that is, whether the solder piece Wh is input without fail.

Although in the present embodiment, as the states which can be taken when the soldering device A performs the soldering, the six states that are (a) the reference state, (b) the iron tip contact state, (c) the solder piece input state, (d) the solder piece molten state, (e) the solder piece flow-out state and (f) the iron tip separated state are mentioned, a state other than these states may be determined.

(Third Variation)

In the embodiment described above, the description is given with the assumption that the iron tip 5 is in a state of such a high temperature that the solder can be molten. However, due to a failure in the heater 41 or the like, the iron tip 5 can fall outside a normal temperature range which is set for melting the solder. The degree to which the nitrogen gas passing through the iron tip 5 is expanded and the viscosity thereof differ depending on the temperature of the iron tip 5, and thus the flow path resistance is increased or decreased, with the result that the flow rate of the nitrogen gas is also changed. For example, when the temperature of the iron tip 5 is lowered, the volume of the nitrogen gas is reduced, and the viscosity is lowered, with the result that the flow rate of the nitrogen gas in the solder hole 51 is increased. By utilization thereof, the control portion Cont stores the branch flow rate Q2a when the iron tip 5 is in (a) the reference state, and can determine the temperature of the iron tip 5 based on the stored branch flow rates Q2a and the metered branch flow rate Q2.

When the type of gas supplied is changed to a mixed gas of nitrogen and air or a mixed gas of nitrogen and oxygen, the flow path resistance is also changed, and thus the branch flow rate Q2 differs. By utilization thereof, the control portion Cont stores the branch flow rate Q2a in a state where the solder hole 51 is open to the atmosphere, that is, in a state where the iron tip 5 is in (a) the reference state, and can determine, based on the stored branch flow rate Q2a and the metered branch flow rate Q2, whether or not the supplied gas is the nitrogen gas (gas which needs to be supplied). In this way, the control portion Cont can detect an error in the connection of the gas pipe.

Although in the present embodiment described above, the first measurement 74 for metering the flow rate is provided in the branch flow path 702, and based on a change in the flow rate in the branch flow path, the state of the iron tip 5 is determined, the first measurement portion 74 is provided in the supply flow path 703, and the flow rate (supply flow rate) of the nitrogen gas flowing through the supply flow path 703 is directly metered, with the result that based on a change in the supply flow rate, the state of the iron tip 5 may be determined. In this case, a change in the flow rate in each of the states shows a behavior in a direction opposite to the branch flow rate described above. Specifically, a relationship between the supply flow rate and the time shows an upside-down behavior with respect to the table shown in FIG. 10. The supply flow rate is the maximum flow rate in (a) the reference state and is the minimum flow rate in (d) the solder piece molten state.

The operations of the first, second and third variations can be performed, for example, every given period. The given period may be controlled, for example, by time or by the number of times the soldering is performed. The operations may be performed immediately after power is turned on the soldering device A and at the completion of a step. The operations may be performed randomly.

Second Embodiment

Figure 12:
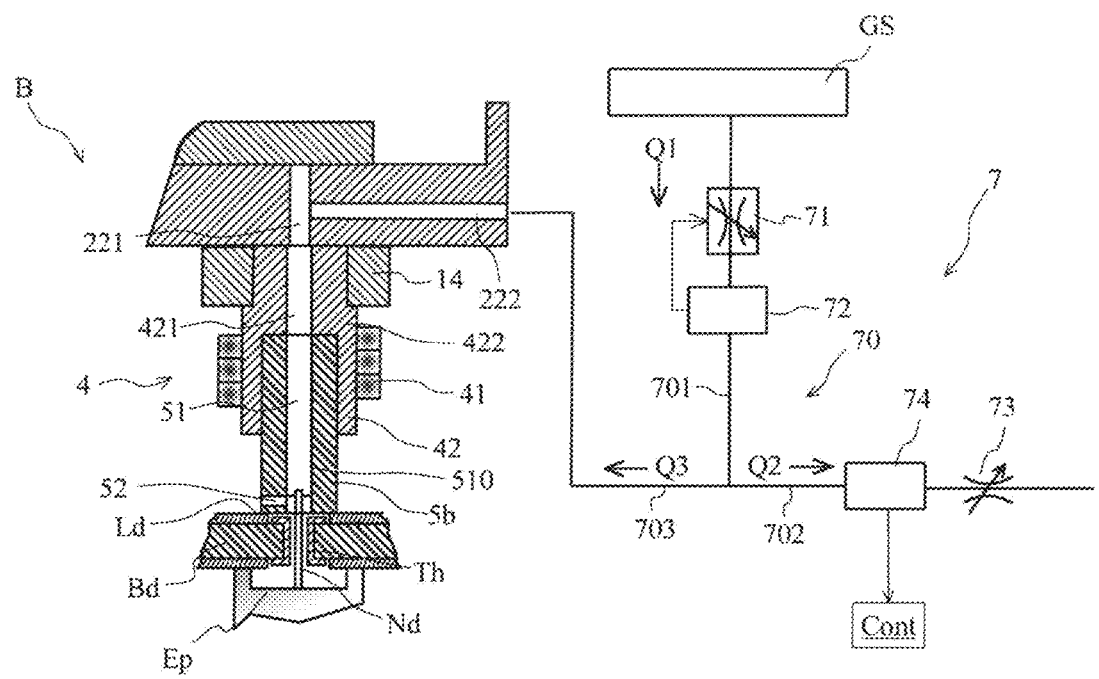
FIG. 12 A diagram showing an iron tip in another example of the soldering device according to the present invention and the gas supply portion.

Another example of the soldering device according to the present embodiment will be described with reference to drawings. FIG. 12 is a diagram showing an iron tip in another example of the soldering device according to the present invention and a gas supply portion. In the soldering device B shown in FIG. 12, a gas release portion 52 which penetrates a solder hole 51 and an outer circumferential surface is included in the iron tip 5b. Except it, the soldering device B has the same configuration as the soldering device A of the first embodiment. Hence, substantially same parts are identified with the same reference signs, and the detailed description of the same parts will be omitted.

As shown in FIG. 12, when the soldering is performed, the terminal Nd of the electronic component Ep is inserted into the solder hole 51 of the iron tip 5. Then, the solder piece Wh which is cut with the cutter unit 2 from the wire solder W is heated, in a state where the solder piece Wh is in contact with the terminal Nd, with the iron tip 5 so as to be molten. Here, when a part in which the solder piece Wh in the solder hole 51 is molten is assumed to be a melting region 510, the gas release portion 52 makes a part between the melting region 510 of the solder hole 51 and the lower end of the iron tip 5 in the Z direction communicate with the outer circumferential surface.

Although in the present embodiment, the gas release portion 52 is formed in the shape of a through hole which makes the outer circumferential surface of the iron tip 5 communicate with the solder hole 51, there is no limitation to this shape. For example, the gas release portion 52 may, be formed, between the melting region 510 of the solder hole 51 and the lower end of the iron tip 5 in the Z direction, in the shape of a notch which makes the solder hole 51 communicate with the outer circumferential surface of the iron tip 5. In addition to the through hole and the slit described above, as the gas release portion 52, shapes capable of making the nitrogen gas in the solder hole 51 flow to the outside of the iron tip 5 in (b) the iron tip contact state and (e) the solder piece flow-out state can be widely adopted.

Figure 13:
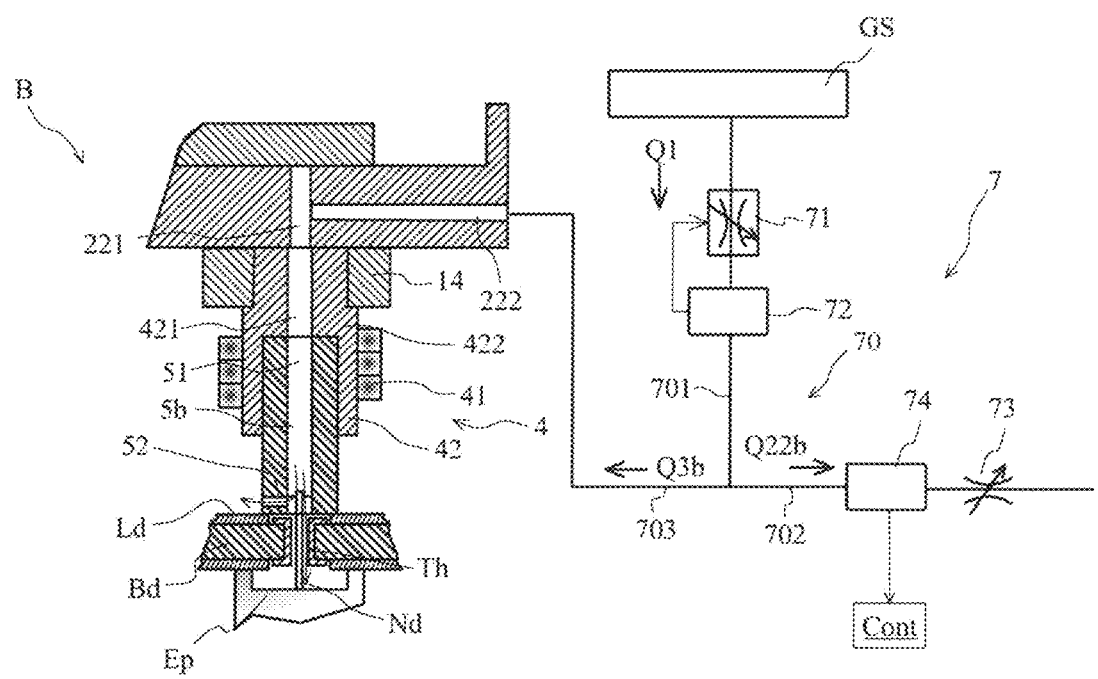
FIG. 13 A diagram showing the iron tip in the iron tip contact state and the gas supply portion.
Figure 14:
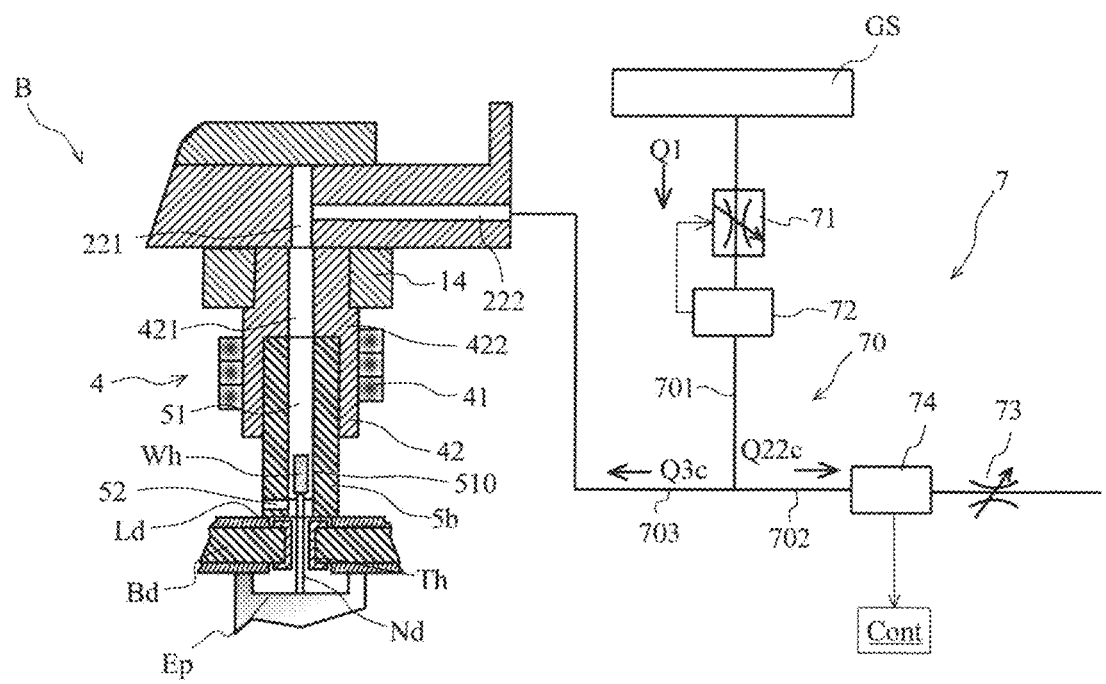
FIG. 14 A diagram showing the iron tip in the solder piece input state and the gas supply portion.
Figure 15:
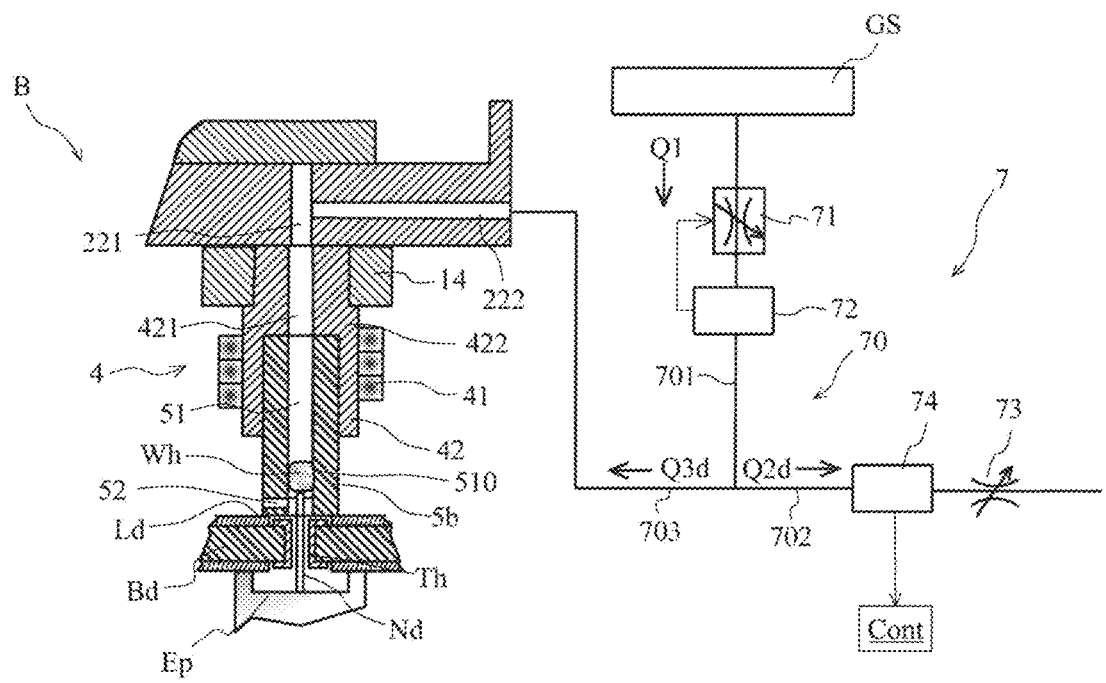
FIG. 15 A diagram showing the iron tip in the solder piece molten state and the gas supply portion.
Figure 16:
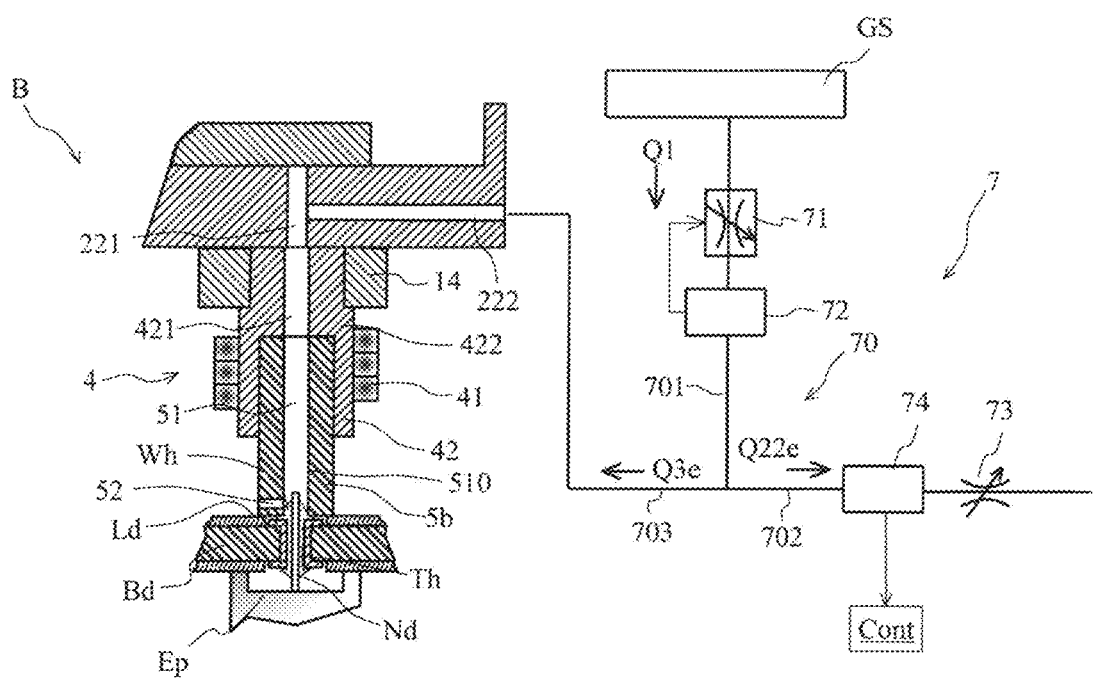
FIG. 16 A diagram showing the iron tip in the solder piece flow-out state and the gas supply portion.

A determination of the state of the iron tip by the control portion Cont when the soldering device B as described above is used will be described with reference to drawings. FIG. 13 is a diagram showing the iron tip in the iron tip contact state and the gas supply portion. FIG. 14 is a diagram showing the iron tip in the solder piece input state and the gas supply portion. FIG. 15 is a diagram showing the iron tip in the solder piece molten state and the gas supply portion. FIG. 16 is a diagram showing the iron tip in the solder piece flow-out state and the gas supply portion.

The states which can be taken in the soldering device B when the soldering is performed once are, as in the first embodiment, (a) the reference state, (b) the iron tip contact state, (c) the solder piece input state, (d) the solder piece molten state, (e) the solder piece flow-out state and (f) the iron tip separated state. Then, (a) the reference state and (f) the iron tip separated state are substantially the same as in the soldering device A of the first embodiment. In each of (13) the iron tip contact state, (c) the solder piece input state and (e) the solder piece flow-out state, the flow rate of the nitrogen gas flowing through the branch pipe 702 is lower than that in the first embodiment. Hence, a description will be given with the assumption that the branch flow rate Q2 is a branch flow rate Q22. For example, in (b) the iron tip contact state, the flow rate of the nitrogen gas flowing through the branch pipe 702 is assumed to be a branch flow rate Q22b. In the individual states, likewise, the branch flow rates in (e) the solder piece input state and (e) the solder piece flow-out state are assumed to be branch flow rates Q22c and Q22e, respectively.

The second embodiment differs from the first embodiment in that the branch flow rates Q2d and Q22e in (d) the solder piece molten state and (e) the solder piece flow-out state are changed. In (d) the solder piece molten state (FIG. 15), as in the first embodiment, the solder hole 51 is blocked by the molten solder piece Wh, and thus the branch flow rate Q2d is equal to that in the first embodiment. In the subsequent step of (e) the solder piece flow-out state (FIG. 16), while the through hole Th is blocked, the nitrogen gas flow outs through the gas release portion 52, with the result that the flow rate Q3e in the supply pipe 703 is increased and that the flow rate Q2e in the branch pipe 702 is reduced. In the first embodiment, the change of the branch flow rate when (d) the solder piece molten state is changed to (e) the solder piece flow-out state is small (or is almost zero) whereas in the second embodiment, the change of the flow rate when the states are changed as described above is increased, with the result that it is possible to easily determine the change of the state.

In (b) the iron tip contact state, the nitrogen gas flows from the through hole Th and the gas release portion 52, and thus as compared with the first embodiment, the branch flow rate Q22b in the branch pipe 702 is decreased. Then, in (d) the solder piece molten state, the solder hole 51 is blocked, and thus the branch flow rate Q2d is equal to that in the first embodiment. Hence, a difference between the branch flow rate Q22b in (b) the iron tip contact state and the branch flow rate Q2d in (d) the solder piece molten state is larger than a difference between the branch flow rate Q2b in (b) the iron tip contact state and the branch flow rate Q2d (d) the solder piece molten state in the first embodiment. In this way, it is possible to easily distinguish between (c) the solder piece input state and (d) the solder piece molten state.

The size of the gas release portion 52 is changed, and thus it is possible to change the flow rate values of the branch flow rates Q22b and Q2e in (b) the iron tip contact state and (e) the solder piece flow-out state. The gas release portion 52 is provided, and thus the molten solder flows into the through hole Th, and thereafter the pressure within the solder hole 51 is lowered, with the result that it is possible to prevent the molten solder within the through hole Th from being pushed out.

Figure 17:
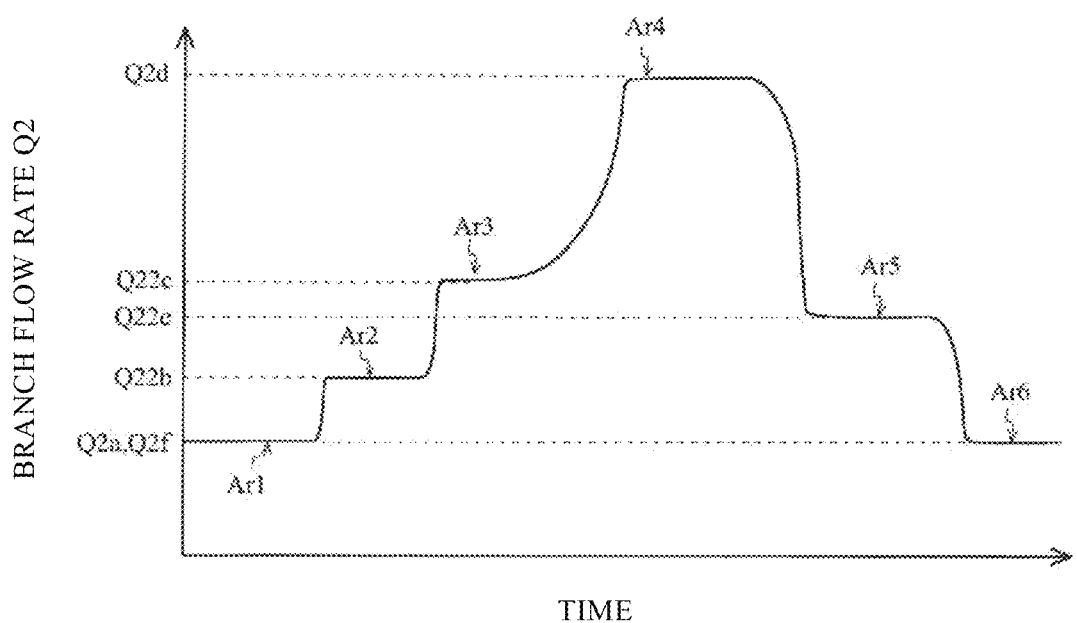
FIG. 17 A diagram showing changes in the branch flow rate when the soldering device performs the soldering once
FIG. 18 A diagram showing yet another example of the soldering device according to the invention.

The branch flow rates Q2 in the individual states are as shown in a graph shown in FIG. 17. FIG. 17 shows changes in the branch flow rate when the soldering device performs the soldering once. In FIG. 17, the vertical axis represents the branch flow rate Q2, and the horizontal axis represents time. In the following discussion, only parts which show behaviors different from those in FIG. 10 will be described.

As shown in FIG. 17, the iron tip 5b which includes the gas release portion 52 is used, and thus after the fourth region Ar4 (branch flow rate Q2d) indicating (d) the solder piece molten state, a fifth region Ar5 indicating (e) the solder piece flow-out state of the branch flow rate Q22e appears.

As described above, the gas release portion 52 is provided in the iron tip 5b, and thus the branch flow rate Q2d which is the flow rate of the nitrogen gas in the branch pipe 702 in (d) the solder piece molten state and the branch flow rate Q22e which is the flow rate of the nitrogen gas in the branch pipe 702 in (e) the solder piece flow-out state can be made different values. In this way, the control portion Cont can more accurately detect (e) the solder piece flow-out state, that is, the completion of the soldering of the terminal Nd of the electronic component Ep and the land Ld.

In the present embodiment, the control portion Cont also stores the branch flow rates in the individual states as a database, compares them with the data of the branch flow rates acquired from the first measurement portion 74 and thereby may determine the state of the iron tip. The control portion Cont stores a table as shown in FIG. 17 showing a time change in the branch flow rate, chronologically arranges pieces of data of the branch flow rate from the first measurement portion 74, compares behaviors and values and thereby may determine the state of the iron tip.

In the present embodiment, the control portion Cont can also perform the same operation as in the "first variation" of the first embodiment. The iron tip which includes the solder piece stop portion as described in the "second variation" of the first embodiment is used, and thus the control portion Cont can also perform the same operation as in the "second variation" of the first embodiment.

Third Embodiment

Figure 18:
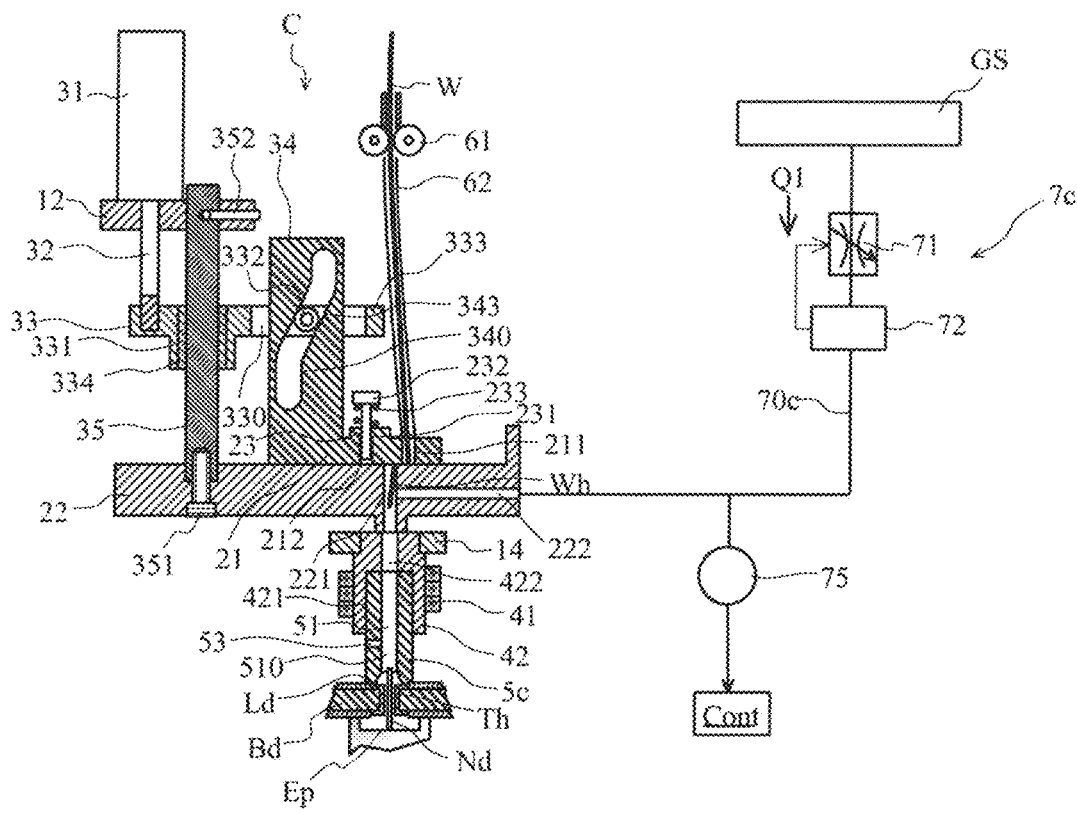

Yet another example of the soldering device according to the present invention will be described with reference to drawings. FIG. 18 is a diagram showing yet another example of the soldering device according to the present invention. The soldering device C shown in FIG. 18 has a substantially same configuration as the soldering device A except that an iron tip 5c and a gas supply portion 7c are different. Hence, in the soldering device C, substantially same parts as in the soldering device B are identified with the same reference signs, and the detailed description of the same parts will be omitted.

As shown in FIG. 18, the iron tip 5c of the soldering device C includes a release hole 53 which makes a part above the melting region 510 where the solder piece Wh input into the solder hole 51 is molten, that is, an upstream side in the direction of flow of the nitrogen gas communicate with the outer circumferential surface. The release hole 53 is a hole through which the flux vaporized when the solder piece is molten is released together with the nitrogen gas in the solder hole 51. The inside diameter of the release hole 53 is smaller than that of the solder hole 51. In other words, the release hole 53 has flow path resistance higher than the solder hole 51.

As shown in FIG. 18, in the gas supply portion 7c, the first adjustment portion 71, the first metering portion 72 and a second measurement portion 75 are provided in a pipe 70c which connects the gas supply source GS and the gas inflow hole 222 together. In the gas supply portion 7c, the same parts as in the gas supply portion 7 are identified with the same reference signs, and the detailed description thereof will be omitted.

The second measurement portion 75 is provided between the first metering portion 72 in the pipe 70c and the gas inflow hole 222. The second measurement portion 75 includes a pressure gauge which measures the pressure of the nitrogen gas within the pipe 70c. The second measurement portion 75 measures the pressure within the pipe 70c, and transmits the result of the measurement to the control portion Cont. The control portion Cont determines the state of the iron tip based on the pressure of the pipe 70c and (or) a change in the pressure.

The determination of the state of the iron tip by the control portion Cont will be described below with reference to drawings. In the present embodiment, the states which can be taken by the iron tip when the soldering device C performs the soldering once are the same as in the first embodiment. Specifically, the states are (a) the reference state, (b) the iron tip contact state, (c) the solder piece input state, (d) the solder piece molten state, (e) the solder piece flow-out state and (f) the iron tip separated state.

A pressure P1 of the nitrogen gas within the pipe 70c in each of the states of the iron tip will be described below with reference to drawings. FIGS. 19 to 24 are diagrams showing the iron tip in the individual states described above. FIG. 25 is a diagram showing changes in the pressure when the soldering device performs the soldering operation once. In the present embodiment, a description will be given with the assumption that the board did is a through-hole board and that the terminal Nd inserted into the through hole Th is soldered.

In the soldering device C, when the soldering is performed once, the individual states of (a) to (f) are sequentially changed. The details of the same parts of the behaviors of the nitrogen gas in the individual states and the like as in the first embodiment will be omitted. The flowing out of the nitrogen gas is indicated by arrows Ga.

(a) Reference State

Figure 19:
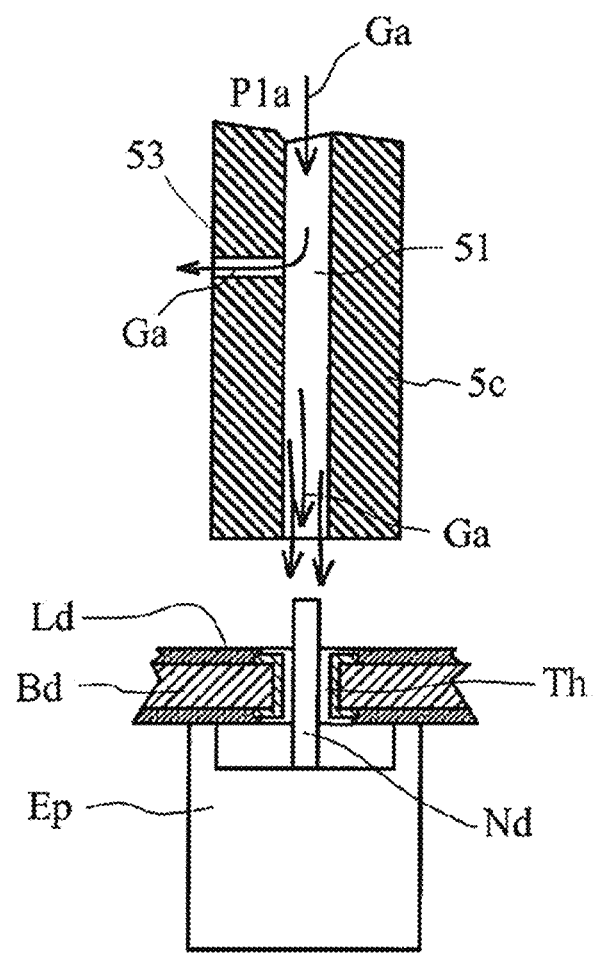
FIG. 19 A diagram showing the iron tip in a reference state.

FIG. 19 is a diagram showing the iron tip in the reference state. As shown in FIG. 19, in (a) the reference state, an opening in the lower end of the solder hole 51 in the Z direction is open to the atmosphere. Hence, even when the nitrogen gas is supplied to the solder hole 51 from the gas supply portion 7c, the pressure within the pipe 70c is constant. The pressure P1 of the pipe 70c in the reference state is assumed to be a pressure P1a. In (a) the reference state, in the iron tip 5c, the lower end of the solder hole 51 is open to the atmosphere, and thus a small amount of nitrogen gas flows from the release hole 53 to the outside.

(b) Iron Tip Contact State

Figure 20:
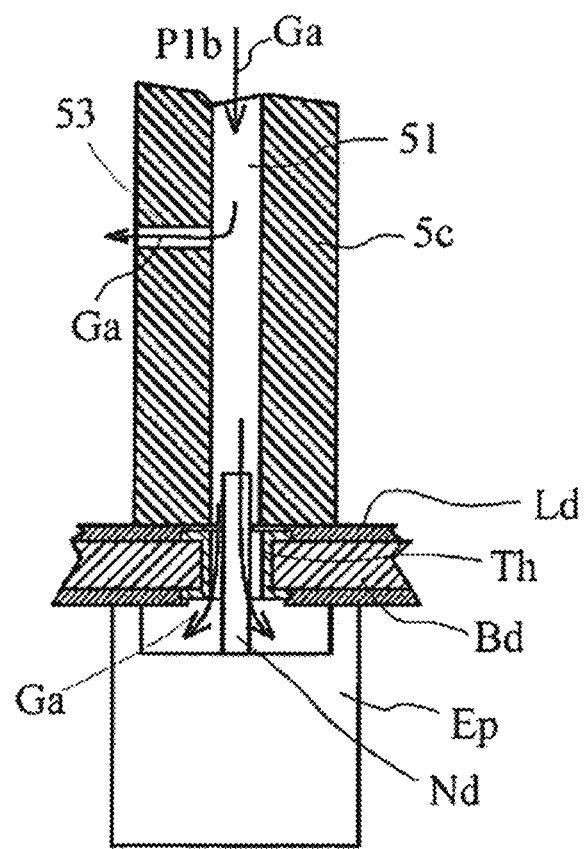
FIG. 20 A diagram showing the iron tip in the iron tip contact state.

FIG. 20 is a diagram showing the iron tip in the iron tip contact state. The iron tip 5c is brought into contact with the land Ld, and thus the solder hole 51 of the iron tip 5c is blocked by the land Ld. Then, the nitrogen gas in the solder hole 51 flows to the outside from the release hole 53 and the through hole Th into which the terminal Nd is inserted.

The nitrogen gas flows out from the lower end of the solder hole 51 only through the through hole Th into which the terminal Nd is inserted, the flow path resistance of the pipe 70c is higher than that in (a) the reference state and the pressure P1b of the nitrogen gas in the pipe 70c in (b) the iron tip contact state is higher than that in (a) the reference state.

(c) Solder Piece Input State

Figure 21:
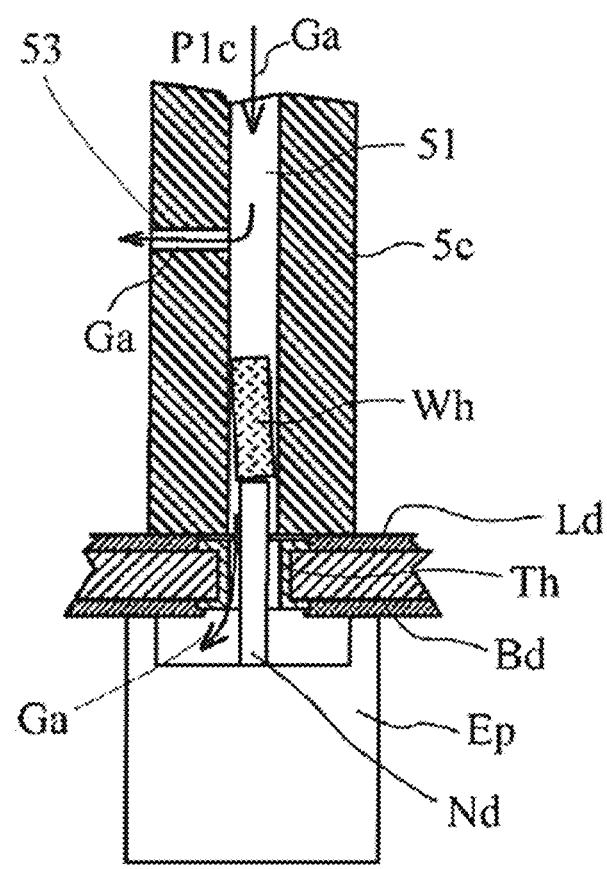
FIG. 21 A diagram showing the iron tip in the solder piece input state.

FIG. 21 is a diagram showing the iron tip in the solder piece input state. When the solder piece is input into the solder hole 51 in (c) the solder piece input state, the solder piece Wh is brought into contact with the terminal Nd inserted in the solder hole 51 so as to be stopped within the solder hole 51, and thus the flow path area through which the nitrogen gas in the solder hole 51 is passed is decreased. In this way, as compared with (b) the iron tip contact state, in (c) the solder piece input state, the flow path resistance of the pipe 70c is increased.

Consequently, the pressure P1c of the pipe 70c in (c) the solder piece input state is higher than the pressure P1b in (b) the iron tip contact state.

(d) Solder Piece Molten State

Figure 22:
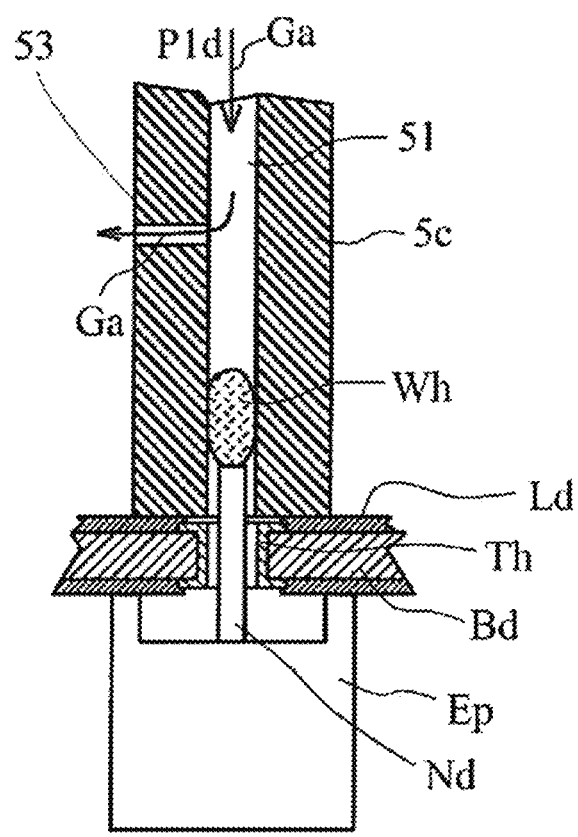
FIG. 22 A diagram showing the iron tip in the solder piece molten state.

FIG. 22 is a diagram showing the iron tip in the solder piece molten state. In (d) the solder piece molten state, the solder piece Wh is heated with the iron tip 5, and thus the lower end portion of the solder hole 51 in the Z direction is blocked by the molten solder piece Wh. As compared with (c) the solder piece input state, in (d) the solder piece molten state, the flow path resistance of the pipe 70c is increased.

Consequently, the pressure of the nitrogen gas in the pipe 70c is higher than that in (c) the solder piece input state. The pressure P1d of the pipe 70c in (d) the solder piece molten state is higher than the pressure P1c.

(e) Solder Piece Flow-Out State

Figure 23:
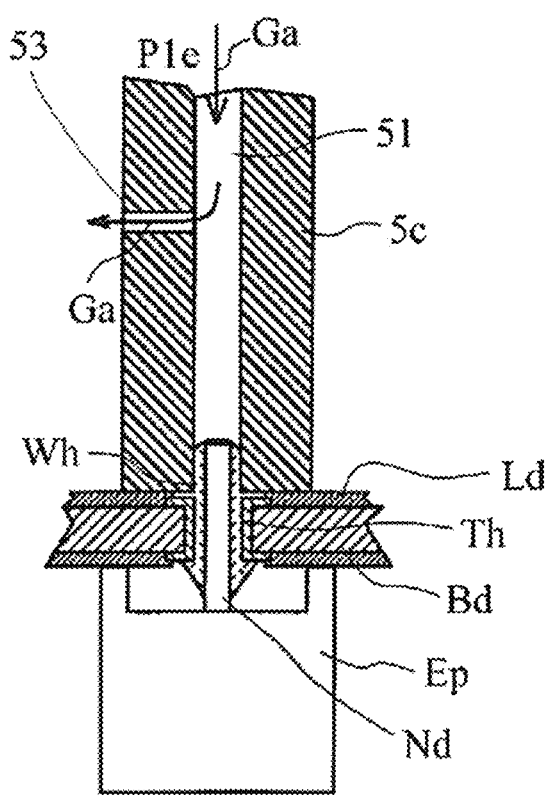
FIG. 23 A diagram showing the iron tip in the solder piece flow-out state.

FIG. 23 is a diagram showing the iron tip in the solder piece flow-out state. In (e) the solder piece flow-out state, the lower end portion of the solder hole 51 in the Z direction is blocked by the molten solder which blocks the land Ld and the through hole Th. The flow path resistance of the pipe 70e in (e) the solder piece flow-out state is equal to or substantially equal to that in (d) the solder piece molten state.

Consequently, the pressure of the nitrogen gas in the pipe 70c is substantially equal to that in (d) the solder piece molten state. The pressure P1e of the pipe 70c iii. (e) the solder piece flow-out state is equal to or substantially equal to the pressure. P1d.

(f) Iron Tip Separated State

Figure 24:
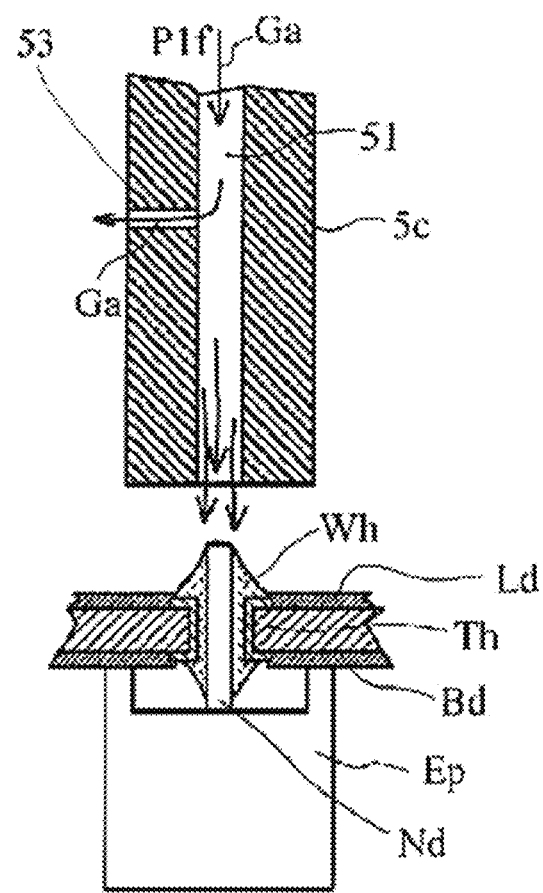
FIG. 24 A diagram showing the iron tip in the iron tip separated state.
Figure 25:
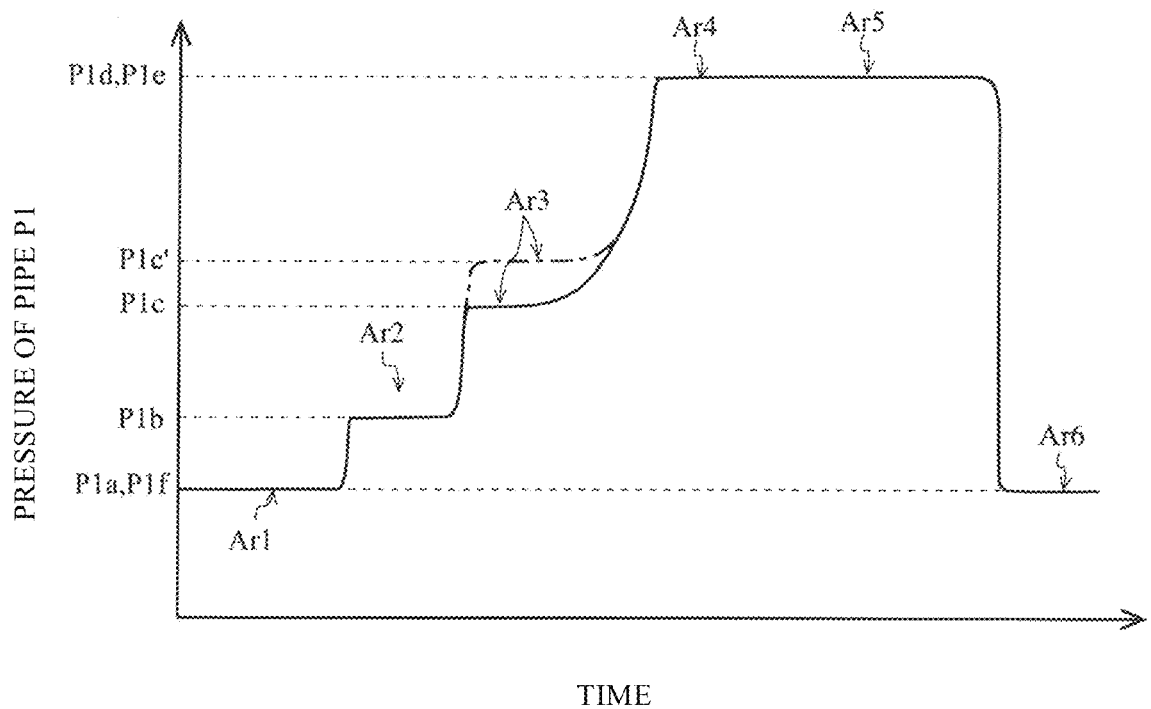
FIG. 25 A diagram showing changes in the pressure of a pipe when the soldering device performs the soldering once.

FIG. 24 is a diagram showing the iron tip in the iron tip separated state. In the soldering device C, when the soldering of the land Ld and the terminal Nd of the electronic component Ep is completed, the iron tip 5 is separated from the land Ld. The lower end of the solder hole 51 in the Z direction is open to the atmosphere. In other words, (f) the iron tip separated state is returned to the same state as (a) the reference state. The pressure P1f of the pipe 70c in (f) the iron tip separated state is equal to the pressure P1a.

As described above, the pressures P1a to P1d (P1e) of the pipe 70c are different values depending on the individual states. The control portion Cont previously stores values serving as the references of the pressures P1a to P1d (P1e) as z database, compares them with the data of the pressure P1 of the pipe 70c acquired from the second measurement portion 75 and thereby can determine the current state of the iron tip.

Since the pressure P1d of the pipe 70c in (d) the solder piece molten state is substantially equal to the pressure P1e of the pipe 70 in (e) the solder piece flow-out state, it may be difficult to determine the state from the pressure of the pipe 70c. Hence, the control portion Cont may detect the state of the iron tip with consideration given to a time change in the pressure P1 of the pipe 70c.

In the soldering device C, the state of the iron tip is sequentially changed from (a) the reference state, to (b) the iron tip contact state, to (c) the solder piece input state, to (d) the solder piece molten state, to (e) the solder piece flow-out state and then to (f) the iron tip separated state. Then, the pressures P1 of the pipe 70c in the individual states are as indicated in a graph shown in FIG. 25. FIG. 25 shows changes in the pressure of the pipe 70 when the soldering device C performs the soldering once. In FIG. 25, the vertical axis represents the pressure P1, and the horizontal axis represents time.

As shown in FIG. 25, in a first region Ar1, the iron tip is in (a) the reference state, and in the first region Ar1, the pressure of the pipe is the pressure P1a. In a second region Ar2, the iron tip is in (b) the iron tip contact state, and when the iron tip is changed from (a) the reference state to (b) the iron tip contact state, the pressure P1a is rapidly changed to the pressure P1b by contact of the iron tip 5 with the land Ld. In other words, the change from the first region Ar1 to the second region Ar2 is abrupt.

In a third region Ar3, the iron tip indicates (c) the solder piece input state, part of the flow path of the solder hole 51 is blocked by the input of the solder piece Wh into the solder hole 51 and thus the flow path resistance is rapidly increased, with the result that the pressure P1b is rapidly changed to the pressure P1c. In other words, in FIG. 25, the change from the second region Ar2 to the third region Ar3 is abrupt.

In a fourth region Ar4, the iron tip indicates (d) the solder piece molten state, the solder hole 51 is blocked by the melting of the solder piece Wh and thus the flow path resistance thereof is increased. In the melting of the solder piece, the flux is first molten relatively slowly, and thereafter the solder is molten rapidly. In the change from the pressure P1c to the pressure P1d, the pressure 1c is increased slowly at first, and is rapidly increased after a constant change. In other words, in FIG. 25, the third region Ar3 is changed to the fourth region Ar4 slowly at first, and is thereafter increased rapidly.

As described above, the pressure P1d in (dl the solder piece molten state is equal to or substantially equal to the pressure P1e in (e) the solder piece flow-out state, and a change from the pressure P1d is small for a given time.

As described above, the pressure P1 of the pipe 70c is characterized not only in the value thereof but also in the ratio of change in the pressure P1 (rapid change or slow change) when the state is changed.

The control portion Cont stores a table as shown in FIG. 25 which indicates a time change in the pressure of the pipe when the soldering is performed once, chronologically arranges pieces of data of the pressure of the pipe 70c from the second measurement portion 75, compares behaviors and values and thereby may determine the state of the iron tip. The determination method as described above is used, and thus it is possible to more accurately determine the state of the iron tip.

In the present embodiment, when the solder hole 51 is blocked, the nitrogen gas left in the solder hole 51 is discharged through the release hole 53. However, there is no limitation to this configuration. For example, in the pipe 70c of the gas supply portion 7c, a release hole for releasing the internal gas to the outside may be provided. Furthermore, the pipe 70c may be branched, and the branched pipe may be used as a pipe for releasing the nitrogen gas.

The control portion Cont previously stores values serving as the references of the pressures P1a to P1d (P1e) as a database, compares them with the data of the pressure P1 acquired from the second measurement portion 75 and thereby can determine the state of dirt of the solder hole 51. The control portion Cont also stores, as a database, a chronological change serving as the reference of the pressure of the nitrogen gas within the pipe 70 in a series of soldering steps such as the non-contact state of the iron tip 5 and the board Bd, the contact between the iron tip 5 and the board Bd, the input of the solder piece Wh into the iron tip 5, the melting by heating, the flowing out of the molten solder from the iron tip 5 and the separation of the iron tip 5 from the board Bd, compares it with a chronological change in the pressure P1 of the pipe 70 acquired from the second measurement portion 75 and thereby can determine the state of dirt of the solder hole 51.

Figure 26:
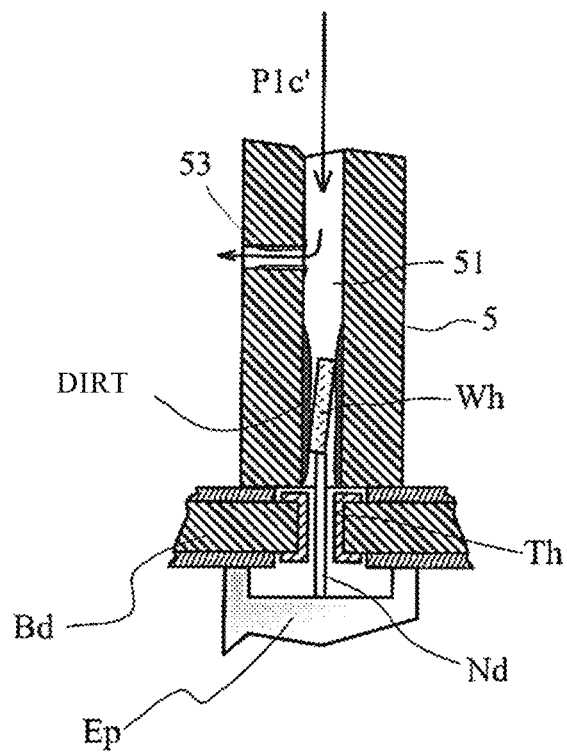
FIG. 26 A diagram of a state where a solder piece is input into a solder hole in a dirty state.

A description will be given using, as an example, a case where in the third region Ar3, that is, the stage in which the solder piece h is input into the solder hole 51, the state of dirt of the solder hole 51 is determined. FIG. 26 shows a diagram of a state where the solder piece Wh is input into the solder hole 51. In the initial state as shown in FIG. 21 where the solder hole 51 is not dirty, the pressure of the pipe 70 is P1c. On the other hand, in a state as shown in FIG. 26 where an adherence substance such as dross is adhered to the inner circumferential wall of the solder hole 51, a flow path area within the solder hole 51 through which the nitrogen gas is passed is decreased, and the flow path area is further decreased by the input of the solder piece Wh, with the result that the pressure of the pipe 70 is increased to a pressure P1c' which is higher than the pressure P1c in the initial state (an alternate long and short dash line in FIG. 25). The control portion Cont previously stores the pressure P1c in the initial state, compares the measured pressure of the pipe 70 with the pressure P1c and thereby can determine the state of dirt of the solder hole.

In the present embodiment, the control portion Cont can also perform the same operations as in the "first variation" and the "second variation" of the first embodiment by replacing the branch flow rate with the pressure of the pipe. As described in the "third variation" of the first embodiment, the iron tip including the solder piece stop portion is used, and thus the control portion Cont can perform the same operation as in the "third variation" of the first embodiment.

Fourth Embodiment

Figure 27:
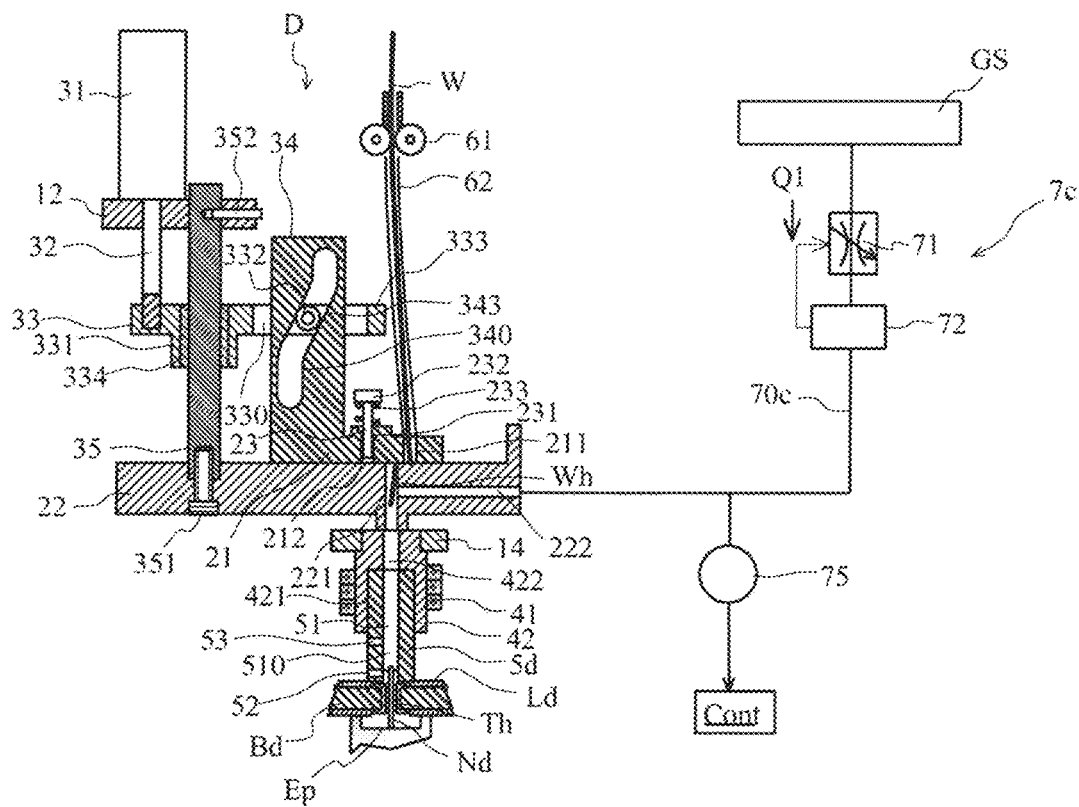
FIG. 27 A diagram showing another example of the soldering device according to the present invention.

Another example of the soldering device according to the present embodiment will be described with reference to drawings. FIG. 27 is a diagram showing another example of the soldering device according to the present invention. The soldering device D shown in FIG. 27 has the same configuration as the soldering device C of the third embodiment except that an iron tip 5d includes a gas release portion 52 which penetrates the solder hole 51 and the outer circumferential surface. The gas release portion 52 has the same configuration as the iron tip 5b of the second embodiment. Hence, in the iron tip 5d, substantially same parts as in the iron tip 5 and the iron tip 5c are identified with the same reference signs, and the detailed description of the same parts will be omitted.

Figure 28:
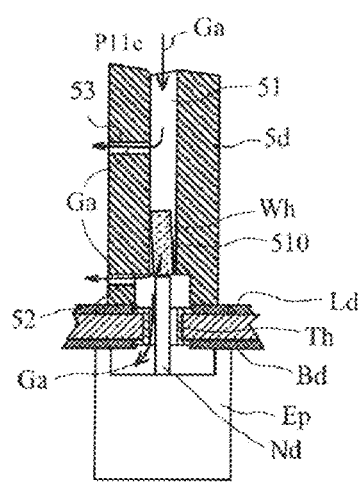
FIG. 28 A diagram showing the iron tip in the iron tip contact state and the flow of nitrogen gas.
Figure 29:
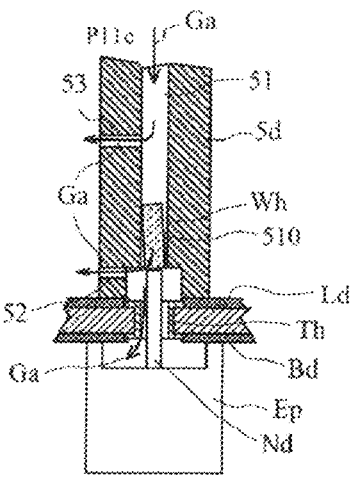
FIG. 29 A diagram showing the iron tip in the solder piece input state and the flow of the nitrogen gas.
Figure 30:
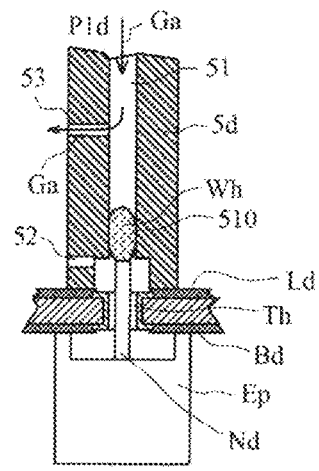
FIG. 30 A diagram showing the iron tip in the solder piece molten state and the flow of the nitrogen gas.
Figure 31:
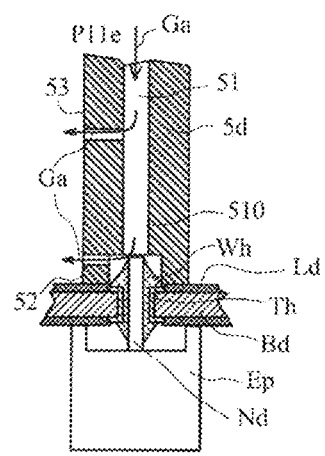
FIG. 31 A diagram showing the iron tip in the solder piece flow-out state and the flow of the nitrogen gas.

A determination of the state of the iron tip by the control portion Cont when the soldering device D as described above is used will be described with reference to drawings. FIG. 28 is a diagram showing the iron tip in the iron tip contact state and the flow of the nitrogen gas. FIG. 29 is a diagram showing the iron tip in the solder piece input state and the flow of the nitrogen gas, FIG. 30 is a diagram showing the iron tip in the solder piece molten state and the flow of the nitrogen gas, FIG. 31 is a diagram showing the iron tip in the solder piece flow-out state and the flow of the nitrogen gas.

The states which can be taken in the soldering device D when the soldering is performed once are, as in the first embodiment, (a) the reference state, (b) the iron tip contact state, (c) the solder piece input state, (d) the solder piece molten state, (e) the solder piece flow-out state and (f) the iron tip separated state. Then, (a) the reference state and (f) the iron tip separated state are substantially the same as in the soldering device C of the third embodiment. In the iron tip 5d, the gas release portion 52 is provided, and in a state where the gas can flow out from the gas release portion 52d, that is, in each of (b) the iron tip contact state, (c) the solder piece input state and (e) the solder piece flow-out state, the pressure of the nitrogen gas flowing through the pipe 70c is lower than that in the third embodiment. Hence, a description will be given with the assumption that the pressure of the pipe 70c is a pressure P11. For example, in (b) the reference state, the pressure of the pipe 70c is assumed to be a pressure P11b. In the other states, likewise, the pressures of the pipe 70c are assumed to be pressures P11c and P11e.

As shown in FIG. 27, the gas release portion 52 makes a part between the melting region 510 of the solder hole 51 and the lower end of the iron tip 5d in the Z direction communicate with the outer circumferential surface.

In (b) the iron tip contact state shown in FIG. 28, the nitrogen gas within the solder hole 51 flows from the through hole Th to the outside and also flows from the release hole 53 and the gas release portion 52 to the outside. Hence, since the nitrogen gas flows out from the gas release portion 52, the pressure P11 of the pipe 70c is lower than that in a configuration (third embodiment) in which the gas release portion 52 is not present. In other words, the pipe 70c has the pressure P11b (<P11b). In (c) the solder piece input state shown in FIG. 29, likewise, the flow path resistance is increased by the solder piece Wh. On the other hand, since the nitrogen gas flows out from the gas release portion 52, the pressure P11 of the pipe 70c is lower than that in the configuration (third embodiment) in which the gas release portion 52 is not present. The pressure P11c of the pipe 70 in (c) the solder piece input state is higher than the pressure P11b of the pipe 70c in (b) the iron tip contact state.

In (d) the solder piece molten state shown in FIG. 30, the melting region 510 of the solder hole 51 is blocked by the molten solder piece Wh. Hence, the gas release portion 52 is on the downstream side with respect to the melting region 510 in the direction of flow of the nitrogen gas, and thus in (d) the solder piece molten state, the nitrogen gas is prevented from flowing out from the gas release portion 52. Therefore, the pressure P1d of the pipe 70c in (d) the solder piece molten state is substantially equal to that in the third embodiment.

In (e) the solder piece flow-out state shown in FIG. 31, the lower end of the solder hole 51 in the Z direction is blocked by the land Ld. The molten solder piece Wh blocks the through hole Th of the land 14, and thus the nitrogen gas is prevented from flowing out from the through hole Th. On the other hand, the solder piece Wh flows from the solder hole 51 to the outside, and thus the solder piece Wh is not present in the solder hole 51. Hence, the nitrogen gas in the solder hole 51 flows from the gas release portion 52 to the outside. In other words, since the nitrogen gas flows out from the gas release portion 52, the pressure P11 of the pipe 70 is lower than that in the configuration (first embodiment) in which the gas release portion 52 is not present. Specifically, the pressure of the pipe 70c in (e) the solder piece flow-out state is the pressure P11e (<P1e).

In (e) the solder piece flow-out state, the nitrogen gas in the solder hole 51 flows out from the gas release portion 52, and thus the pressure P11e is lower than the pressure P1d (d) the solder piece molten state.

As described above, the gas release portion 52 is provided in the iron tip 5b, and thus the pressure P1d of the pipe 70 in (d) the solder piece molten state and the pressure P11e of the pipe 70c in (e) the solder piece flow-out state can be made different values.

Figure 32:
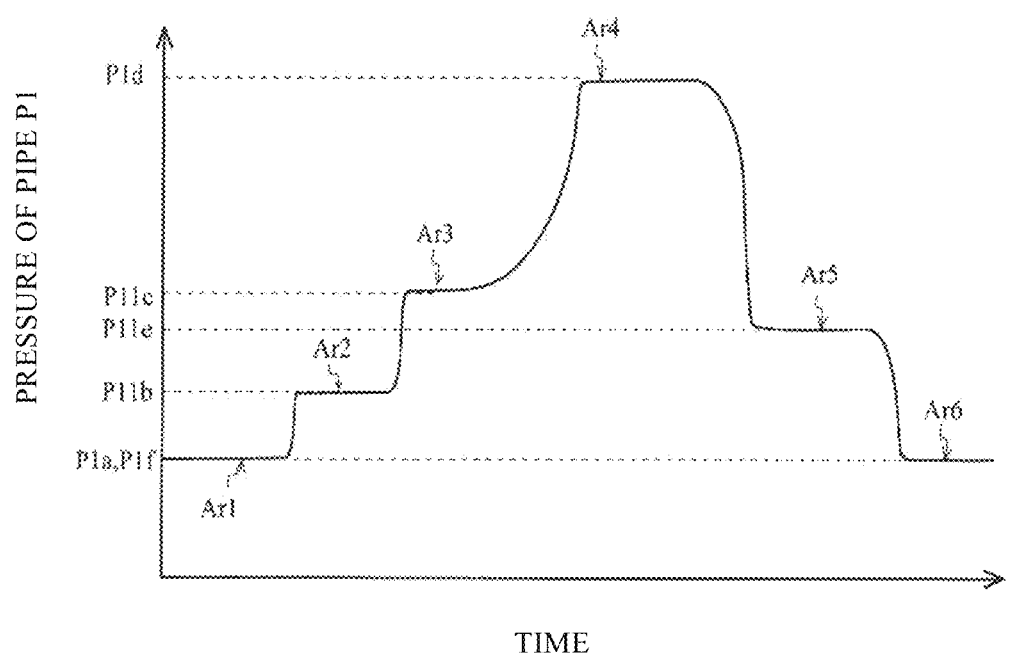
FIG. 32 A diagram showing changes in the pressure of the pipe when the soldering device performs the soldering once.

The pressures P1 (P11) in the individual states are as shown in a graph shown in FIG. 32. FIG. 32 shows changes in the pressure of the pipe when the soldering device performs the soldering once. In FIG. 32, the vertical axis represents the pressure P1, and the horizontal axis represents time. In the following discussion, only parts which show behaviors different from those in FIG. 25 will be described.

As shown in FIG. 32, the iron tip 5b which includes the gas release portion 52 is used, and thus after the fourth region Ar4 (the pressure P1d of the pipe 70c) indicating (d) the solder piece molten state, the fifth region Ar5 indicating (e) the solder piece flow-out state of the pressure P11e of the distribution pipe. 70c appears.

As described above, the gas release portion 52 is provided in the iron tip 5b, and thus the pressure P1d of the pipe 70c in (d) the solder piece molten state and the pressure P11e of the pipe 70c in (e) the solder piece flow-out state can be made different values, in this way, the control portion Cont can more accurately detect (e) the solder piece flow-out state, that is, the completion of the soldering of the terminal Nd of the electronic component Ep and the land Ld.

In the present embodiment, the control portion Cont also stores the pressures of the pipe in the individual states as a database, compares them with the data of the pressure of the pipe 70c from the second measurement portion 75 and thereby may determine the state of the iron tip. The control portion Cont stores a table as shown in FIG. 32 showing a time change in the pressure of the pipe 70c, chronologically arranges pieces of data of the pressure from the second measurement portion 75, compares behaviors and values and thereby may determine the state of the iron tip.

The metering values of the relationship (FIG. 10 or FIG. 17) between the time and the flow rate values and the relationship (FIG. 25 or FIG. 32) between the time and the pressures are stored, a database for quality control is produced and thus a correlation between a chronological change, ambient temperatures and the like can be calculated by statistical processing.

Furthermore, when a plurality of soldering parts are present, since the change values of the fluid in the individual states may differ depending on the soldering parts, the database described above is produced for each of the soldering parts, with the result that it is also possible to make the determination by using a different threshold value for each of the soldering parts.

Fifth Embodiment

Figure 33:
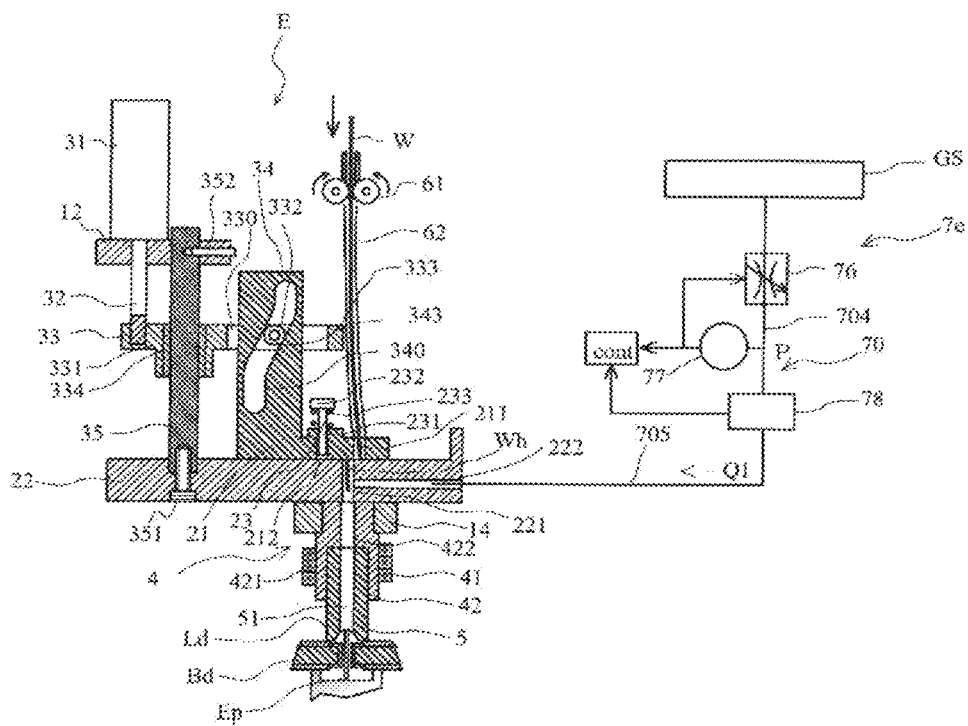
FIG. 33 A cross-sectional view of a soldering device of a fifth embodiment.

Although in the soldering devices of the first to fourth embodiments described above, the total flow rate of the gas flowing within the gas supply portion is made constant, physical quantities such as the flow rate, the pressure and the like of the gas flowing within the gas supply portion are measured and thus the state of the iron tip is determined, in the soldering devices of the present embodiment and the subsequent embodiments, the supply pressure of the gas flowing within the gas supply portion is made constant, the physical quantities of the gas flowing within the gas supply portion are measured and thus the state of the iron tip is determined. FIG. 33 is a diagram showing an iron tip in another example of the soldering device according to the present invention and a gas supply portion.

The gas supply portion 7e supplies, to the soldering device E, the gas supplied from the gas supply source CS which is provided outside the soldering device E. As the gas, the inert gas described previously is used, and thus it is possible to prevent the oxidation of the solder. As shown in FIG. 33, the gas supply portion 7e includes the pipe 70, a first adjustment portion 76, a first metering portion 77 serving as a metering portion which measures the flow rate and the pressure of the gas so as to output an electrical signal and a second metering portion 78. Although in FIG. 33, the pipe 70 is shown as a diagram for convenience, the pipe 70 is actually a tubular member (for example, a copper pipe or a resin pipe) from which nitrogen gas serving as the gas is prevented from leaking.

The pipe 70 is connected to the gas supply source GS so as to make the nitrogen gas from the gas supply source GS flow into the gas inflow hole 222. The pipe 70 includes a main pipe 704 and art inflow pipe 705. The main pipe 704 is a pipe into which the nitrogen gas flows from the gas supply source GS, and the inflow pipe 705 makes the main pipe 704 communicate with the gas inflow hole 222. Specifically, the nitrogen gas flowing through the main pipe 704 is passed through the inflow pipe 705 so as to flow into the gas inflow hole 222.

Although in the soldering device B, the gas inflow hole 222 communicates with the lower blade hole 221, the solder supply hole 422 and the solder hole 51, and the solder hole 51 is open to the outside, when the soldering device E is operated, the solder hole 51 may be blocked by the molten solder.

The first adjustment portion 76 is provided in the main pipe 704. The first adjustment portion 76 includes a pressure control valve so as to adjust the pressure of the nitrogen gas flowing through the main pipe 704. The first adjustment portion 76 adjusts the pressure of the nitrogen gas supplied from the gas supply source GS to the gas supply portion 7e. The second metering portion 78 is a flowmeter which meteres the flow rate of the nitrogen gas flowing through the main pipe 704.

The first metering portion 77 is arranged on the downstream side of the first adjustment portion 76 in the main pipe 704 so as to meter the pressure of the nitrogen gas flowing through the main pipe 704. In other words, the first metering portion 77 meteres the pressure of the nitrogen gas discharged from the first adjustment portion 76. Then, the first metering portion 77 transmits a control signal for controlling the first adjustment portion 76 such that the metered pressure of the nitrogen gas is a predetermined pressure. In other words, the gas supply portion 7e uses the first adjustment portion 76 and the first metering portion 77 so as to perform feedback control, and performs control such that the pressure of the nitrogen gas supplied from the gas supply source GS is constant. Based on the result of the metering of the first metering portion 77, the operator may manually operate the first adjustment portion 76 so as to adjust the pressure of the nitrogen gas. When the measured pressure or flow rate differs from a predetermined reference value or falls outside a preset range due to any abnormality, a state determination portion Cont may provide a warning indicating that an abnormality occurs and (or) stop the operation of the soldering device. The state determination portion Cont may control the soldering device E based on the determined state of the iron tip. Examples of the control of the soldering device E include the approach and separation of the soldering device E with respect to the board Ed, the cutting of the wire solder W and the heating of the iron tin 5.

A method of determining the state of the iron tip at the constant pressure P based on the flow rate in the main pipe. 704 will then be described, in the gas supply portion 7e, all the nitrogen gas flowing into the gas inflow hole 222 is assumed to flow into the solder hole 51 of the iron tip 5. For example, the gas inflow hole 222 communicates with the lower blade hole 221, and the lower blade hole 221 penetrates the cutter lower blade 22 vertically in the Z direction. In a state where the nitrogen gas is supplied, the lower blade hole 221 is assumed to be hermetically sealed such that the nitrogen gas is prevented from being removed from the upper end thereof in the Z direction. However, even when the nitrogen gas flowing into the gas inflow hole 222 flows separately to a part other than the solder hole 51 of the iron tip 5, it is possible to perform the same action.

The pressure of the nitrogen gas flowing through the main pipe 704 is adjusted by the adjustment of the gas from the gas supply source GS with the first adjustment portion 76. The flow rate of the nitrogen gas flowing through the main pipe 704 is also the flow rate of the nitrogen gas supplied to the gas supply portion 7e. In other words, the flow rate of the nitrogen gas flowing to the gas supply portion 7e is Q1.

The pressure control valve provided in the first adjustment portion 76 continuously passes the nitrogen gas at a set pressure regardless of the pressure within the pipe. In other words, the gas supply portion 7e performs pressure control such that the pressure P is constant.

In the soldering device E, for example, when the solder piece Wh is supplied into the solder hole 51, part of a cross section perpendicular to the axis of the solder hole 51 is occupied by the solder piece Wh. Hence, the flow path area of the part of the solder hole 51 through which the nitrogen gas flows is decreased, and thus it is difficult for the nitrogen gas to flow therethrough. In other words, the flow path resistance is increased. As the flow path resistance of the solder hole 51 is increased, the flow rate Q1 is reduced. In other words, the state of the iron tip is changed, and thus the flow rate Q1 is varied. The control portion Cont determines, based on the flow rate Q1 or the change in the flow rate Q1, the state of the iron tip. For example, the state determination portion Cont previously stores information in which the change in the flow rate Q1 is associated with the cause of the change. The state determination portion Cont determines, based on the change in the flow rate Q1 which is calculated, the cause thereof, that is, the condition of the iron tip.

Since the control is performed such that the pressure P is constant, the flow rate Q1 is changed as fluid resistance on the downstream side is increased or decreased. The control portion Cont determines, based on the flow rate Q1, the state of the iron tip. For example, when the fluid resistance within the solder hole 51 is increased, since the pressure P1 of the main pipe 704 is substantially constant, a flow rate Q2 is decreased.

The flow rate Q1 in each state of the iron tip will be described below with reference to drawings. FIGS. 34 to 39 are diagrams showing the operation of the soldering device or the state of the iron tip. FIG. 40 is a diagram showing changes in the flow rate Q1 when the soldering operation is performed once in the soldering device. In the description of the present embodiment, it is assumed that the board Bd is a through-hole board and that the terminal Nd inserted into the through hole Th is soldered.

In the description of the present embodiment, as the state of the iron tip, the six states of (a) the reference state, (b) the iron tip contact state, (c) the solder piece input state, (d) the solder piece molten state, (e) the solder piece flow-out state and (f) the iron tip separated state are mentioned. In the soldering device E, when the soldering is performed once, the individual states of (a) to (f) are sequentially changed.

(a) Reference State

Figure 34:
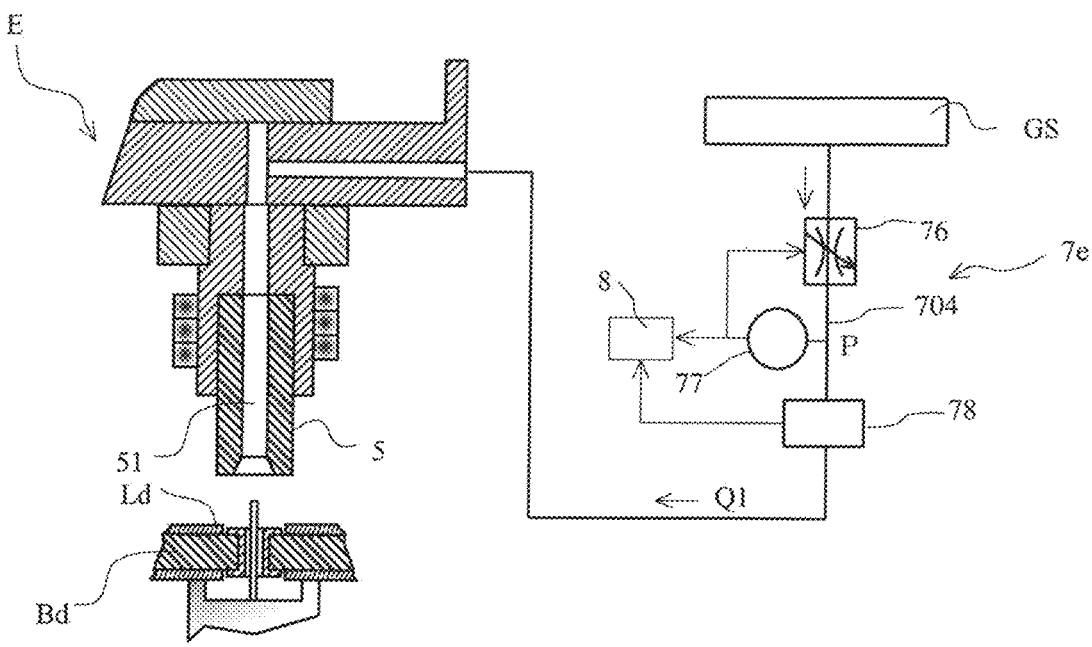
FIG. 34 A diagram showing the surrounding of an iron tip in the reference state of the fifth embodiment in a method of determining the state of the soldering iron tip according to the present invention and a gas supply portion.

FIG. 34 is a diagram showing the surrounding of the iron tip in the soldering device in the reference state and the gas supply portion. As shown in FIG. 34, in the soldering device A, in a stage preceding the soldering (for example, where the iron tip 5 is preheated or the board Bd on which the soldering is performed is changed), the iron tip 5 is separated from the board Bd. In the present embodiment, the state where the iron tip 5 is separated from the board Bd is assumed to be the reference state. In other words, an opening in the lower end of the solder hole 51 in the Z direction is open to the atmosphere. In the present embodiment, when the soldering device E is in the reference state, the heater unit 4 is driven so as to heat the iron tip 5. When in the reference state, the supply of the nitrogen gas from the gas supply source GS is started, the nitrogen gas is supplied to the gas supply portion 7e. As described previously, in the gas supply portion 7e, the nitrogen gas is adjusted in the first adjustment portion 76 so as to have the pressure P.

As shown in FIG. 34, in the reference state of the soldering device F, the lower end portion of the solder hole 51 in the iron tip 5 is open to the outside. The flow path resistance of the solder hole 51 is low. On the other hand, hence, the flow rate Q1 of the nitrogen gas flowing through the main pipe 704 high. The control portion Cont acquires the flow rate from the second metering portion 78, and in the reference state, a flow rate Q1a flows.

(b) Iron Tip Contact State

Figure 35:
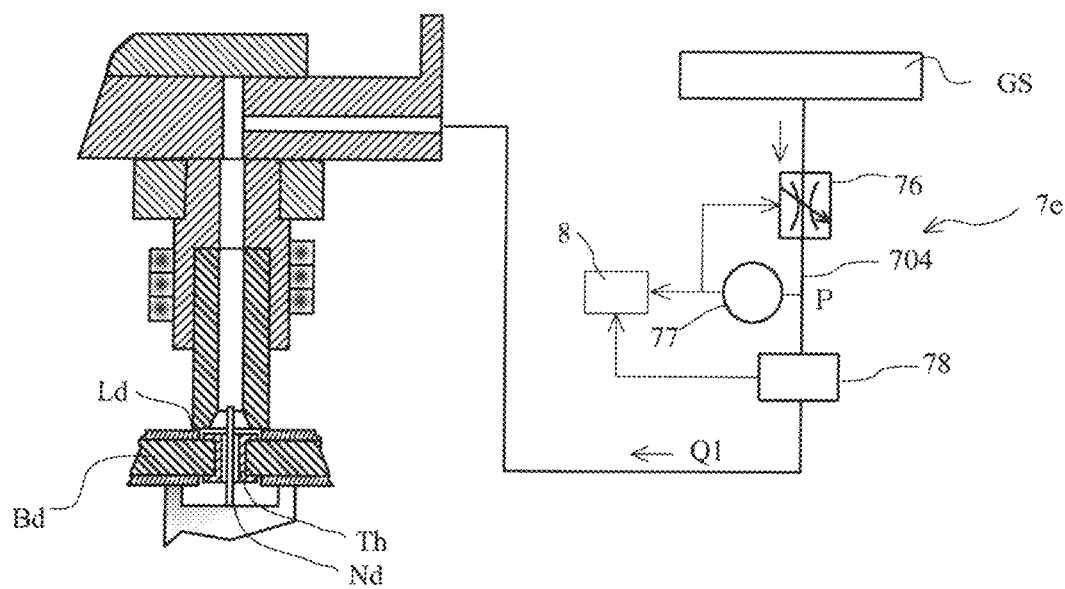
FIG. 35 A diagram showing the surrounding of the iron tip in the iron tip contact state and the gas supply portion.

FIG. 35 is a diagram showing the surrounding of the iron tip in the soldering device in the iron tip contact state and the gas supply portion. In the soldering device E, since the soldering is performed after the reference state, the iron tip 5 is brought into contact with the land Ld of the board Bd. In the soldering device E, the iron tip 5 is brought into contact with the land and thus the temperature of the land Ld is raised to a temperature suitable for the soldering (preheating).

Then, the iron tip 5 is brought into contact with the land and thus the solder hole 51 of the iron tip 5 is blocked by the land Ld. Since the terminal Nd which penetrates the through hole Th is soldered to the board Bd, as shown in FIG. 35, an upper end portion of the terminal Nd of the electronic component in the Z direction is inserted into the solder hole 51. The nitrogen gas passing through the solder hole 51 flows to the outside from the through hole Th into which the terminal Nd is inserted.

The part of the through hole Th where the terminal Nd is inserted through which the nitrogen gas is removed is the flow path of the nitrogen gas, and the flow path area thereof is smaller than a cross-sectional area which is cut with a plane perpendicular to the axis of the solder hole 51. In the iron tip contact state, on the tip end side of the solder hole 51, flow path resistance is formed, and in other words, the flow path resistance of the main pipe 704 is higher than that in the reference state. In this way, a supply flow rate Q1b is lower than that in the reference state.

(c) Solder Piece Input State

Figure 36:
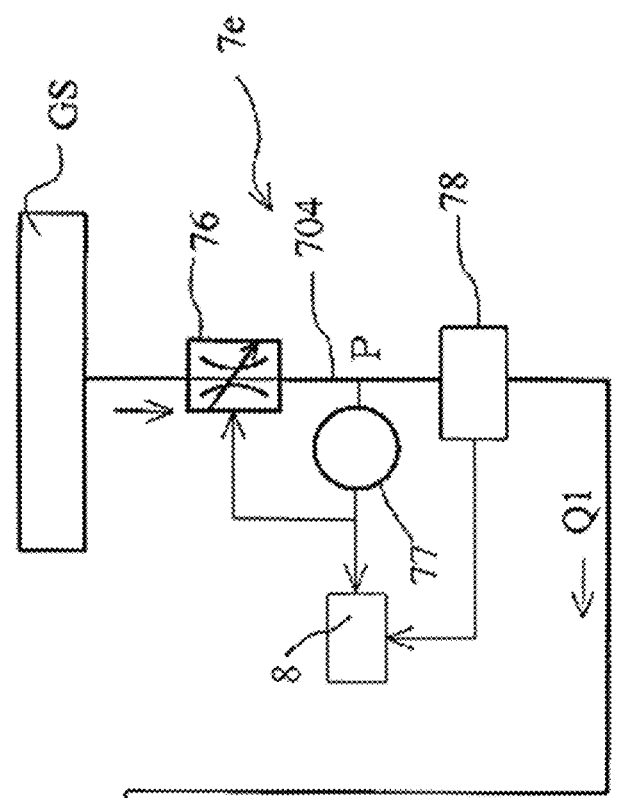
FIG. 36 A diagram showing the surrounding of the iron tip in the solder piece input state and the gas supply portion.
Figure 36:
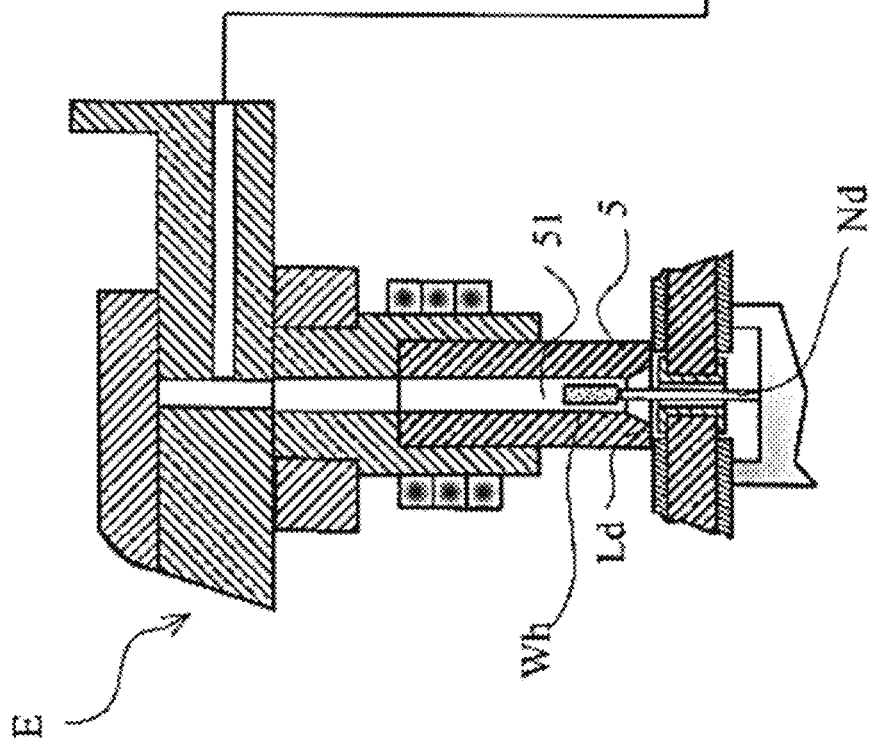

FIG. 36 is a diagram showing the surrounding of the iron tip in the soldering device E in the solder piece input state and the gas supply portion. In the soldering device E, the iron tip 5 is brought into contact with the land Ld, the preheating is performed, the temperature of the land Ld is raised to an appropriate temperature and thereafter the solder piece Wh is input into the solder hole 51. The control of the preheating of the land Ld may be performed by directly detecting the temperature of the land Ld with a temperature sensor and using the temperature or may be performed by the contact time of the iron tip 5 and the land Ld.

Then, with timing at which the preheating is completed, the solder piece Wh is input into the solder hole 51. The solder piece Wh is formed by cutting the wire solder W with the cutter upper blade 21 and the cutter lower blade 22 (see FIG. 33). The solder piece Wh is pushed by its weight or the pusher pin 23 so as to be dropped, is passed through the lower blade hole 221 and the solder supply hole 422 and is input into the solder hole 51. The solder piece Wh is brought into contact with the terminal Nd which is inserted in the solder hole 51 so as to be stopped within the solder hole 51. As described above, the solder piece Wh is stopped partway through the solder hole 51, and thus the flow path area of the solder hole 51 through which the nitrogen gas is passed is decreased. In this way, in the solder piece input state, as compared with the iron tip contact state, the flow path resistance of the main pipe 704 is increased. A flow rate Q1c in the solder piece input state is lower than that in the iron tip contact state.

Since the value of the flow rate Q1c differs depending on the diameter, the length or the shape of the solder piece Wh, a criterion for the flow rate Q1c may be changed according to the solder piece Wh.

(d) Solder Piece Molten State

Figure 37:
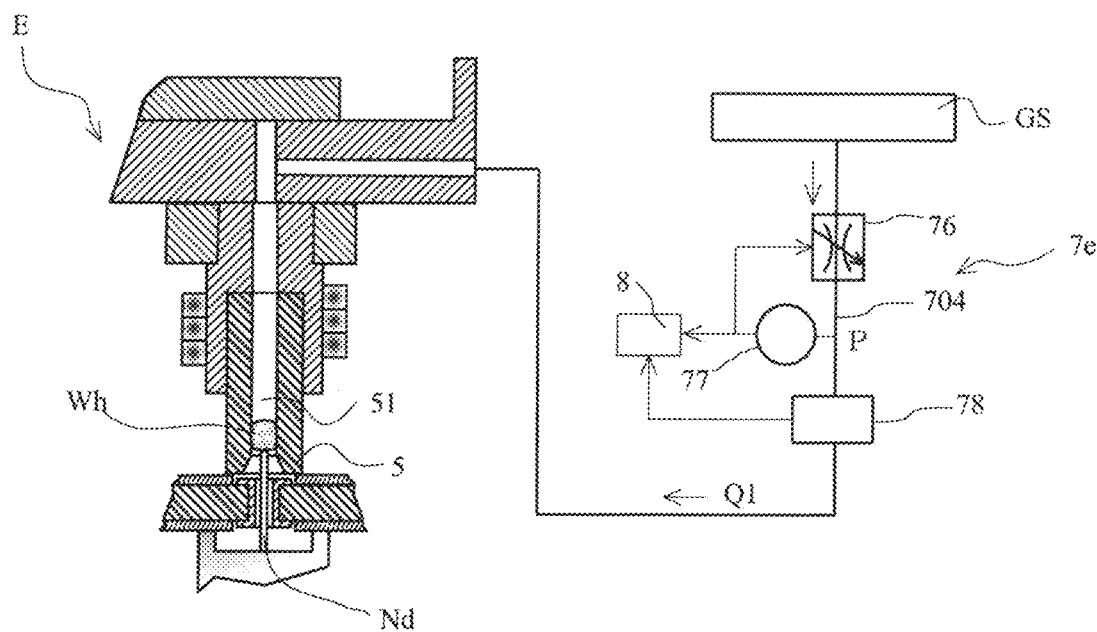
FIG. 37 A diagram showing the surrounding of the iron tip in the solder piece molten state and the gas supply portion.

FIG. 37 is a diagram showing the surrounding of the iron tip in the soldering device in the solder piece molten state and the gas supply portion. In the soldering device E, the iron tip 5 is heated with the heater unit 4, and the solder piece Wh input into the solder hole 51 is heated with the iron tip 5 so as to be molten. The molten solder piece Wh is a liquid which has a high viscosity. Then, the solder hole 51 is blocked by the molten solder piece. In this way, the nitrogen gas is prevented from leaking from the solder hole 51 or is unlikely to leak therefrom. In other words, the solder piece Wh is molten, and thus the flow rate of the nitrogen gas in the main pipe 704, that is, a supply flow rate told is low as compared with the solder piece input state.

(e) Solder Piece Flow-Out State

Figure 38:
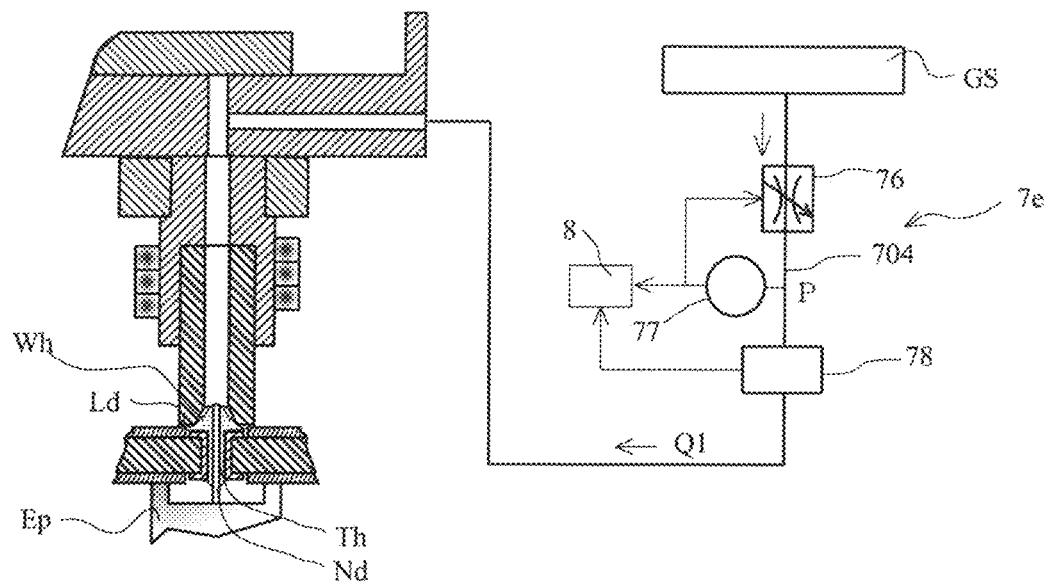
FIG. 38 A diagram showing the surrounding of the iron tip in the solder piece flow-out state and the gas supply portion.

FIG. 38 is a diagram showing the surrounding of the iron tip in the soldering device in the solder piece flow-out state and the gas supply portion. When the molten solder piece Wh flows out, the molten solder piece Wh blocks the through hole Th. The iron tip 5 is in contact with the land LA. In this way, the nitrogen gas flowing into the solder hole 51 is prevented from leaking from the solder hole 51 to the outside or is unlikely to leak therefrom. In other words, in the solder piece flow-out state, the flow rate of the nitrogen gas in the main pipe 704, that is, a flow rate Q1e is about as low as that in the solder piece molten state. Since the iron tip 5 is constantly heated with the heater unit 4, all the molten solder piece Wh flows to the outside of the iron tip 5, that is, the land Ld and the terminal Nd of the electronic component Ep.

(f) Iron Tip Separated State

Figure 39:
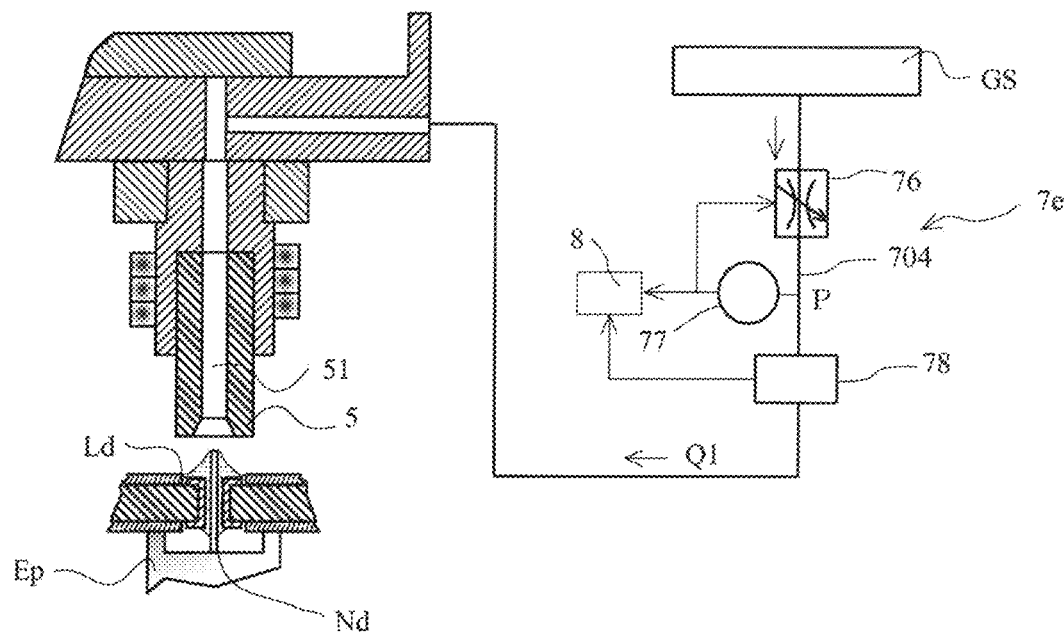
FIG. 39 A diagram showing the surrounding of the iron tip in the iron tip separated state and the gas supply portion.
Figure 40:
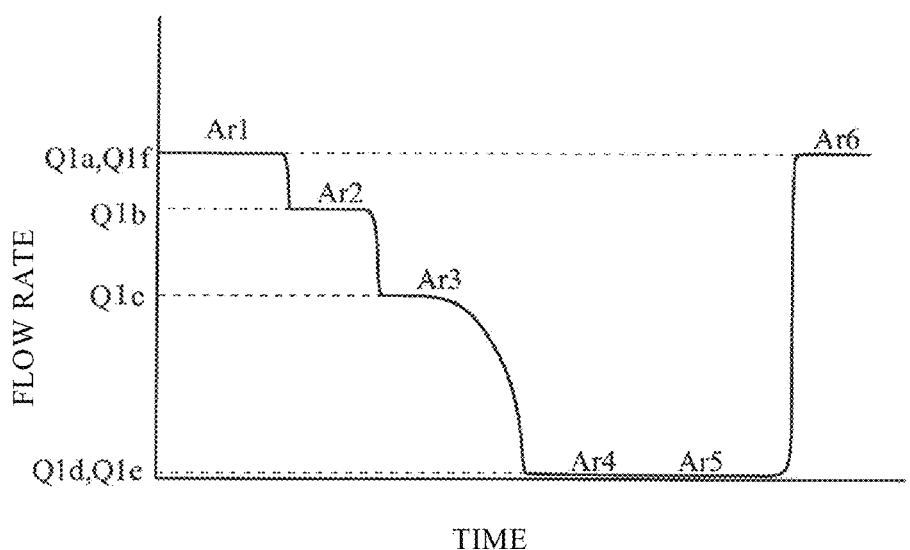
FIG. 40 A diagram showing changes in the flow rate of the gas supply portion when the soldering device performs the soldering once.

FIG. 39 is a diagram showing the surrounding of the iron tip in the soldering device in the iron tip separated state and the gas supply portion. In the soldering device F, when the soldering of the land Ld and the terminal Nd of the electronic component Ep is completed, the iron tip 5 is separated from the land Ld. In the solder piece flow-out state, the entire amount of molten solder piece Wh or a substantially entire amount thereof flows to the outside of the solder hole 51. Hence, the solder hole 51 is returned to the state before the soldering, that is, the same state as the reference state. If it is assumed that when the iron tip is separated from the land Ld, a flow rate Q1f flows through the main pipe 704, the flow rate Q1f is equal to the flow rate Q1a or substantially equal thereto.

As described above, the flow rates Q1a to Q1d (Q1e) are different values depending on the individual states. The control portion Cont previously stores values serving as the references of the flow rates Q1a to Q1d (Q1e) as a database, compares them with the data of the flow rate Q1 acquired from the second measurement portion 78 and thereby can determine the current state of the iron tip.

Since the flow rate Q1d in (d) the solder piece molten state is substantially equal to the flow rate Q1e in (e) the solder piece flow-out state, it may be difficult to determine the state from the flow rate Q1. Hence, the control portion Cont may detect the state of the iron tip with consideration given to a time change in the flow rate Q1. For example, when a predetermined time elapses after the second metering portion 78 detects the flow rate Q1d, the control portion Cont may determine that the iron tip 5 is changed from (d) the solder piece molten state to (e) the solder piece flow-out state.

In the soldering device E, the state of the iron tip is sequentially changed from (a) the reference state, to (b) the iron tip contact state, to (c) the solder piece input state, to (d) the solder piece molten state, to (e) the solder piece flow-out state and then to (f) the iron tip separated state. Then, the flow rates Q1 in the individual states are as indicated in a graph shown in FIG. 40. FIG. 40 shows changes in the flow rate Q1 when the soldering device F performs the soldering once, the vertical axis represents the flow rate Q1 and the horizontal axis represents time. The flow rate values Q1a, Q1b, Q1c, Q1d, Q1e and Q1f shown in FIG. 40 are flow rate values in the individual states described above.

As shown in FIG. 40, in a first region Ar1, the iron tip is in (a) the reference state. In the first region Ar1, the flow rate Q1a is provided, in FIG. 40, in a second region Ar2, the iron tip is in (b) the iron tip contact state. When the iron tip is changed from (a) the reference state to (b) the iron tip contact state, the flow rate Q1a is changed to the flow rate Q1b. Since the flow rate Q1 is changed by contact of the iron tip 5 with the land Ld, the flow rate Q1a is rapidly changed to the flow rate Q1b. In other words, in FIG. 40, the change from the first region Ar1 to the second region Ar2 is abrupt.

In FIG. 40, in a third region Ar3, the iron tip is in (c) the solder piece input state. When the solder piece Wh is input into the solder hole 51, the flow rate Q1b is changed to the flow rate Q1c. Since the flow path area is rapidly changed by the input of the solder piece Wh into the solder hole 51, the flow rate Q1b is rapidly changed to the flow rate Q1c. In other words, in FIG. 40, the change from the second region Ar2 to the third region Ar3 is abrupt.

In FIG. 40, in a fourth region Ar4, the iron tip is in (d) the solder piece molten state. When the solder piece Wh is molten in the solder hole 51, the flow rate Q1c is changed to the flow rate Q1d. The flow path area is changed by the melting of the solder piece Wh in the solder hole 51. In the melting of the solder piece, the flux is first molten, and thereafter the solder is molten. The flux is slowly molten, and the solder is rapidly molten. In the change from the flow rate Q1c to the flow rate Q1d, the flow rate Q1c is changed slowly at first, and is rapidly changed after a constant change. In other words, in FIG. 40, the third region Ar3 is changed slowly at first, and is thereafter changed rapidly.

As described previously, the flow rate Q1d in (d) the solder piece molten state is equal to the flow rate Q1e in (e) the solder piece flow-out state or is substantially equal thereto. Hence, the flow rate Q1d is not changed for a certain period of time.

As described above, the flow rate Q1 which is the flow rate of the nitrogen gas in the main pipe 704 of the iron tip is characterized not only in the value thereof but also in the ratio of change in the flow rate Q1 (rapid change or slow change) when the state is changed.

A determination as to whether the step of soldering is normally performed is made as follows. First, the range of the reference value of the flow rate in each of the soldered states is previously set. Then, the determination is made by comparison between the range of the reference value in each of the soldered states and the metered flow rate. For example, the determination ire (c) the solder piece input state will be described. An upper limit value Qx1 and a lower limit value Qy1 for the reference value are first set in the time zone of Ar3 where the iron tip is in (c) the solder piece input state. The upper limit value Qx1 and the lower limit value Qy1 are respectively a value indicated by Qx1=Q2c+x1 and a value indicated by Qy1=Q2c−y1 (x1 and y1 are positive numbers). When the flow rate Q1 metered in the time zone of Ar3 in the step of soldering falls outside the range from the upper limit value Qx1 to the lower limit value Qy1, the control portion Cont may determine that an abnormality occurs in the step of soldering so as to provide a warning or to stop the operation. Here, one of x1 and y1 may be zero.

By use of x2 and y2 which are values smaller than x1 and y1 described above, a second upper limit value Qx2=Q2c+x2 and a second lower limit value y2=Q2c−y2 are set, and when the flow rate Q1 metered in the time zone of Ar3 falls outside a range from the second upper limit value Qx2 to the second lower limit value Qy2, the control portion Cont can notify a caution to the operator. Here, one of x2 and y2 may be zero. Although in the above description, the determination in one stage in which the first upper and lower limit values are used so as to provide a warning or to stop the operation or the determination in two stages in which the second upper and lower limit values are further used so as to provide a caution and in which the reference value is used so as to provide a waring or to stop the operation are mentioned, these are examples, and by use of a larger number of reference values, a caution or a warning may be provided in two or more stages. In the state other than (c) the solder piece input state, the range of the reference value is likewise set, the range of the reference value and the measured flow rate are compared and thus whether the step of soldering is normally performed is determined.

Regardless of the time and the flow rate, when the solder is molten or flows out, the flow rate Q1 is increased to the maximum value. The control portion Cont can also determine that the solder is molten when the control portion Cont detects a value near the peak value (here, the flow rate Q1d) of the flow rate.

Furthermore, in addition to the change of the state of the iron tip as described above, it is also possible to determine whether any abnormality such as the adherence of a foreign substance to the iron tip or the mixing of a foreign substance therewith occurs. For example, it is assumed that the flow rate Q1 fed from the second metering portion 78 to the control portion Cont is slowly changed from the flow rate Q1a to the flow rate Q1b. As shown in FIG. 40, the flow rate Q1 is normally rapidly changed from (a) the reference state to (b) the iron tip contact state. Then, the current flow rate Q1 is slowly changed differently from the normal case, and thus it is possible to determine that the iron tip is not changed from (a) the reference state to (b) the iron tip contact state and that any abnormality such as the adherence of a foreign substance or the mixing of a foreign substance occurs. When the soldering device determines that any abnormality occurs, the control portion Cont may provide a warning indicating that an abnormality occurs and (or) stop the operation.

In order to perform the abnormality determination as described above, the control portion Cont previously stores a table as shown in FIG. 40 which indicates a time change in the flow rate when the soldering is performed once, chronologically arranges pieces of data of the flow rate from the second metering portion 78, compares behaviors and values and thereby determines the state of the iron tip. The data of the flow rate is stored every predetermined number of times, and thus it is also possible to determine a chronological change. The determination method as described above is used, and thus it is possible to more accurately determine the state of the iron tip.

The control portion Cont may acquire the pressure of the nitrogen gas flowing through the main pipe 704 which is metered with the first metering portion 77. Then, when the metered pressure differs from the predetermined pressure, and the difference therebetween falls within a certain range, the control portion Cont corrects, based on the pressure, the flow rates (here, Q1a, Q1b, Q1c, Q1d and the like) when the individual states are determined, with the result that the correction values thereof may be used to determine the individual states. Furthermore, when the difference between the metered pressure and the previously expected pressure exceeds the certain range, the control portion Cont may stop the determination of the state and provide a warning indicating that an abnormality occurs and (or) stop the operation.

(First Variation)

In the embodiment described above, the description is given with the assumption that the thickness and the length of the solder piece Wh are constant. However, a variation in the feed of the wire solder W may be produced. For example, when the area on which the soldering is performed is large, the shape and the size of the solder piece may be intentionally changed. In such a case, the control portion Cont may determine the shape, the size and the like of the input solder piece Wh based on the magnitude and the behavior of a variation when the flow rate Q1 is varied from the flow rate Q1b in (b) the iron tip contact state. When it is likely that solder pieces having different sizes and shapes are input, the control portion Cont preferably includes, as a database, a table which indicates, for each of the solder pieces Wh having different sizes and shapes, the reference value of the flow rate in each of the states and (or) a time change thereof.

(Second Variation)

In the embodiment described above, the description is given with the assumption that the iron tip 5 is in a state of such a high temperature that the solder can be molten. However, due to a failure in the heater 41 or the like, the iron tip 5 can fall outside a normal temperature range which is set for melting the solder. The degree to which the nitrogen gas passing through the iron tip 5 is expanded and the viscosity thereof differ depending on the temperature of the iron tip 5, and thus the flow path resistance is increased or decreased, with the result that the flow rate of the nitrogen gas is changed. For example, when the temperature of the iron tip 5 is lowered, the volume of the nitrogen gas is reduced, and the viscosity is lowered, with the result that the flow rate of the nitrogen gas in the solder hole 51 is increased. By utilization thereof, the control portion Cont stores the flow rate Q1a in a state where the solder hole 51 is open to the atmosphere, that is, in a state where the iron tip 5 is in (a) the reference state, and can determine the temperature of the iron tip 5 based on the stored flow rate Q1a and the metered flow rate Q1.

When the type of gas supplied is changed to a mixed gas of nitrogen and air or a mixed gas of nitrogen and oxygen, the flow path resistance is also changed, and thus the flow rate Q1 differs. By utilization thereof, the control portion Cont stores the flow rate Q1a in the state where the solder hole 51 is open to the atmosphere, that is, in the state where the iron tip 5 is in (a) the reference state, and can determine, based on the stored flow rate Q1a and the metered flow rate Q1, whether or not the supplied pas is the nitrogen gas (gas which needs to be supplied). In this way, the control portion. Cont can detect an error in the connection of the gas pipe.

The operations of the first and second variations can be performed, for example, every given period. The given period may be controlled, for example, by time or by the number of times the soldering is performed. The operations may be performed immediately after power is turned on the soldering device F and at the completion of a step. The operations may be performed randomly.

Figure 41:
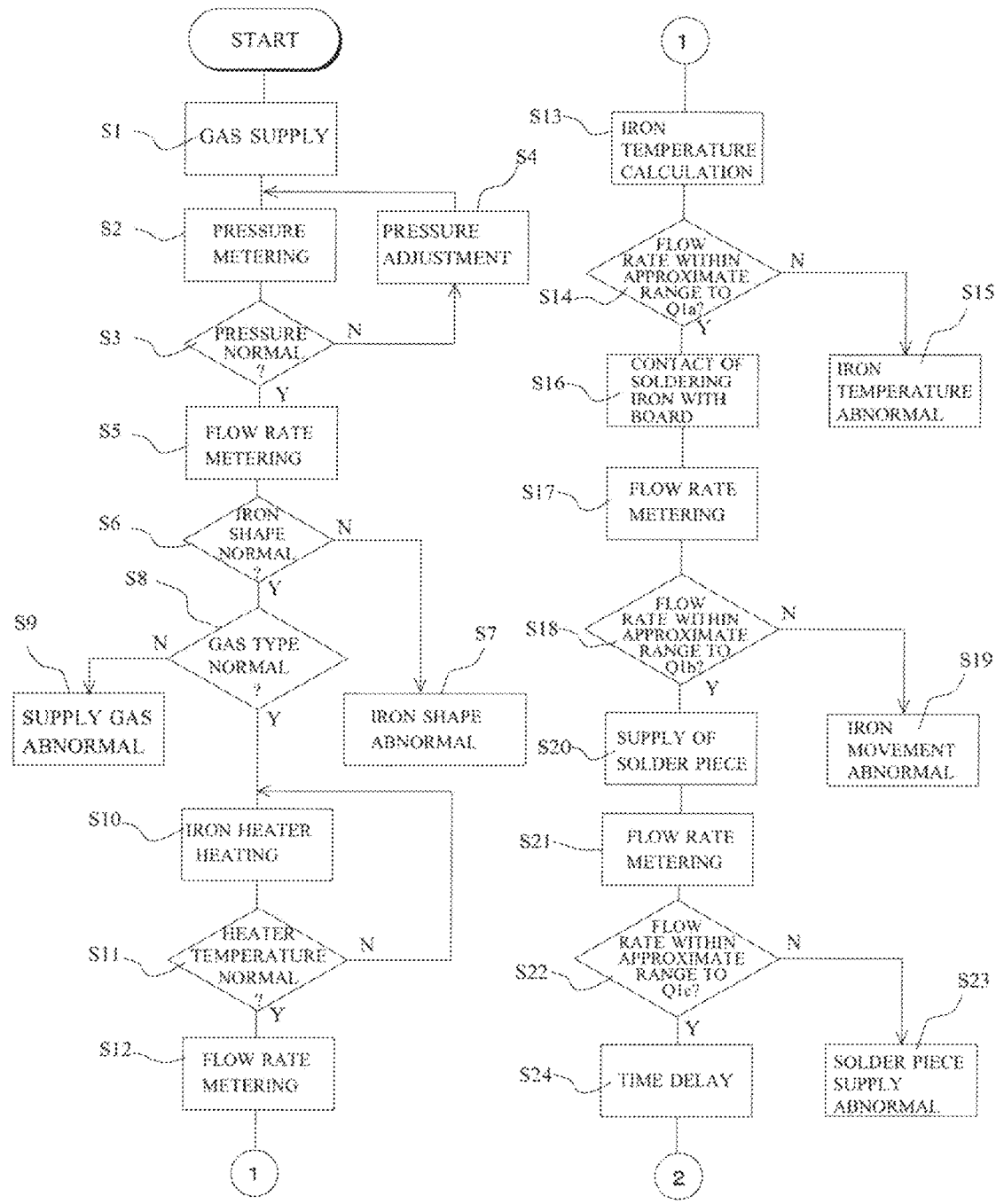
FIG. 41 A flowchart when the soldering device performs the soldering once.
Figure 42:
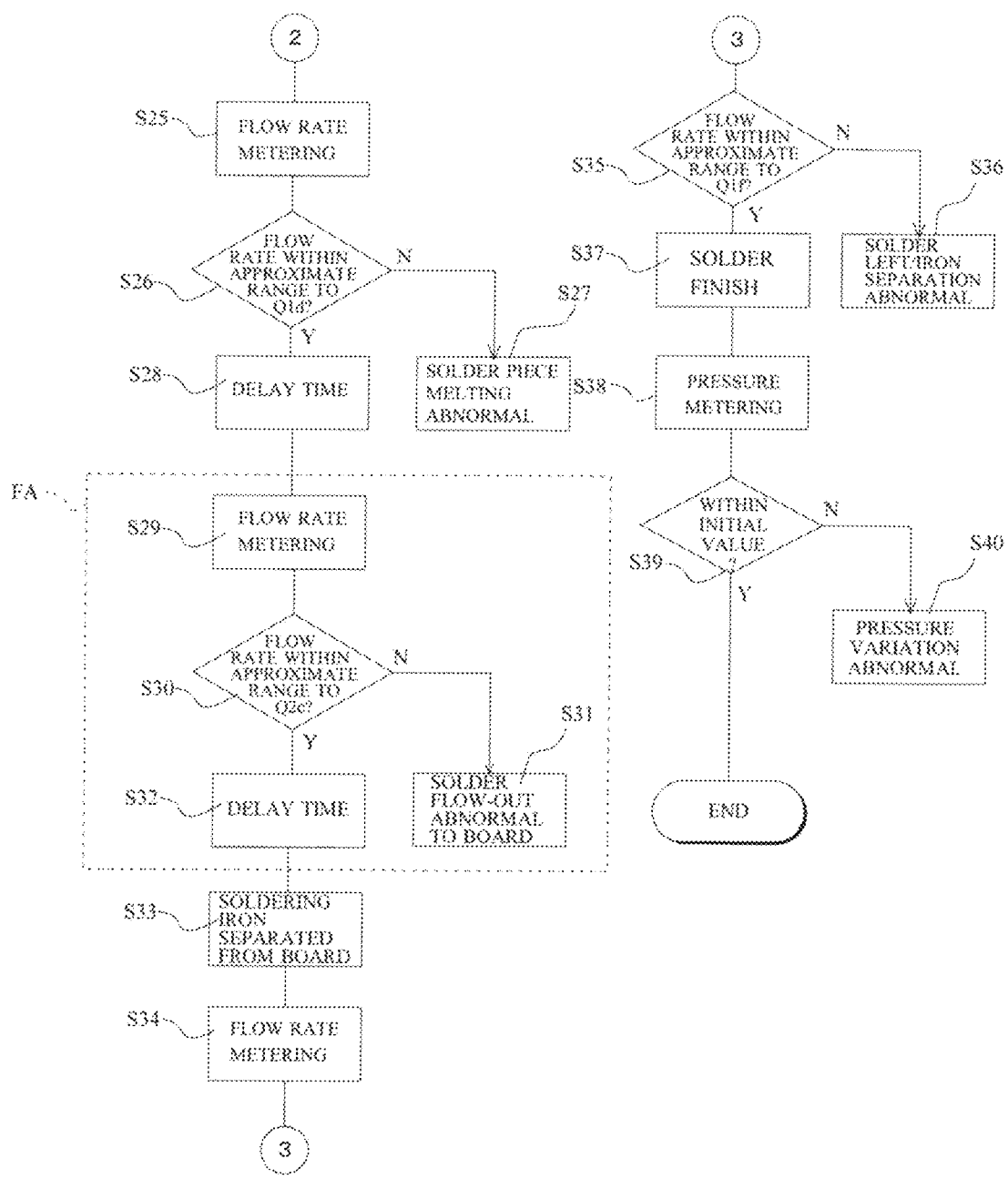
FIG. 42 A flowchart when the soldering device performs the soldering once.

A control operation will then be described. FIGS. 41 and 42 show a flowchart when the soldering device F performs the soldering once. A description will be given below with reference to drawings. In S1, the supply of the nitrogen gas from the gas supply source GS to the main pipe 704 is started, in S2, a pressure here is metered with the first metering portion 77 and is compared with a set pressure, in S3, pressure values are compared and in S4, the pressure is adjusted with the first adjustment portion 76 until the pressure has a normal value.

When the pressure reaches the normal value, in S5, the flow rate is metered with the second metering portion 78. This flow rate and a set value are compared in S6. When the flow rate value Q1 here differs from the set value by a predetermined value or more, it is determined that the shape and the size of the solder hole 51 are different. In this case, it can be considered that a component of the iron tip 5 is wrong, attachment is erroneously performed or the shape of the interior of the solder hole 51 is changed by an adherence substance, and thus it is determined that the shape of the iron is abnormal, with the result that in S7, the operation is stopped or a warning or the like is provided.

When the shape of the iron is determined to be normal, the type of gas supplied in S8 is determined. The nitrogen gas mainly used as an inert gas in the soldering can be manufactured by separation of air into nitrogen and oxygen, and the change of the supplied gas is performed according to the step of soldering. For example, when a foreign substance is removed by a high-pressure gas, high-pressure air is used, and when an adherence substance on the soldering iron is incinerated, oxygen gas is used, with the result that pipes may be erroneously connected. Since a pressure loss differs depending on the type of gas supplied, when the supply pressure is constant, the flow rate value differs depending on the gas, in S8, with this flow rate value, it is possible to determine whether the nitrogen gas is connected and in S9, whether the supply gas is abnormal is determined. Likewise, it is possible to determine whether air or oxygen gas is provided.

Then, in S10, the heating of the iron tip 5 with the heater 41 is started, the temperature of the heater is metered with a temperature detector (unillustrated), the value thereof is compared with a set value in S11 and when a predetermined temperature is reached, in S12, the flow rate is metered with the second metering portion 78. Since in the flow rate value Q1 a here, the temperature of the gas is increased, and the volume is expanded according to the temperature thereof, the temperature of the nitrogen gas can be calculated from the flow rate value Q1a, and in S13, the temperature of the iron is calculated. Then, when in S14, the calculated value of the temperature of the iron falls outside an appropriate range, it is determined that the temperature of the iron is abnormal. It can be considered that as a case where the temperature of the heater is normal but the temperature of the iron is abnormal, the hear transfer to the iron tip 5 is insufficient, and thus it is determined in S15 that the temperature of the iron is abnormal.

Then, in S16, the iron tip 5 is moved downward (Z direction) so as to make contact with the wiring board Bd and perform preheating, in this state, the flow rate is metered in S17, whether the flow rate value Q1 thereof falls within an approximate range to the set value Q1b (see FIG. 40) is determined in S18 and when the flow rate value Q1 falls outside the approximate range to the set value Q1b, it is determined that the iron tip 5 does not make contact with the wiring board Bd, with the result that it is determined in S19 that the movement of the iron is abnormal.

When the determination in S18 is normal, the solder piece Wh which is cut in S20 is supplied, the flow rate here is metered in S21, whether the flow rate value Q1 here falls within an approximate range to the set flow rate value Q1c (see. FIG. 40) is determined in S22 and when the flow rate value Q1 falls outside the approximate range to the set value Q1c, it is determined that the solder piece Wh is not supplied, with the result that it is determined in S23 that the supply of the solder piece is abnormal.

When the determination in S22 is normal, after a time delay in S24, the flow rate is metered in S25 (FIG. 42), whether the flow rate value Q1 here falls within an approximate range to the set flow rate value Q1d (see FIG. 40) is determined in S26 and when the flow rate value Q1 falls outside the approximate range to the set value Q1d, it is determined that the solder piece Wh is not molten, with the result that it is determined in S27 that the melting of the solder piece is abnormal.

When the determination in S26 is normal, a delay time in S28 is provided, the molten solder piece Wh is completely molten so as to flow out into the through hole Th, thereafter in S33, the iron tip 5 is moved upward (Z direction) so as to be separated from the wiring board Bd and the flow rate is metered in S34. Operations in S29 to S32 within the flowchart EA will be described later. Whether the flow rate value Q1 here falls within an approximate range to the set flow rate value Q1f (see FIG. 40) is determined in S35 and when the flow rate value Q1 falls outside the approximate range to the set value Q1f, it is determined that the iron tip 5 is not separated from the wiring board Bd or the solder piece Wh is left within the solder hole 51, with the result that it is determined in S36 that the separation of the iron is abnormal or the solder piece left is abnormal.

When the determination in S35 is normal, it is determined in S37 that the soldering is normal. Then, in S38, the pressure is metered with the first metering portion 77, in S39, a set pressure is compared with the initial pressure metering value Q1a, when it fails outside an approximate range to the initial value, it is determined in S40 that the variation in the pressure is abnormal, the metering values Q1a to Q1d described above are discarded and furthermore, the results of the determination are also discarded. The flow rate values in the individual steps are stored, and when the soldering is completed, all or part of the determinations in S6, S8, S11, S14, S18, S22 and the like may be collectively made. Here, when in S38, the pressure value falls outside the range to the initial value, the values of Q1a to Q1d may be corrected with the pressure value.

Sixth Embodiment

Figure 43:
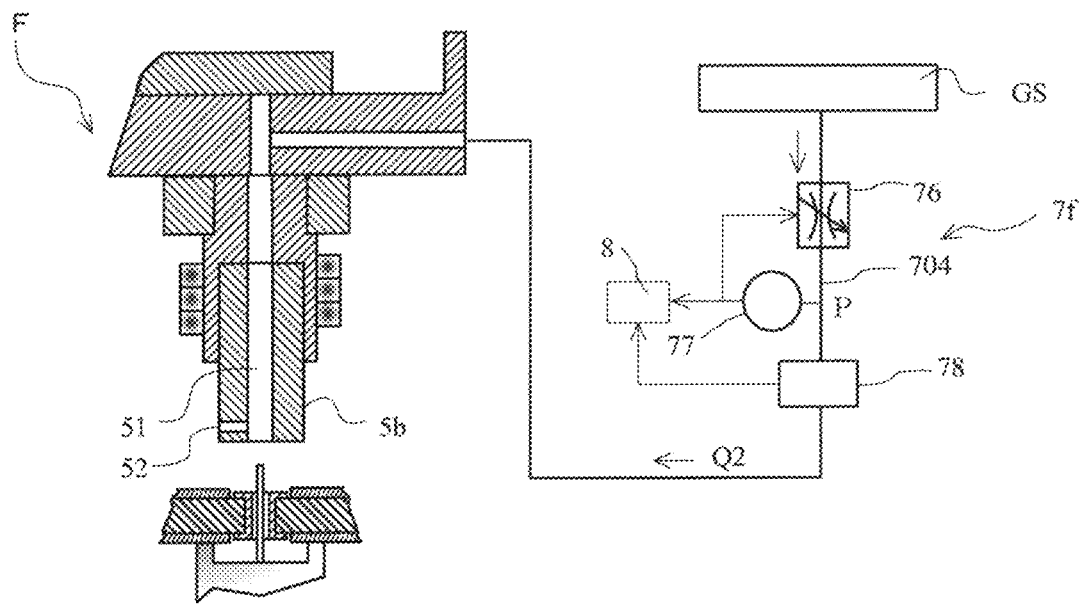
FIG. 43 A diagram showing the surrounding of an iron tip in the reference state of a sixth embodiment in a method of determining the state of the soldering iron tip according to the present invention and a gas supply portion.

Another example of the soldering device according to the present embodiment will be described with reference to drawings, FIG. 43 is a diagram showing an iron tip in another example of the soldering device according to the present invention and a gas supply portion. The soldering device F shown in FIG. 43 has the same configuration as the soldering device B of the fifth embodiment except that the iron tip 5b includes the gas release portion 52 which penetrates the solder hole 51 and the outer circumferential surface. Hence, substantially same parts are identified with the same reference signs, and the detailed description of the same parts will be omitted.

Figure 44:
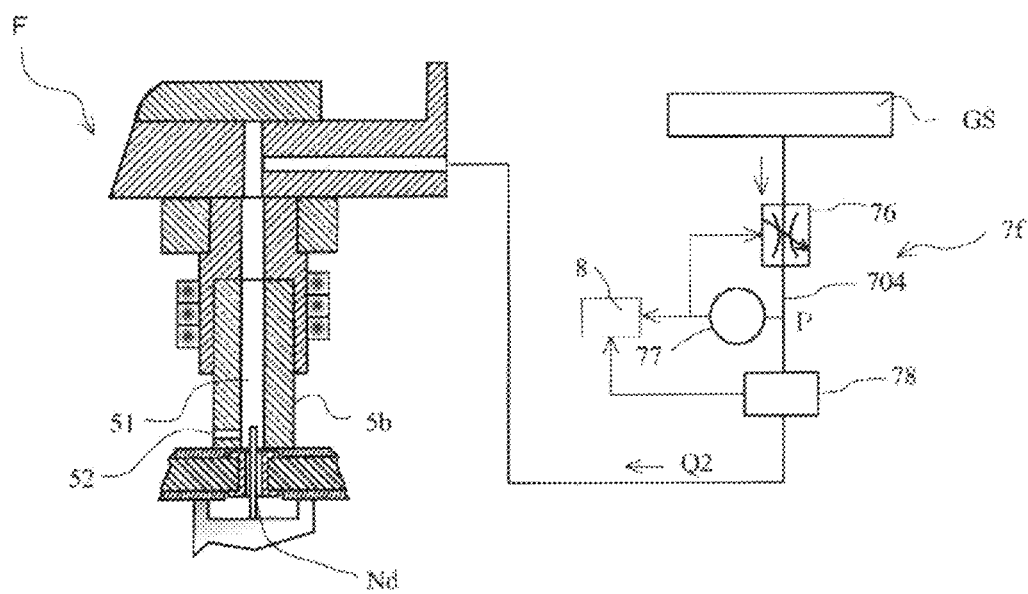
FIG. 44 A diagram showing the iron tip in the iron tip contact state and the gas supply portion.
Figure 45:
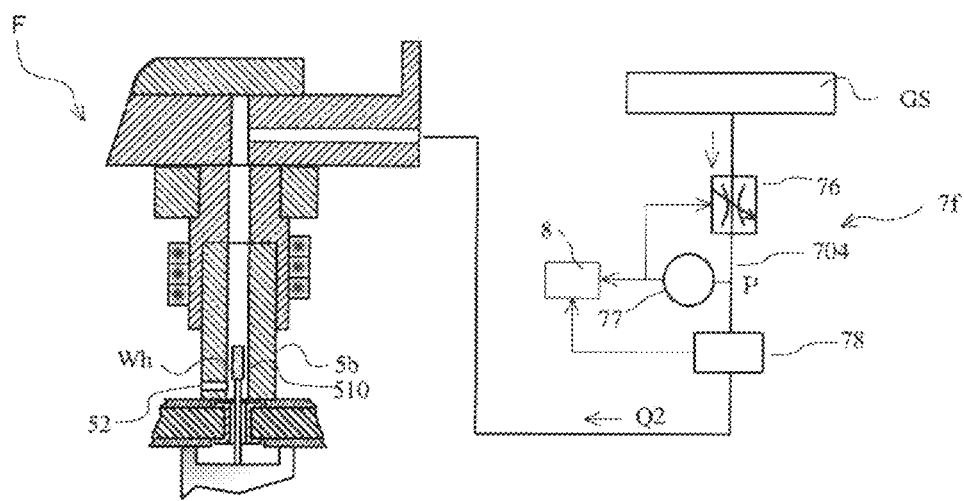
FIG. 45 A diagram showing the iron tip in the solder piece input state and the gas supply portion.

As shown in FIG. 44, when the soldering is performed, the terminal Nd of the electronic component Ep is inserted into the solder hole 51 of the iron tip 5. Then, the solder piece Wh which is cut with the cutter unit 2 (see FIG. 33) from the wire solder W is heated, in a state where the solder piece Wh is in contact with the terminal Nd as shown in FIG. 45, with the iron tip 5 so as to be molten. Here, when a part in which the solder piece Wh in the solder hole 51 is molten is assumed to be the melting region 510, the gas release portion 52 makes a part between the melting region 510 of the solder hole 51 and the lower end of the iron tip 5 in the Z direction communicate with the outer circumferential surface.

Although in the present embodiment, the gas release portion 52 is formed in the shape of a through hole which makes the outer circumferential surface of the iron tip 5 communicate with the solder hole 51, there is no limitation to this shape. For example, the gas release portion 52 may be formed, between the melting region 510 of the solder hole 51 and the lower end of the iron tip 5 in the Z direction, in the shape of a notch which makes the solder hole 51 communicate with the outer circumferential surface of the iron tip 5. In addition to the through hole and the slit described above, as the gas release portion 52, shapes capable of making the nitrogen gas in the solder hole 51 flow to the outside of the iron tip 5 in (b) the iron tip contact state and (c) the solder piece flow-out state can be widely adopted.

A determination of the state of the iron tip by the control portion Cont when the soldering device F as described above is used will be described with reference to drawings.

Figure 46:
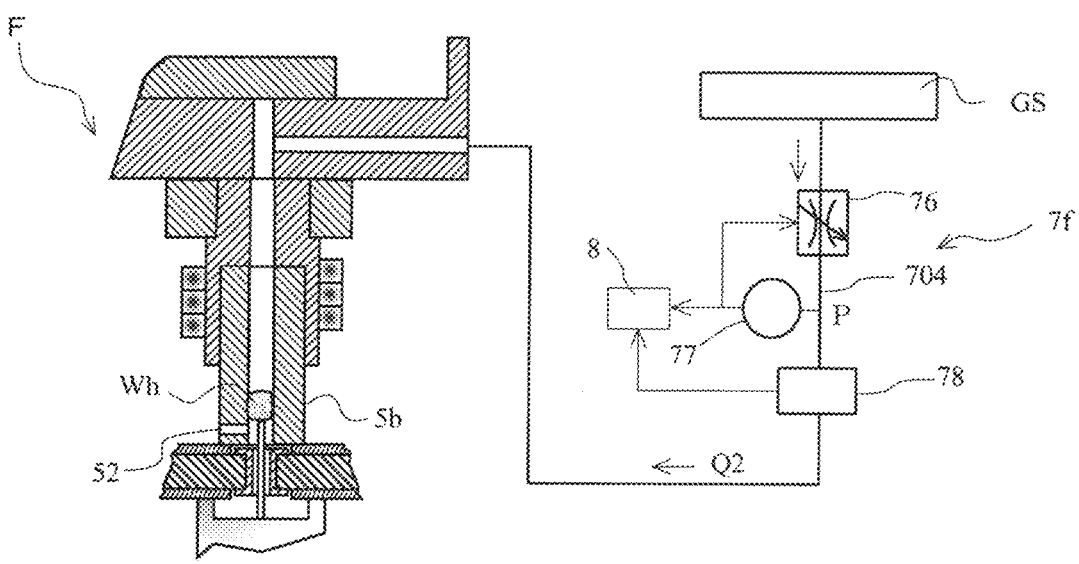
FIG. 46 A diagram showing the iron tip in the solder piece molten state and the gas supply portion.
Figure 47:
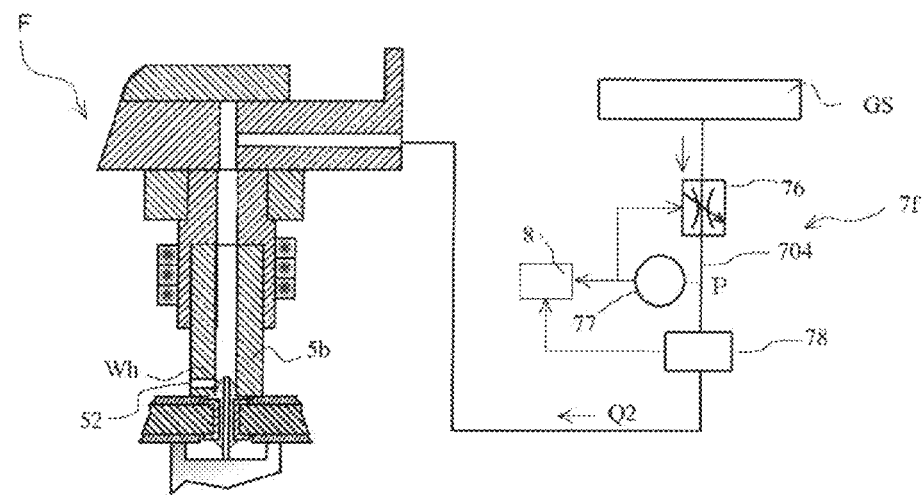
FIG. 47 A diagram showing the iron tip in the solder piece flow-out state and the gas supply portion.

The states which can be taken in the soldering device F when the soldering is performed once are, as in the fifth embodiment, (a) the reference state shown in FIG. 43, (b) the iron tip contact state shown in FIG. 44, (c) the solder piece input state shown in FIG. 45, (d) the solder piece molten state shown in FIG. 46, (e) the solder piece flow-out state shown in FIG. 47 and (f) the iron tip separated state shown in FIG. 43. Then, (a) the reference state and (f) the iron tip separated state are substantially the same as in the soldering device E of the fifth embodiment. In each of (b) the iron tip contact state, (c) the solder piece input state and (e) the solder piece flow-out state, the flow rate of the nitrogen gas flowing through the main pipe 704 is lower than that in the fifth embodiment. Hence, a description will be given with the assumption that the flow rate of the main pipe 704 is the flow rate Q2. For example, in (b) the iron tip contact state, the flow rate of the nitrogen gas flowing through the main pipe 704 is assumed to be a flow rate Q2b. In the individual states, likewise, the flow rates in (c) the solder piece input state and (e) the solder piece flow-out state are assumed to be flow rates Q2c and Q2e, respectively.

The sixth embodiment mainly differs from the fifth embodiment in that the flow rates Q1d and Q2e in (d) the solder piece molten state and (e) the solder piece flow-out state are changed. In (d) the solder piece molten state (FIG. 46), as in the fifth embodiment, the solder hole 51 is blocked by the molten solder piece Wh, and thus the flow rate Q1d is equal to that in the fifth embodiment. In the subsequent step of (e) the solder piece flow-out state (FIG. 47), while the through hole Th is blocked, the nitrogen gas flows out from the gas release portion 52, with the result that the flow rate Q2e in the main pipe 704 is reduced. In the fifth embodiment, the change of the flow rate when (d) the solder piece molten state is changed to (e) the solder piece flow-out state is small (or is almost zero) whereas in the sixth embodiment, the change of the flow rate when the states are changed as described above is increased, with the result that it is possible to easily determine the change of the state.

In (b) the iron tip contact state, the nitrogen gas flows from the through hole Th and the gas release portion 52, and thus as compared with the fifth embodiment, the flow rate Q2b in the main pipe 704 is decreased. Then, in (d) the solder piece molten state, the solder hole 51 is blocked, and thus the flow rate Q1d is equal to that in the fifth embodiment. Hence, a difference between the flow rate Q2b in (b) the iron tip contact state and the flow rate Q1d in (d) the solder piece molten state is larger than a difference between the flow rate Q1b in (b) the iron tip contact state and the flow rate Q1d in (d) the solder piece molten state in the fifth embodiment. In this way, it is possible to easily distinguish between (c) the solder piece input state and (d) the solder piece molten state.

The size of the gas release portion 52 is changed, and thus it is possible to change the flow rate values of the flow rates Q2b and Q2e in (b) the iron tip contact state and (e) the solder piece flow-out state. The gas release portion 52 is provided, and thus the molten solder flows into the through hole Th, and thereafter the pressure within the solder hole 51 is lowered, with the result that it is possible to prevent the molten solder within the through hole Th from being pushed out.

Figure 48:
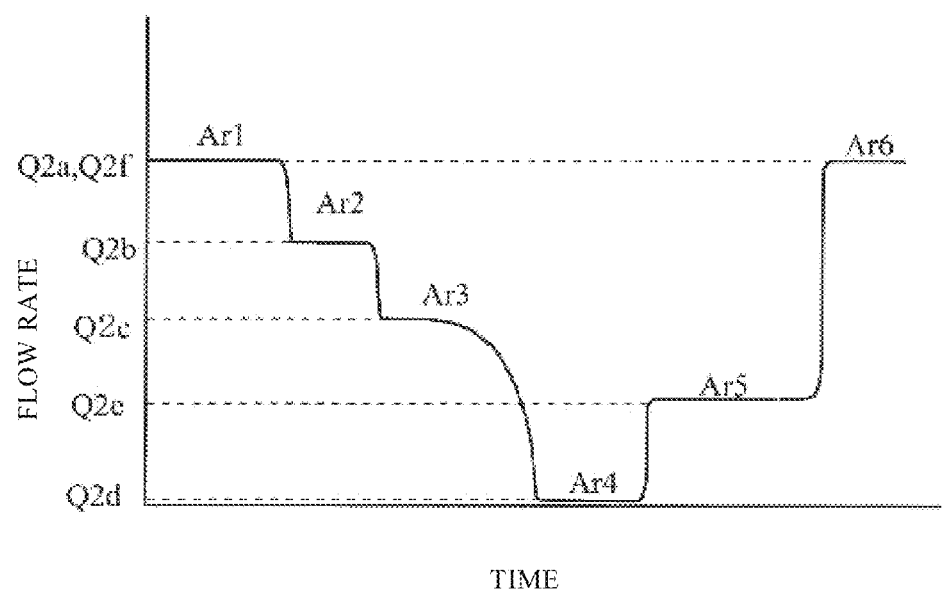
FIG. 48 A diagram showing changes in the flow rate of the gas supply portion when the soldering device performs the soldering once.

The flow rates Q2 in the individual states are as shown in a graph shown in FIG. 48. FIG. 48 shows changes in the flow rate when the soldering device performs the soldering once, the vertical axis represents the flow rate Q2 and the horizontal axis represents time. In the following discussion, only parts which show behaviors different from those in FIG. 40 will be described.

The iron tip 5b which includes the gas release portion 52 is used, and thus after the fourth region Ar4 (flow rate Q2d) indicating (d) the solder piece molten state, a fifth region Ar5 indicating (e) the solder piece flow-out state of the flow rate Q2e appears.

As described above, the gas release portion 52 is provided in the iron tip 5b, and thus the flow rate Q1d which is the flow rate of the nitrogen gas in the main pipe 704 in (d) the solder piece molten state and the flow rate Q2e ire (e) the solder piece flow-out state can be made different values. In this way, the control portion Cont can more accurately detect (e) the solder piece flow-out state, that is, the completion of the soldering of the terminal Nd of the electronic component Ep and the land Ld.

The flow of (e) the solder piece flow-out state is shown within a block FA in the flowchart of FIG. 42. In S29, the flow rate is metered, in FIG. 30, the flow rate value thereof is compared with Q2e, when it falls outside an approximate range to Q2e, it is determined in S31 that an abnormality occurs in the flowing out of the solder to the board and when it is falls within the range, in S32, a time delay is provided and after the solidification of the solder, in S33 the iron tip 5 is separated from the board Bd.

In the present embodiment, the control portion Cont also stores the flow rates in the individual states as a database, compares them with the data of the flow rate acquired from the second measurement portion 78 and thereby may determine the state of the iron tip. The control portion Cont stores a table as shown in FIG. 48 showing a time change in the flow rate, chronologically arranges pieces of data of the flow rate from the second measurement portion 78, compares behaviors and values and thereby may determine the state of the iron tip.

In the present embodiment, the control portion. Cont can also perform the same operation as in the "first variation" or the "second variation" of the fifth embodiment.

Seventh Embodiment

Figure 49:
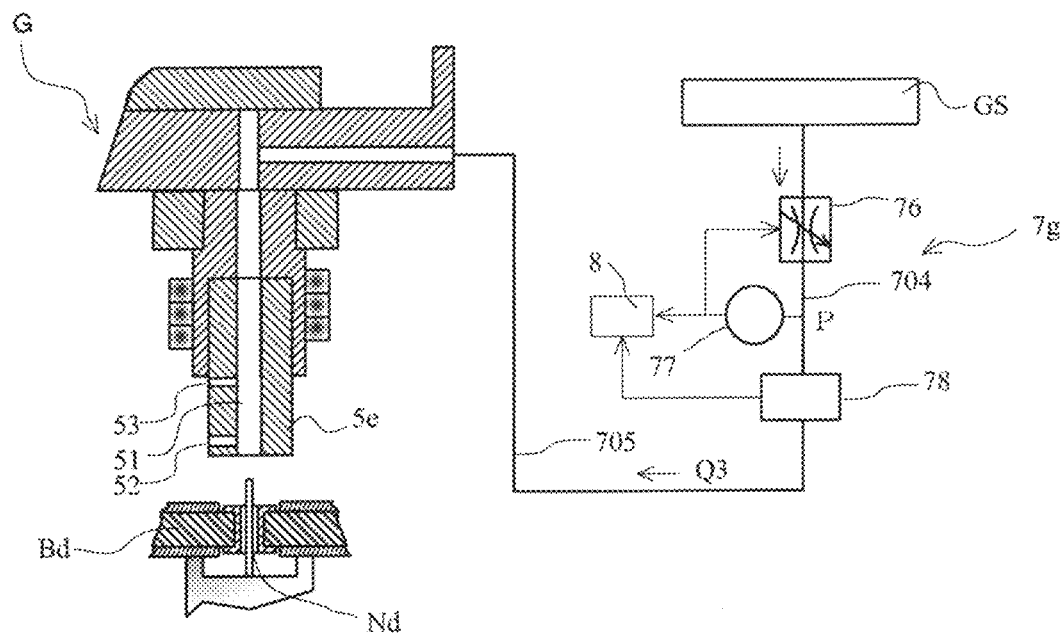
FIG. 49 A diagram showing the surrounding of an iron tip in the reference state of a seventh embodiment in a method of determining the state of the soldering iron tip according to the present invention and a gas supply portion.

Yet another example of the soldering device according to the present invention will be described with reference to drawings. FIG. 49 is a diagram showing yet another example of the soldering device according to the present invention. The soldering device G shown in FIG. 49 has a substantially same configuration as the soldering device E except that an iron tip 5e is different. Hence, in the soldering device G, substantially same parts as in the soldering device F are identified with the same reference signs, and the detailed description of the same parts will be omitted.

Figure 50:
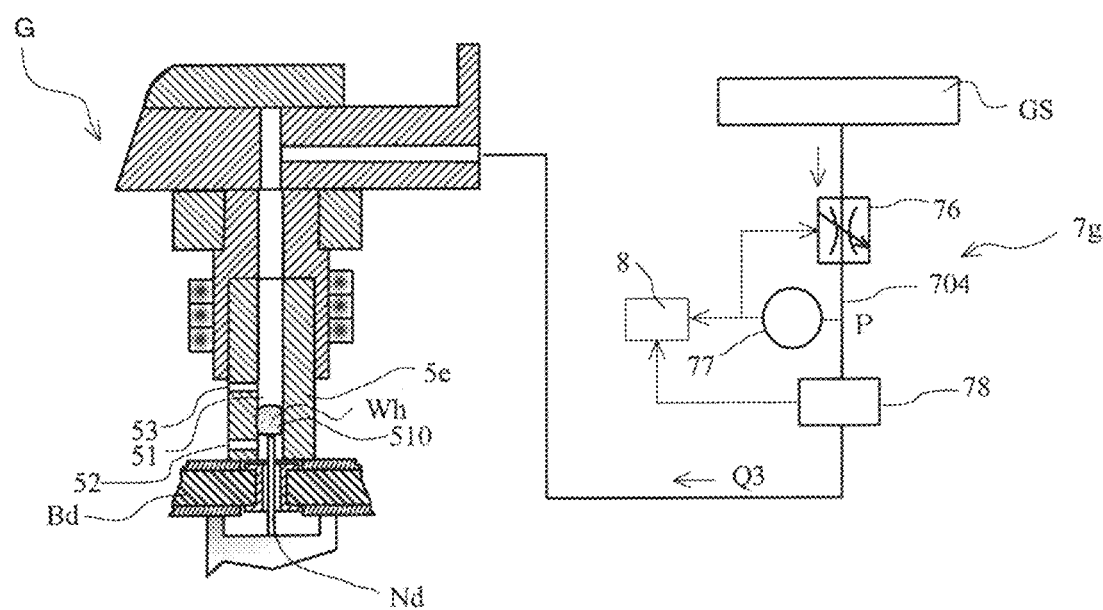
FIG. 50 A diagram showing the surrounding of the iron tip in the solder piece molten state and the gas supply portion.

As shown in FIG. 50, the iron tip 5e of the soldering device G includes the release hole 53 which makes a part above the melting region 510 where the solder piece Wh input into the solder hole 51 is molten, that is, an upstream side in the direction of flow of the nitrogen gas communicate with the outer circumferential surface. The release hole 53 is a hole through which the flux vaporized when the solder piece is molten is released together with the nitrogen gas in the solder hole 51. The inside diameter of the release hole 53 is smaller than that of the solder hole 51. In other words, the release hole 53 has flow path resistance higher than the solder hole 51.

The determination of the state of the iron tip by the control portion Cont will be described below with reference to drawings. In the present embodiment, the states which can be taken when the soldering device G performs the soldering once are the same as in the fifth embodiment. Specifically, the states are (a) the reference state, (b) the iron tip contact state, (c) the solder piece input state, (d) the solder piece molten state, (e) the solder piece flow-out state and (f) the iron tip separated state.

Figure 51:
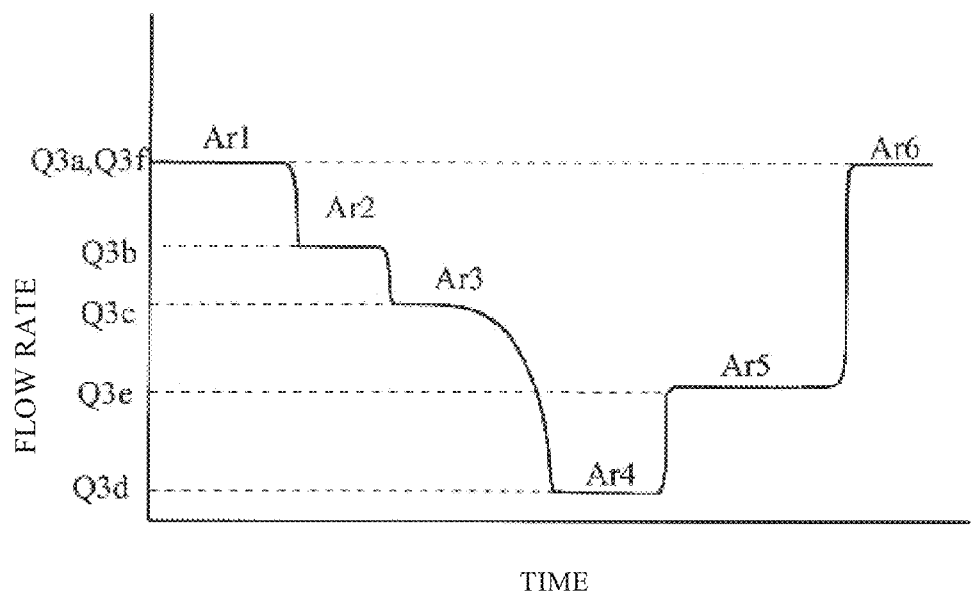
FIG. 51 A diagram showing changes in the flow rate of the gas supply portion when the soldering device performs the soldering once.

In a flow rate Q3 of the nitrogen gas in the main pipe 704 in each of the states of the iron tip, parts different from the sixth embodiment will be described below with reference to drawings. FIGS. 49 and 50 are diagrams showing the iron tip in (a) the reference state and (d) the solder piece molten state described above. FIG. 51 is a diagram showing changes in the flow rate when the soldering device performs the soldering operation once. In the present embodiment, a description will be given with the assumption that the board Bd is a through-hole board and that the terminal Nd inserted into the through hole Th is soldered.

In the soldering device G, when the soldering is performed once, the individual states of (a) to (f) are sequentially changed. FIG. 49 is a diagram showing the iron tip in the reference state. As shown in FIG. 49, in (a) the reference state, art opening in the lower end of the solder hole 51 in the Z direction is open to the atmosphere. FIG. 50 is a diagram showing the iron tip in (d) the solder piece molten state, the solder piece Wh is heated with the iron tip 5e and thus the lower end portion of the solder hole 51 in the Z direction is blocked by the molten solder piece Wh. In (d) the solder piece molten state, the flow path resistance of the solder hole 51 is increased, and the flow rate Q3 is reduced. However, the release hole 53 is open, and thus the flow rate Q3 is prevented from being zero so as to have a flow rate value Q3d. Although the first adjustment portion 76 performs control such that the pressure P is kept constant, as compared with a state where the flow rate value is substantially zero, in a state where a small amount of flow rate Q3 flows as in the present embodiment, the pressure control by the first adjustment portion 76 can easily be performed.

In the soldering device G, the state of the iron tip is sequentially changed from (a) the reference state, to (b) the iron tip contact state, to (c) the solder piece input state, to (d) the solder piece molten state, to (e) the solder piece flow-out state and then to (f) the iron tip separated state. Then, the flow rates Q3 of the main pipe 704 in the individual states are as indicated in a graph shown in FIG. 51. FIG. 51 shows changes in the flow rate of the main pipe 704 when the soldering device G performs the soldering once, the vertical axis represents the flow rate Q3 and the horizontal axis represents time.

As shown in FIG. 51, in a first region Ar1, the iron tip is in (a) the reference state, and in the first region Ar1, the flow rate of the main pipe is Q3a.

In a fourth region Ar4, the iron tip indicates (d) the solder piece molten state, the solder hole 51 is blocked by the melting of the solder piece Wh and thus the flow path resistance thereof is increased but as described above, the release hole 53 is open, with the result that the flow rate is a flow rate Q3d.

In the present embodiment, when the solder hole 51 is blocked, the nitrogen gas left in the solder hole 51 is discharged through the release hole 53. However, there is no limitation to this configuration. For example, in the branch pipe 706 of the second metering portion 78, a release hole for releasing the internal gas to the outside may be provided or the branch pipe 706 may be branched and the branched pipe may be used as a pipe for releasing the nitrogen gas.

Eighth Embodiment

Figure 52:
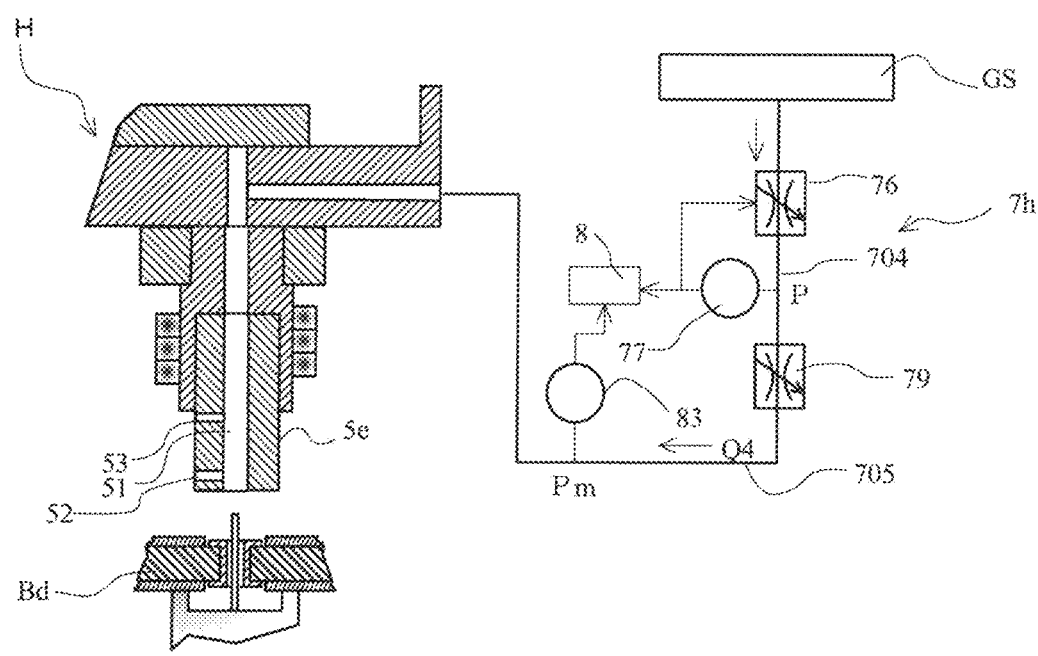
FIG. 52 A diagram showing the surrounding of an iron tip in the reference state of an eighth embodiment in a method of determining the state of the soldering iron tip according to the present invention and a gas supply portion.
Figure 53:
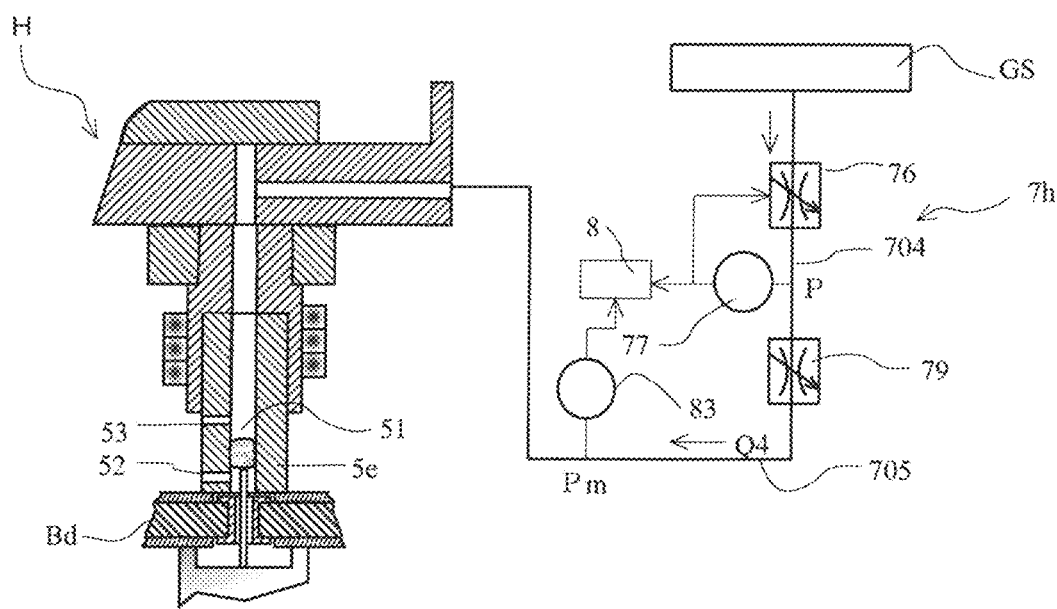
FIG. 53 A diagram showing the surrounding of the iron tip in the solder piece molten state and the gas supply portion.

Another example of the soldering device according to the present embodiment will be described with reference to drawings. FIGS. 52 and 53 are diagrams showing another example of the soldering device according to the present invention. The eighth embodiment differs from the seventh embodiment in that in the downstream pipe of the first metering portion 77 for metering the pressure of the main pipe 704, a flow path resistance member 79 formed with a throttle capable of adjusting the fluid resistance is provided and that on the downstream side of the flow path resistance member 79, a third metering portion 83 for metering the pressure is provided. FIGS. 52 and 53 are diagrams showing the iron tip in (a) the reference state and (d) the solder piece molten state, respectively.

A pressure Pm metered with the third metering portion 83 in (a) the reference state of FIG. 52 is a value obtained by pressure division of the fluid resistance of the flow path resistance member 79 and the fluid resistance of the soldering device H formed with the solder hole 51 and the like. Since the pressure of the first metering portion 77 is controlled by the first adjustment portion 76 so as to be a constant value P, in (a) the reference state, the fluid resistance of the soldering device H is relatively small, and thus the pressure Pm is a small value close to the atmosphere.

In (d) the solder piece molten state of FIG. 53, a large proportion of the solder hole 51 is blocked, and thus the fluid resistance of the soldering device H is increased, with the result that the pressure Pm is a value close to the pressure P which is controlled.

Figure 54:
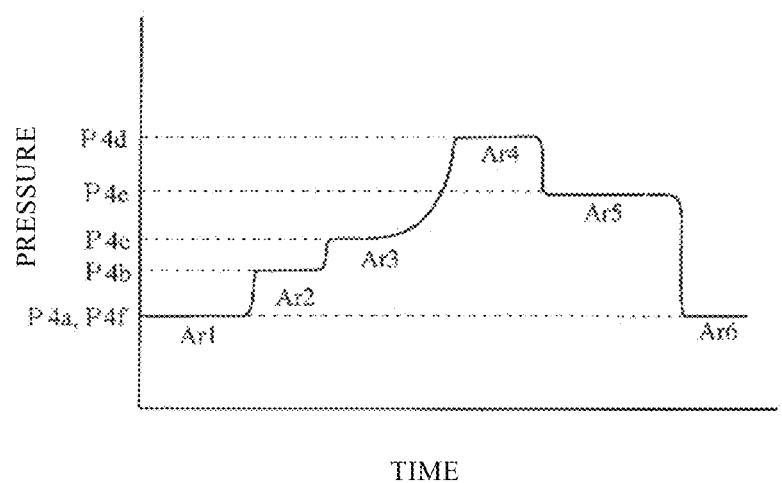
FIG. 54 A diagram showing changes in the pressure of the gas supply portion when the soldering device performs the soldering once.

In the soldering device H, the state of the iron tip is sequentially changed from (a) the reference state, to (b) the iron tip contact state, to (c) the solder piece input state, to (d) the solder piece molten state, to (e) the solder piece flow-out state and then to (f) the iron tip separated state. FIG. 54 shows changes in the pressure Pm when the soldering device H performs the soldering once, the vertical axis represents the pressure Pm and the horizontal axis represents time.

In a first region Ar1, the iron tip is in (a) the reference state, and as described above, the pressure Pm is lowered so as to be a pressure P4a. As the state is changed to (b) the iron tip contact state of a second region Ar2 and then to (c) the solder piece input state of a third region Ar3, the fluid resistance of the solder hole 51 is increased, and thus the pressure Pm is increased from P4b to P4c, with the result that in (d) the solder piece molten state of a fourth region Ar4, the maximum pressure value P4d is reached. Thereafter, in (e) the solder piece flow-out state of a fifth region Ar5, the fluid resistance of the solder hole 51 is reduced, the pressure Pm is lowered to P4e and in (f) the iron tip separated state of a sixth region Ar6, the pressure Pm is P4f so as to return to the pressure P4a in (a) the reference state of the first region Ar1.

The first metering portion 77 and the third metering portion 83 are pressure metering devices, and the pipe parts which axe metered may be switched such that metering is performed with one pressure metering device.

A pressure metering device is generally more inexpensive than a flow rate metering device, and has a wide metering range and a high response speed so as to provide practical effects.

(First Variation)

Figure 55:
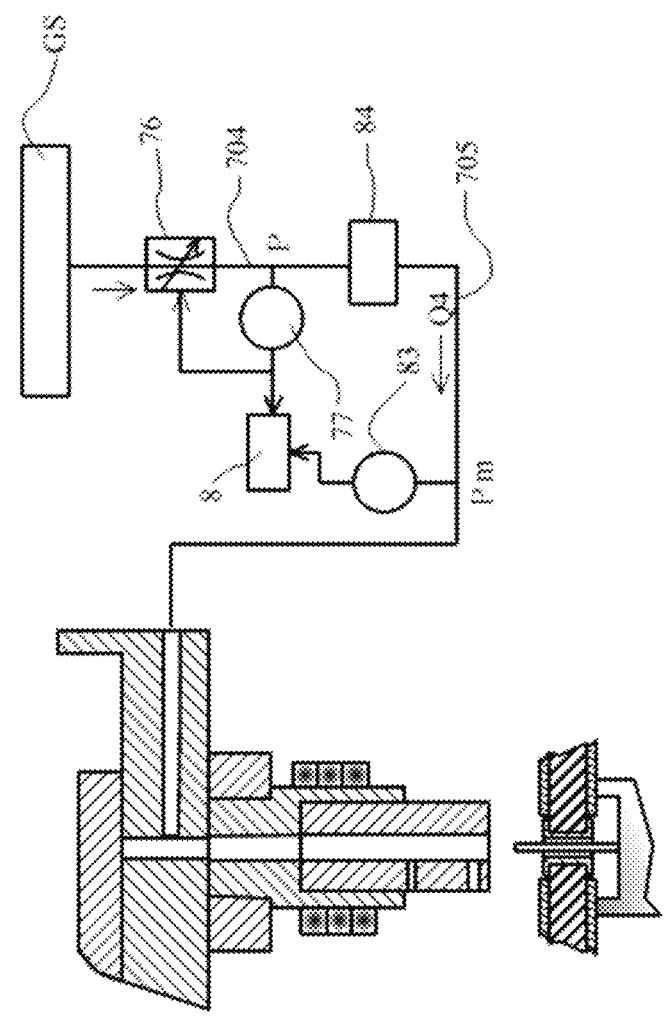
FIG. 55 A diagram showing the surrounding of the iron tip in the reference state of a first variation of the eighth embodiment and the gas supply portion.

Although in the eighth embodiment described above, as the fluid throttle, the flow path resistance member 79 is used, instead of it, a fourth metering portion 84 for metering the flow rate can be provided. FIG. 55 is a diagram showing, in this case, the iron tip and the flow of the nitrogen gas in (a) the reference state. Since the flowmeter of the fourth metering portion 84 has predetermined flow path resistance in order to meter the flow rate, the flow path resistance is used as a flow path resistance member. The fourth metering portion 84 can use the flowmeter of the second metering portion 78 which is used in the fifth embodiment (FIG. 34).

Other Embodiments

As the iron tip 5, the iron tip 5a shown in FIG. 11 can be used. In the solder hole 51a of the iron tip 5a shown in FIG. 11, a locking portion 511 is provided, and the solder piece Wh makes contact with the locking portion 511 so as to block a large proportion of the solder hole 51a. Hence, the flow path resistance of this part is increased, and a difference before and after the supply of the solder piece Wh is increased, with the result that it is easy to make a determination when the solder piece Wh is supplied. Moreover, the solder piece Wh reliably makes contact with the locking portion 511, and thus it is possible to rapidly melt the solder piece Wh by heat conduction from the iron tip 5a. The present embodiment can also be applied to the fifth to eight embodiments.

Figure 56:
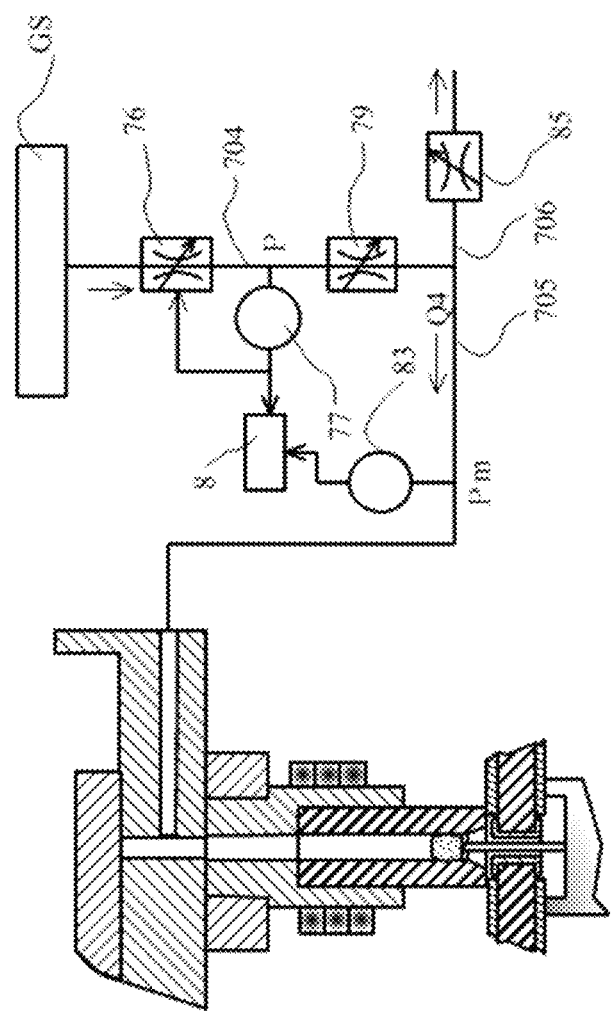
FIG. 56 A diagram showing the surrounding of an iron tip in the solder piece molten state indicating another embodiment of the method of determining the state of the soldering iron tip according to the present invention.

As shown in FIG. 56, in the connection portion of the main pipe 704 and the inflow pipe 705, the branch pipe 706 can be branched. With this branch pipe 706, part of the nitrogen gas flowing through the main pipe 704 is discharged to the outside, and thus even when all the solder hole 51 is closed, the minimum flow rate of the main pipe 704 is acquired, with the result that the control performance of the first metering portion 77 can be enhanced. In the branch pipe 706, a variable throttle member 85 is provided, and thus it is possible to adjust, for the change of the state of the iron tip, the rate of change (sensitivity adjustment) in the flow rate and the pressure in the fifth to eight embodiments.

The metering values of the relationship (FIG. 40 or FIG. 48) between the time and the flow rate values and the relationship (FIG. 51 or FIG. 54) between the time and the pressures are stored, a database for quality control is produced and thus a correlation between a chronological change, ambient temperatures and the like can be calculated by statistical processing.

Furthermore, when a plurality of soldering parts are present, since the change values of the fluid in the individual states may differ depending on the soldering parts, the database described above is produced for each of the soldering parts, with the result that it is also possible to make the determination by using a different threshold value for each of the soldering parts.

Although in the present embodiment, as the states which can be taken when the soldering device E, performs the soldering, the six states that are (a) the reference state, (b) the iron tip contact state, (c) the solder piece input state, (d) the solder piece molten state, (e) the solder piece flow-out state and (f) the iron tip separated state are mentioned, a state other than these states may be determined.

Although in the present invention, in a state where the total flow rate of the gas in the gas supply portion or the supply pressure is made constant, the state of the iron tip is determined by the change of the flow path resistance of the iron tip, it is likely that the flow path resistance of the iron tip is greatly changed during the soldering operation and that thus the total flow rate of the gas in the gas supply portion or the supply pressure is varied. In this case, the flow rate or the pressure of the gas is detected and is fed back to the first adjustment portion 71 or the first adjustment portion 76, and thus the control is performed, with the result that the total flow rate of the gas in the gas supply portion or the supply pressure can be made constant.

In the reference state of the iron tip, the total flow rate of the gas in the gas supply portion or the supply pressure is kept constant, and even when the flow path resistance is changed, and thus the total flow rate of the gas in the gas supply portion or the supply pressure is varied during a period from the iron tip contact state to the iron tip separated state in the soldering operation, it is possible to determine the state of the iron tip by metering the gas supply portion without operating the first adjustment portion 71 or the first adjustment portion 76.

Although the embodiments of the present invention are described above, the present invention is not limited to the details thereof. Various variations can be added to the embodiments of the present invention without departing from the spirit of the invention.

INDUSTRIAL APPLICABILITY

The method of determining the state of an iron tip according to the present invention is useful because it is possible to immediately determine the state of the iron tip in a soldering step, and it is also possible to constantly accurately determine the state of the interior of a solder hole which cannot be observed from the outside.

REFERENCE SIGNS LIST

A soldering device
1 support member
11 wall member
12 holding portion
13 sliding guide
14 heater unit fixing portion
15 actuator holding portion
16 spring holding portion
2 cutter unit
21 cutter upper blade
211 upper blade hole
212 pin hole
22 cutter lower blade
221 lower blade hole
222 gas inflow hole
23 pusher pin
231 rod portion
232 head portion
233 spring
3 drive mechanism
31 air cylinder
32 piston rod
33 cam member
330 concave portion
331 support hole
332 pin
333 pin pushing portion
334 bearing
34 slider portion
340 cam groove
341 first groove portion
342 second groove portion
343 connection groove portion
35 guide shaft
4 heater unit
41 heater
42 heater block
421 concave portion
422 solder supply hole
5 iron tip
6 solder hole
52 gas release portion
53 release hole
6 solder feed mechanism
61 feed roller
62 guide tube
7 gas supply portion
70 pipe
71 first adjustment portion
72 first metering portion
73 second adjustment portion
74 first measurement portion
75 second measurement portion
76 first adjustment portion
77 first metering portion
78 second metering portion
79 flow path resistance member
701 main pipe
702 branch pipe
703 supply pipe
704 main pipe
705 inflow pipe
706 branch pipe
83 third metering portion
84 fourth metering portion
85 variable throttle member
W solder
Bd wiring board
Ep electronic component
Ld land
Th through hole
Nd terminal

The invention claimed is:

1. A method of determining a state of an iron tip in a soldering device comprising:
   providing the soldering device comprising:
      the iron tip which includes a solder hole, a melting region, and a gas release portion,
         wherein the gas release portion makes the solder hole communicate with an outside and is provided downstream from the melting region,
      a gas supply source that supplies a gas, and
      a gas supply portion that makes the gas supply source communicate with the solder hole and that supplies the gas from the gas supply source into the solder hole, supplying the gas to the solder hole and gas supply portion,
         wherein a total flow rate of the gas flowing through the gas supply portion is constant;
   supplying a solder piece into the solder hole;
   heating and melting the solder piece in melting region;
   measuring a physical quantity of the gas flowing within the gas supply portion; and
   comparing the measured physical quantity with a previously provided reference value or table to determine the state of the iron tip.

2. The method of determining the state of the iron tip according to claim 1,
   wherein the table includes at least one of a reference physical quantity or a table indicating a chronological change in the reference physical quantity.

3. The method of determining the state of the iron tip according to claim 1,
   wherein, when the measured physical quantity is at a predetermined value, it is determined that at least one of contact with an object on which soldering is performed with the iron tip, input of the solder piece into the solder hole, or the melting of the solder piece in the solder hole is performed.

4. The method of determining the state of the iron tip according to claim 1,
   wherein each time a soldering is performed a predetermined number of times, the physical quantity of the gas flowing is stored, and the state of the iron tip is determined by comparing a current physical quantity with the stored physical quantity.

5. The method of determining the state of the iron tip according to claim 1, wherein at least one of a temperature of the iron tip or a type of the gas passing through the solder hole is determined by measuring the physical quantity in a state where the solder hole is open to the outside.

6. The method of determining the state of the iron tip according to claim 1,
wherein at least one of a shape or a size of the solder piece is determined by measuring the physical quantity after the solder piece is input into the solder hole.

7. The method of determining the state of the iron tip according to claim 1,
wherein the gas supply portion includes a branch pipe which releases the gas to the outside, and
as the physical quantity, a flow rate or a pressure of the gas flowing through the branch pipe or a supply pipe to the solder hole is metered.

8. The method of determining the state of the iron tip according to claim 1,
as the physical quantity, a pressure of the gas flowing through the gas supply portion is measured and
based on a change in the pressure of the gas flowing through the gas supply portion, the state of the iron tip is determined.

9. The method of determining the state of the iron tip according to claim 8,
wherein, based on an increase in the pressure of the gas flowing through the gas supply portion, it is determined that at least one of contact with an object on which soldering is performed with the iron tip, the supplying of the solder piece into the solder hole, and the melting of the solder piece in the melting region is performed.

10. The method of determining the state of the iron tip according to claim 1,
wherein the determination of the state of the iron tip includes a determination of a state of dirt of the solder hole.

11. The method of determining the state of the iron tip according to claim 1,
wherein a supply pressure of the gas flowing through the gas supply portion is constant.

12. A method of determining a state of an iron tip in a soldering device, the soldering device comprising:
providing the soldering device comprising:
the iron tip which includes a solder hole, an enlarged-diameter region, and a gas release portion,
wherein the enlarged-diameter region is provided at a lower end of the solder hole, and
the gas release portion makes the solder hole communicate with an outside and is provided in the enlarged-diameter region,
a gas supply source that supplies a gas, and
a gas supply portion that makes the gas supply source communicate with the solder hole and that supplies the gas from the gas supply source into the solder hole, supplying the gas to the solder hole and gas supply portion,
wherein a total flow rate of the gas flowing through the gas supply portion is constant;
supplying a solder piece into the solder hole;
heating and melting the solder piece in soldering hole;
measuring a physical quantity of the gas flowing within the gas supply portion; and
comparing the measured physical quantity with a previously provided reference value or table to determine the state of the iron tip.

* * * * *